United States Patent
Seno

(10) Patent No.: US 7,360,180 B2
(45) Date of Patent: Apr. 15, 2008

(54) COMPUTER PROGRAM PRODUCT, METHOD, AND SYSTEM FOR HARDWARE MODEL CONVERSION

(75) Inventor: Shuntaro Seno, Odawara (JP)

(73) Assignee: Hitachi, Ltd., Tokyo (JP)

( * ) Notice: Subject to any disclaimer, the term of this patent is extended or adjusted under 35 U.S.C. 154(b) by 206 days.

(21) Appl. No.: 11/315,483

(22) Filed: Dec. 23, 2005

(65) Prior Publication Data
US 2007/0067751 A1 Mar. 22, 2007

(30) Foreign Application Priority Data
Sep. 22, 2005 (JP) ............................. 2005-276646

(51) Int. Cl.
G06F 17/50 (2006.01)
G06F 7/00 (2006.01)
G06F 17/30 (2006.01)

(52) U.S. Cl. ..................... 716/2; 716/3; 716/18; 716/4; 703/16; 707/101; 707/102

(58) Field of Classification Search ............... 716/2, 716/3, 18, 4; 703/16; 707/101, 102
See application file for complete search history.

(56) References Cited

U.S. PATENT DOCUMENTS

| 5,550,714 | A * | 8/1996 | Nishiyama | 716/11 |
| 6,367,051 | B1 * | 4/2002 | Pileggi et al. | 716/2 |
| 7,020,864 | B1 * | 3/2006 | Loong | 716/16 |
| 7,111,274 | B1 * | 9/2006 | Edwards et al. | 716/18 |
| 7,246,340 | B1 * | 7/2007 | Van Antwerpen et al. | 716/18 |
| 2003/0037305 | A1 * | 2/2003 | Chen et al. | 716/4 |

FOREIGN PATENT DOCUMENTS

| JP | 08-044773 | 7/1994 |
| JP | 2004-021841 | 6/2002 |

OTHER PUBLICATIONS

McDonald et al., "Computing Logic-Stage Delays Using Circuit Simulation and Symbolic Elmore Analysis", Proceedings of Design Automation Conference, 2001, pp. 283-288.*
Pang et al., "A Compiler for Optimized Arithmetic Datapaths", Proceedings of the IEEE 1989 Custom Integrated Circuits Conference, May 15-18, 1989, pp. 23.1/1-23.1/4.*
Devadas, "General Decomposition of Sequential Machines: Relationships to State Assignment", 26th Conference on Design Automation, Jun. 25-29, 1989, pp. 314-320.*

* cited by examiner

*Primary Examiner*—Phallaka Kik
(74) *Attorney, Agent, or Firm*—Reed Smith LLP; Stanley P. Fisher, Esq.; Juan Carlos A. Marquez, Esq.

(57) ABSTRACT

A hardware model conversion system includes a logic synthesis tool and a hardware model conversion program. The logic synthesis tool logically synthesizes an HDL-described circuit and then outputs intermediate data. One assign statement described in the intermediate data is associated with one assign cell. The hardware model conversion program creates a logical structure table that shows a circuit connection relationship between the plural assign cells. The hardware model conversion program refers to the logical structure table and executes model conversion of the HDL-described circuit to a pipeline structure so that assign cells having the same logic depth will belong to the same pipeline stage.

13 Claims, 79 Drawing Sheets

PIPELINE MODE

```
library IEEE ;
  use IEEE.std_logic_1164.all ;
  use IEEE.std_logic_arith.all ;
entity ADD_NXN is
generic(N:integer:=2) ;
  port(
    a  :in std_ulogic_vector(N-1 downto 0);
    b  :in std_ulogic_vector(N-1 downto 0);
    ci :in std_ulogic;
    co :out std_ulogic;
    z  :out std_ulogic_vector(N-1 downto 0) );
end ADD_NXN ;
architecture VHDL of ADD_NXN is
  signal g :std_ulogic_vector(N-1 downto 0) ;
  signal p :std_ulogic_vector(N-1 downto 0) ;
  signal cchain :std_ulogic_vector(N-1 downto 0) ;
  signal cshift :std_ulogic_vector(N downto 0) ;
  signal result :std_ulogic_vector(N downto 0) ;
  begin
    g <= a and b ;
    p <= a xor b ;
    cchain(0) <= g(0) xor( p(0) and ci ) ;
    process(cchain,g,p)
    variable wch :std_ulogic_vector(N-1 downto 0) ;
    begin
      wch := cchain ;
      for I in 1 to N-1 loop
        wch(I) := g(I) xor ( wch(I-1) and p(I) ) ;
      end loop;
      cchain(N-1 downto 1) <= wch(N-1 downto 1) ;
    end process;

cshift <= cchain & ci ;
    result <= '0'&p xor cshift ;
    co <= cshift(N) ;
    z <= result(N-1 downto 0) ;
end VHDL;

~(続く)~
```

```
                 ~(続き)~
library ieee;
use ieee.std_logic_1164.all;

entity ADD_NXN_COMP is
  port (
    a  : in std_ulogic_vector(1 downto 0 );
    b  : in std_ulogic_vector(1 downto 0 );
    ci : in std_ulogic;
    co : out std_ulogic;
    z  : out std_ulogic_vector(1 downto 0 )
  );
end ADD_NXN_COMP;

use work.all;
architecture ADD_NXN_COMP of ADD_NXN_COMP is component ADD_NXN
    generic (
        N : INTEGER := 2
    );
    port (
      a  : in std_ulogic_vector(N - 1 downto 0 );
      b  : in std_ulogic_vector(N - 1 downto 0 );
      ci : in std_ulogic;
      co : out std_ulogic;
      z  : out std_ulogic_vector(N - 1 downto 0 )
    );
  end component;

-- Start Configuration Specification
  -- ++ for all : ADD_NXN use entity work.ADD_NXN(VHDL);
  -- End Configuration Specification begin C0: ADD_NXN
    generic map (2)
    port map (
        a => a(1 downto 0),
        b => b(1 downto 0),
        ci => ci,
        co => co,
        z => z(1 downto 0));
end ADD_NXN_COMP;
```

INPUT HDL CIRCUIT (2-BIT FULL ADDER VHDL)

```
module ADD_NXN_COMP ( a, b, ci, co, z );
input [1:0] a;
input [1:0] b;
output [1:0] z;
input ci;
output co;
   wire n10, n11, n12, n13, n14, n15, n16, n17, n18, n19, n20, n21, n22, n23,
      n24, n25, n26, n27, n28, n29, n30, n31, n32, n33, n34;
   assign co = ~n10;
   assign n11 = ~b[0];
   assign n12 = ~ci;
   assign n13 = (~n12 & ~z[0]);
   assign n14 = (~n11 & ~n15);
   assign n16 = (~n13 & ~n14);
   assign n17 = ~b[1];
   assign n18 = (~n16 & ~z[1]);
   assign n19 = (~n17 & ~n20);
   assign n10 = (~n18 & ~n19);
   assign n20 = ~n21;
   assign n15 = ~n22;
   assign z[0] = ~n23;
   assign n24 = ~a[0];
   assign n25 = (~b[0] & ~n24);
   assign n26 = (~a[0] & ~n11);
   assign n22 = (~n25 & ~n26);
   assign n27 = (~n12 & ~n15);
   assign n28 = (~ci & ~n22);
   assign n23 = (~n27 & ~n28);
   assign n29 = ~a[1];
   assign n30 = (~b[1] & ~n29);
   assign n31 = (~a[1] & ~n17);
   assign n21 = (~n30 & ~n31);
   assign n32 = ~n16;
   assign n33 = (~n20 & ~n32);
   assign n34 = (~n16 & ~n21);
   assign z[1] = (~n33 & ~n34);
endmodule
```

INTERMEDIATE DATA (2-BIT FULL ADDER Verilog)

ASSIGN CELL

FIG.9

402

ASSIGN STATEMENT TABLE

| |
|---|
| assign co = ~n10; |
| assign n11 = ~b[0]; |
| assign n12 = ~ci; |
| assign n13 = (~n12 & ~z[0]); |
| assign n14 = (~n11 & ~n15); |
| assign n16 = (~n13 & ~n14); |
| assign n17 = ~b[1]; |
| assign n18 = (~n16 & ~z[1]); |
| assign n19 = (~n17 & ~n20); |
| assign n10 = (~n18 & ~n19); |
| assign n20 = ~n21; |
| assign n15 = ~n22; |
| assign z[0] = ~n23; |
| assign n24 = ~a[0]; |
| assign n25 = (~b[0] & ~n24); |
| assign n26 = (~a[0] & ~n11); |
| assign n22 = (~n25 & ~n26); |
| assign n27 = (~n12 & ~n15); |
| assign n28 = (~ci & ~n22); |
| assign n23 = (~n27 & ~n28); |
| assign n29 = ~a[1]; |
| assign n30 = (~b[1] & ~n29); |
| assign n31 = (~a[1] & ~n17); |
| assign n21 = (~n30 & ~n31); |
| assign n32 = ~n16; |
| assign n33 = (~n20 & ~n32); |
| assign n34 = (~n16 & ~n21); |
| assign z[1] = (~n33 & ~n34); |

INPUT TABLE
(PORT FORMAT)

| portname | bitsize |
|---|---|
| a | 2 |
| b | 2 |
| ci | 1 |

INPUT TABLE
(BIT DIVISION FORMAT)

| |
|---|
| a[0] |
| a[1] |
| b[0] |
| b[1] |
| ci |

OUTPUT TABLE
(PORT FORMAT)

| portname | bitsize |
|---|---|
| z | 2 |
| co | 1 |

OUTPUT TABLE
(BIT DIVISION FORMAT)

| |
|---|
| z[0] |
| z[1] |
| co |

ASSIGN STATEMENT ELEMENT TABLE

| tbindex | dist | opsize | op[0] | op[1] | op[2] | | op[14] | op[15] |
|---|---|---|---|---|---|---|---|---|
| 0 | co | 1 | n10 | NULL | NULL | | NULL | NULL |
| 1 | n11 | 1 | b[0] | NULL | NULL | | NULL | NULL |
| 2 | n12 | 1 | ci | NULL | NULL | | NULL | NULL |
| 3 | n13 | 2 | n12 | z[0] | NULL | | NULL | NULL |
| 4 | n14 | 2 | n11 | n15 | NULL | | NULL | NULL |
| 5 | n16 | 2 | n13 | n14 | NULL | | NULL | NULL |
| 6 | n17 | 1 | b[1] | NULL | NULL | | NULL | NULL |
| 7 | n18 | 2 | n16 | z[1] | NULL | | NULL | NULL |
| 8 | n19 | 2 | n17 | n20 | NULL | | NULL | NULL |
| 9 | n10 | 2 | n18 | n19 | NULL | | NULL | NULL |
| 10 | n20 | 1 | n21 | NULL | NULL | | NULL | NULL |
| 11 | n15 | 1 | n22 | NULL | NULL | | NULL | NULL |
| 12 | z[0] | 1 | n23 | NULL | NULL | ... | NULL | NULL |
| 13 | n24 | 1 | a[0] | NULL | NULL | | NULL | NULL |
| 14 | n25 | 2 | b[0] | n24 | NULL | | NULL | NULL |
| 15 | n26 | 2 | a[0] | n11 | NULL | | NULL | NULL |
| 16 | n22 | 2 | n25 | n26 | NULL | | NULL | NULL |
| 17 | n27 | 2 | n12 | n15 | NULL | | NULL | NULL |
| 18 | n28 | 2 | ci | n22 | NULL | | NULL | NULL |
| 19 | n23 | 2 | n27 | n28 | NULL | | NULL | NULL |
| 20 | n29 | 1 | a[1] | NULL | NULL | | NULL | NULL |
| 21 | n30 | 2 | b[1] | n29 | NULL | | NULL | NULL |
| 22 | n31 | 2 | a[1] | n17 | NULL | | NULL | NULL |
| 23 | n21 | 2 | n30 | n31 | NULL | | NULL | NULL |
| 24 | n32 | 1 | n16 | NULL | NULL | | NULL | NULL |
| 25 | n33 | 2 | n20 | n32 | NULL | | NULL | NULL |
| 26 | n34 | 2 | n16 | n21 | NULL | | NULL | NULL |
| 27 | z[1] | 2 | n33 | n34 | NULL | | NULL | NULL | tbindex      Assign statement order of appearance
dist      Signal name on left-hand side of assign statement
opsize      Number of signals connected to right-hand side of assign statement
op[0]~[15]      Signal names connected to right-hand side of assign statement

INTERMEDIATE DATA CIRCUIT
CONNECTION DIAGRAM

LOGICAL STRUCTURE TABLE RECORD FORMAT

| ltindex | tbindex | dist | attribute | depth | source_size | source[0] | source[1] | ... | source[14] | source[15] |
|---|---|---|---|---|---|---|---|---|---|---|
| | | | | | | | | ... | | |

| | |
|---|---|
| ltindex | Logical structure table index number |
| tbindex | Assign statement element table index number |
| dist | Signal name on left-hand side of assign statement |
| attribute | Signal attribute for dist (input/output/wire/dmyout) |
| depth | Logic depth |
| source_size | Number of signals connected to right-hand side of assign statement |
| source[0]~[15] | Signal names connected to right-hand side of assign statement |

LOGICAL STRUCTURE TABLE (INPUT PORT INSERTION)

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |

LOGICAL STRUCTURE TABLE (ASSIGN STATEMENT INITIALIZATION PROCESSING)

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | NULL | 0 | NULL | NULL | ... | NULL | NULL |
| 6 | 1 | n11 | wire | NULL | 0 | NULL | NULL | ... | NULL | NULL |
| 7 | 2 | n12 | wire | NULL | 0 | NULL | NULL | ... | NULL | NULL |
| 8 | 3 | n13 | wire | NULL | 0 | NULL | NULL | ... | NULL | NULL |
| 9 | 4 | n14 | wire | NULL | 0 | NULL | NULL | ... | NULL | NULL |
| 10 | 5 | n16 | wire | NULL | 0 | NULL | NULL | ... | NULL | NULL |
| 11 | 6 | n17 | wire | NULL | 0 | NULL | NULL | ... | NULL | NULL |
| 12 | 7 | n18 | wire | NULL | 0 | NULL | NULL | ... | NULL | NULL |
| 13 | 8 | n19 | wire | NULL | 0 | NULL | NULL | ... | NULL | NULL |
| 14 | 9 | n10 | wire | NULL | 0 | NULL | NULL | ... | NULL | NULL |
| 15 | 10 | n20 | wire | NULL | 0 | NULL | NULL | ... | NULL | NULL |
| 16 | 11 | n15 | wire | NULL | 0 | NULL | NULL | ... | NULL | NULL |
| 17 | 12 | z[0] | wire | NULL | 0 | NULL | NULL | ... | NULL | NULL |
| 18 | 13 | n24 | wire | NULL | 0 | NULL | NULL | ... | NULL | NULL |
| 19 | 14 | n25 | wire | NULL | 0 | NULL | NULL | ... | NULL | NULL |
| 20 | 15 | n26 | wire | NULL | 0 | NULL | NULL | ... | NULL | NULL |
| 21 | 16 | n22 | wire | NULL | 0 | NULL | NULL | ... | NULL | NULL |
| 22 | 17 | n27 | wire | NULL | 0 | NULL | NULL | ... | NULL | NULL |
| 23 | 18 | n28 | wire | NULL | 0 | NULL | NULL | ... | NULL | NULL |
| 24 | 19 | n23 | wire | NULL | 0 | NULL | NULL | ... | NULL | NULL |
| 25 | 20 | n29 | wire | NULL | 0 | NULL | NULL | ... | NULL | NULL |
| 26 | 21 | n30 | wire | NULL | 0 | NULL | NULL | ... | NULL | NULL |
| 27 | 22 | n31 | wire | NULL | 0 | NULL | NULL | ... | NULL | NULL |
| 28 | 23 | n21 | wire | NULL | 0 | NULL | NULL | ... | NULL | NULL |
| 29 | 24 | n32 | wire | NULL | 0 | NULL | NULL | ... | NULL | NULL |
| 30 | 25 | n33 | wire | NULL | 0 | NULL | NULL | ... | NULL | NULL |
| 31 | 26 | n34 | wire | NULL | 0 | NULL | NULL | ... | NULL | NULL |
| 32 | 27 | z[1] | wire | NULL | 0 | NULL | NULL | ... | NULL | NULL |

FIG.16

LOGICAL STRUCTURE TABLE    401

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | NULL | 0 | NULL | NULL | ... | NULL | NULL |
| 6 | 1 | n11 | wire | NULL | 0 | NULL | NULL | ... | NULL | NULL |
| 7 | 2 | n12 | wire | NULL | 0 | NULL | NULL | ... | NULL | NULL |

REFERENCE

ASSIGN STATEMENT ELEMENT TABLE    404

| tbindex | dist | opsize | op[0] | op[1] | op[2] | | op[14] | op[15] |
|---|---|---|---|---|---|---|---|---|
| 0 | co | 1 | n10 | NULL | NULL | | NULL | NULL |
| 1 | n11 | 1 | b[0] | NULL | NULL | | NULL | NULL |
| 2 | n12 | 1 | ci | NULL | NULL | | NULL | NULL |
| 3 | n13 | 2 | n12 | z[0] | NULL | | NULL | NULL |

REFERENCE TO ASSIGN
STATEMENT ELEMENT TABLE

FIG.17

ASSIGN STATEMENT ELEMENT TABLE    404

| tbindex | dist | opsize | op[0] | op[1] | op[2] | | op[14] | op[15] |
|---|---|---|---|---|---|---|---|---|
| 0 | co | 1 | n10 | NULL | NULL | | NULL | NULL |
| 1 | n11 | 1 | b[0] | NULL | NULL | | NULL | NULL |
| 2 | n12 | 1 | ci | NULL | NULL | | NULL | NULL |
| 3 | n13 | 2 | n12 | z[0] | NULL | | NULL | NULL |

SEARCH

LOGICAL STRUCTURE TABLE    401

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | NULL | 0 | NULL | NULL | ... | NULL | NULL |
| 6 | 1 | n11 | wire | NULL | 0 | NULL | NULL | ... | NULL | NULL |
| ... | | | | | | | | | | |
| 13 | 8 | n19 | wire | NULL | 0 | NULL | NULL | ... | NULL | NULL |
| 14 | 9 | n10 | wire | NULL | 0 | NULL | NULL | ... | NULL | NULL |
| 15 | 10 | n20 | wire | NULL | 0 | NULL | NULL | ... | NULL | NULL |

SEARCH FOR SIGNALS ON
RIGHT-HAND SIDE OF ASSIGN STATEMENT

FIG. 18

LOGICAL STRUCTURE TABLE                                401

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | NULL | 1 | 14 | NULL | ... | NULL | NULL |
| 6 | 1 | n11 | wire | NULL | 0 | NULL | NULL | ... | NULL | NULL |
| ... | | | | | | | | | | |
| 13 | 8 | n19 | wire | NULL | 0 | NULL | NULL | ... | NULL | NULL |
| 14 | 9 | n10 | wire | NULL | 0 | NULL | NULL | ... | NULL | NULL |
| 15 | 10 | n20 | wire | NULL | 0 | NULL | NULL | ... | NULL | NULL |

SOURCE SETTING

FIG. 19

LOGICAL STRUCTURE TABLE (SOURCES SET)                  401

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | NULL | 1 | 14 | NULL | ... | NULL | NULL |
| 6 | 1 | n11 | wire | NULL | 1 | 2 | NULL | ... | NULL | NULL |
| 7 | 2 | n12 | wire | NULL | 1 | 4 | NULL | ... | NULL | NULL |
| 8 | 3 | n13 | wire | NULL | 2 | 7 | 17 | ... | NULL | NULL |
| 9 | 4 | n14 | wire | NULL | 2 | 6 | 16 | ... | NULL | NULL |
| 10 | 5 | n16 | wire | NULL | 2 | 8 | 9 | ... | NULL | NULL |
| 11 | 6 | n17 | wire | NULL | 1 | 3 | NULL | ... | NULL | NULL |
| 12 | 7 | n18 | wire | NULL | 2 | 10 | 32 | ... | NULL | NULL |
| 13 | 8 | n19 | wire | NULL | 2 | 11 | 15 | ... | NULL | NULL |
| 14 | 9 | n10 | wire | NULL | 2 | 12 | 13 | ... | NULL | NULL |
| 15 | 10 | n20 | wire | NULL | 1 | 28 | NULL | ... | NULL | NULL |
| 16 | 11 | n15 | wire | NULL | 1 | 21 | NULL | ... | NULL | NULL |
| 17 | 12 | z[0] | wire | NULL | 1 | 24 | NULL | ... | NULL | NULL |
| 18 | 13 | n24 | wire | NULL | 1 | 0 | NULL | ... | NULL | NULL |
| 19 | 14 | n25 | wire | NULL | 2 | 2 | 18 | ... | NULL | NULL |
| 20 | 15 | n26 | wire | NULL | 2 | 0 | 6 | ... | NULL | NULL |
| 21 | 16 | n22 | wire | NULL | 2 | 19 | 20 | ... | NULL | NULL |
| 22 | 17 | n27 | wire | NULL | 2 | 7 | 16 | ... | NULL | NULL |
| 23 | 18 | n28 | wire | NULL | 2 | 4 | 21 | ... | NULL | NULL |
| 24 | 19 | n23 | wire | NULL | 2 | 22 | 23 | ... | NULL | NULL |
| 25 | 20 | n29 | wire | NULL | 1 | 1 | NULL | ... | NULL | NULL |
| 26 | 21 | n30 | wire | NULL | 2 | 3 | 25 | ... | NULL | NULL |
| 27 | 22 | n31 | wire | NULL | 2 | 1 | 11 | ... | NULL | NULL |
| 28 | 23 | n21 | wire | NULL | 2 | 26 | 27 | ... | NULL | NULL |
| 29 | 24 | n32 | wire | NULL | 1 | 10 | NULL | ... | NULL | NULL |
| 30 | 25 | n33 | wire | NULL | 2 | 15 | 29 | ... | NULL | NULL |
| 31 | 26 | n34 | wire | NULL | 2 | 10 | 28 | ... | NULL | NULL |
| 32 | 27 | z[1] | wire | NULL | 2 | 30 | 31 | ... | NULL | NULL |

LOGICAL STRUCTURE TABLE

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | NULL | 1 | 14 | NULL | ... | NULL | NULL |
| 6 | 1 | n11 | wire | NULL | 1 | 2 | NULL | ... | NULL | NULL |
| ... | | | | | | | | | | |
| 25 | 20 | n29 | wire | NULL | 1 | 1 | NULL | ... | NULL | NULL |
| 26 | 21 | n30 | wire | NULL | 2 | 3 | 25 | ... | NULL | NULL |
| ... | | | | | | | | | | |
| 31 | 26 | n34 | wire | NULL | 2 | 10 | 28 | ... | NULL | NULL |
| 32 | 27 | z[1] | wire | NULL | 2 | 30 | 31 | ... | NULL | NULL |

RECORD FETCHING

LOGICAL STRUCTURE TABLE

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | NULL | 1 | 14 | NULL | ... | NULL | NULL |
| 6 | 1 | n11 | wire | NULL | 1 | 2 | NULL | ... | NULL | NULL |
| ... | | | | | | | | | | |
| 25 | 20 | n29 | wire | NULL | 1 | 1 | NULL | ... | NULL | NULL |
| 26 | 21 | n30 | wire | NULL | 2 | 3 | 25 | ... | NULL | NULL |
| ... | | | | | | | | | | |
| 31 | 26 | n34 | wire | NULL | 2 | 10 | 28 | ... | NULL | NULL |
| 32 | 27 | z[1] | wire | NULL | 2 | 30 | 31 | ... | NULL | NULL |

SOURCE DEPTH CHECKING

FIG.22

LOGICAL STRUCTURE TABLE — 401

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | NULL | 1 | 14 | NULL | ... | NULL | NULL |
| 6 | 1 | n11 | wire | NULL | | | | ... | NULL | NULL |
| 25 | 20 | n29 | wire | 1 | 1 | 1 | NULL | ... | NULL | NULL |
| 26 | 21 | n30 | wire | NULL | 2 | 3 | 25 | ... | NULL | NULL |
| 31 | 26 | n34 | wire | NULL | 2 | 10 | 28 | ... | NULL | NULL |
| 32 | 27 | z[1] | wire | NULL | 2 | 30 | 31 | ... | NULL | NULL |

The depth matches TMP_DEPTH.

Set the depth to TMP_DEPTH+1.

LOGIC DEPTH SETTING

FIG.23

LOGICAL STRUCTURE TABLE (LOGIC DEPTH SET) — 401

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | 15 | 1 | 14 | NULL | ... | NULL | NULL |
| 6 | 1 | n11 | wire | 1 | 1 | 2 | NULL | ... | NULL | NULL |
| 7 | 2 | n12 | wire | 1 | 1 | 4 | NULL | ... | NULL | NULL |
| 8 | 3 | n13 | wire | 8 | 2 | 7 | 17 | ... | NULL | NULL |
| 9 | 4 | n14 | wire | 5 | 2 | 6 | 16 | ... | NULL | NULL |
| 10 | 5 | n16 | wire | 9 | 2 | 8 | 9 | ... | NULL | NULL |
| 11 | 6 | n17 | wire | 1 | 1 | 3 | NULL | ... | NULL | NULL |
| 12 | 7 | n18 | wire | 13 | 2 | 10 | 32 | ... | NULL | NULL |
| 13 | 8 | n19 | wire | 5 | 2 | 11 | 15 | ... | NULL | NULL |
| 14 | 9 | n10 | wire | 14 | 2 | 12 | 13 | ... | NULL | NULL |
| 15 | 10 | n20 | wire | 4 | 1 | 28 | NULL | ... | NULL | NULL |
| 16 | 11 | n15 | wire | 4 | 1 | 21 | NULL | ... | NULL | NULL |
| 17 | 12 | z[0] | wire | 7 | 1 | 24 | NULL | ... | NULL | NULL |
| 18 | 13 | n24 | wire | 1 | 1 | 0 | NULL | ... | NULL | NULL |
| 19 | 14 | n25 | wire | 2 | 2 | 2 | 18 | ... | NULL | NULL |
| 20 | 15 | n26 | wire | 2 | 2 | 0 | 6 | ... | NULL | NULL |
| 21 | 16 | n22 | wire | 3 | 2 | 19 | 20 | ... | NULL | NULL |
| 22 | 17 | n27 | wire | 5 | 2 | 7 | 16 | ... | NULL | NULL |
| 23 | 18 | n28 | wire | 4 | 2 | 4 | 21 | ... | NULL | NULL |
| 24 | 19 | n23 | wire | 6 | 2 | 22 | 23 | ... | NULL | NULL |
| 25 | 20 | n29 | wire | 1 | 1 | 1 | NULL | ... | NULL | NULL |
| 26 | 21 | n30 | wire | 2 | 2 | 3 | 25 | ... | NULL | NULL |
| 27 | 22 | n31 | wire | 2 | 2 | 1 | 11 | ... | NULL | NULL |
| 28 | 23 | n21 | wire | 3 | 2 | 26 | 27 | ... | NULL | NULL |
| 29 | 24 | n32 | wire | 10 | 1 | 10 | NULL | ... | NULL | NULL |
| 30 | 25 | n33 | wire | 11 | 2 | 15 | 29 | ... | NULL | NULL |
| 31 | 26 | n34 | wire | 10 | 2 | 10 | 28 | ... | NULL | NULL |
| 32 | 27 | z[1] | wire | 12 | 2 | 30 | 31 | ... | NULL | NULL |

SEARCH FOR OUTPUT PORT

INSERTION OF PSEUDO OUTPUT PORT RECORD

LOGICAL STRUCTURE TABLE (FINAL VERSION)

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | output | 15 | 1 | 14 | NULL | ... | NULL | NULL |
| 6 | 1 | n11 | wire | 1 | 1 | 2 | NULL | ... | NULL | NULL |
| 7 | 2 | n12 | wire | 1 | 1 | 4 | NULL | ... | NULL | NULL |
| 8 | 3 | n13 | wire | 8 | 2 | 7 | 17 | ... | NULL | NULL |
| 9 | 4 | n14 | wire | 5 | 2 | 6 | 16 | ... | NULL | NULL |
| 10 | 5 | n16 | wire | 9 | 2 | 8 | 9 | ... | NULL | NULL |
| 11 | 6 | n17 | wire | 1 | 1 | 3 | NULL | ... | NULL | NULL |
| 12 | 7 | n18 | wire | 13 | 2 | 10 | 32 | ... | NULL | NULL |
| 13 | 8 | n19 | wire | 5 | 2 | 11 | 15 | ... | NULL | NULL |
| 14 | 9 | n10 | wire | 14 | 2 | 12 | 13 | ... | NULL | NULL |
| 15 | 10 | n20 | wire | 4 | 1 | 28 | NULL | ... | NULL | NULL |
| 16 | 11 | n15 | wire | 4 | 1 | 21 | NULL | ... | NULL | NULL |
| 17 | 12 | z[0] | output | 7 | 1 | 24 | NULL | ... | NULL | NULL |
| 18 | 13 | n24 | wire | 1 | 1 | 0 | NULL | ... | NULL | NULL |
| 19 | 14 | n25 | wire | 2 | 2 | 2 | 18 | ... | NULL | NULL |
| 20 | 15 | n26 | wire | 2 | 2 | 0 | 6 | ... | NULL | NULL |
| 21 | 16 | n22 | wire | 3 | 2 | 19 | 20 | ... | NULL | NULL |
| 22 | 17 | n27 | wire | 5 | 2 | 7 | 16 | ... | NULL | NULL |
| 23 | 18 | n28 | wire | 4 | 2 | 4 | 21 | ... | NULL | NULL |
| 24 | 19 | n23 | wire | 6 | 2 | 22 | 23 | ... | NULL | NULL |
| 25 | 20 | n29 | wire | 1 | 1 | 1 | NULL | ... | NULL | NULL |
| 26 | 21 | n30 | wire | 2 | 2 | 3 | 25 | ... | NULL | NULL |
| 27 | 22 | n31 | wire | 2 | 2 | 1 | 11 | ... | NULL | NULL |
| 28 | 23 | n21 | wire | 3 | 2 | 26 | 27 | ... | NULL | NULL |
| 29 | 24 | n32 | wire | 10 | 1 | 10 | NULL | ... | NULL | NULL |
| 30 | 25 | n33 | wire | 11 | 2 | 15 | 29 | ... | NULL | NULL |
| 31 | 26 | n34 | wire | 10 | 2 | 10 | 28 | ... | NULL | NULL |
| 32 | 27 | z[1] | wire | 12 | 2 | 30 | 31 | ... | NULL | NULL |
| 33 | NULL | z_dummy[0] | dmyout | 16 | 1 | 17 | NULL | ... | NULL | NULL |
| 34 | NULL | z_dummy[1] | dmyout | 16 | 1 | 32 | NULL | ... | NULL | NULL |
| 35 | NULL | co_dummy | dmyout | 16 | 1 | 5 | NULL | ... | NULL | NULL |

LOGICAL STRUCTURE TABLE CIRCUIT STRUCTURE

| VARIABLE | MEANING | VALUE |
|---|---|---|
| conv_model_mode | Operational mode for pipeline conversion | normal |
| | | pipeline |
| | | analyze |
| | | divide |
| conv_model_type | Designation of output language | VHDL |
| | | Verilog |
| | | SystemC |
| | | SpecC |
| conv_logic_constraint | Limitation on greatest logic depth per stage | Example:100 |
| conv_model_latency | Limitation on latency number for stage division | Example:2 |
| conv_div_depth | Designation of logical depth for stage division Effective in division mode | Example:64 |

USER SETTING FILE

PIPELINE MODE

DIVISION MODE

INTERMEDIATE DATA CIRCUIT CONNECTION
DIAGRAM (AFTER PIPELINE DIVISION)

FIG. 34

STAGE BOUNDARY TABLE RECORD FORMAT 408

| STINDEX | MIN | MAX |
|---------|-----|-----|
|         |     |     |

STINDEX STAGE NUMBER
MIN UPPER STAGE BOUNDARY
MAX LOWER STAGE BOUNDARY

FIG. 35

STAGE BOUNDARY TABLE 407

| STINDEX | MIN | MAX |
|---------|-----|-----|
| 0       | 1   | 5   |
| 1       | 5   | 9   |
| 2       | 9   | 13  |
| 3       | 13  | 16  |

FIG. 36

PIPELINE DIVISION PROCESSING FLOW

START
↓
ASSIGN STATEMENT STAGE EXTRACTION PROCESSING — S51
↓
INTERFACE STAGE EXTRACTION PROCESSING — S52
↓
EXTRACTION INTERFACE MERGE PROCESSING — S53
↓
INTERFACE GENERATION PROCESSING — S54
↓
END

ASSIGN STATEMENT TABLE RECORD FORMAT

| ltindex | tbindex | stage |
|---------|---------|-------|
|         |         |       | ltindex     Index number (ltindex) of assign statement logical structure table
tbindex    The value "tbindex" of assign statement logical structure table
           Assign statement element table index number
stage      PIPELINE STAGE NUMBER

STAGE BOUNDARY TABLE

| stindex | min | max |
|---------|-----|-----|
| 0       | 1   | 5   |
| 1       | 5   | 9   |
| 2       | 9   | 13  |
| 3       | 13  | 16  |

SEARCH

401

LOGICAL STRUCTURE TABLE

| ltindex | tbindex | dist | attribute | depth | source_size | source[0] | source[1] | ... | source[14] | source[15] |
|---------|---------|------|-----------|-------|-------------|-----------|-----------|-----|------------|------------|
| 0       | NULL    | a[0] | input     | 0     | 0           | NULL      | NULL      | ... | NULL       | NULL       |
| 1       | NULL    | a[1] | input     | 0     | 0           | NULL      | NULL      | ... | NULL       | NULL       |
| 2       | NULL    | b[0] | input     | 0     | 0           | NULL      | NULL      | ... | NULL       | NULL       |
| 3       | NULL    | b[1] | input     | 0     | 0           | NULL      | NULL      | ... | NULL       | NULL       |
| 4       | NULL    | ci   | input     | 0     | 0           | NULL      | NULL      | ... | NULL       | NULL       |
| 5       | 0       | co   | wire      | 15    | 1           | 14        | NULL      | ... | NULL       | NULL       |
| 6       | 1       | n11  | wire      | 1     | 1           | 2         | NULL      | ... | NULL       | NULL       |
| 7       | 2       | n12  | wire      | 1     | 1           | 4         | NULL      | ... | NULL       | NULL       |
| 8       | 3       | n13  | wire      | 8     | 2           | 7         | 17        | ... | NULL       | NULL       |

⋮

CHECKING LOGIC DEPTH OF LOGICAL STRUCTURE TABLE

FIG. 39

ASSIGN STATEMENT STAGE TABLE RECORD FORMAT (410)

| ltindex | tbindex | stage |
|---|---|---|
| 6 | 1 | 0 |

STAGE BOUNDARY TABLE (407)

| stindex | min | max |
|---|---|---|
| 0 | 1 | 5 |
| 1 | 5 | 9 |
| 2 | 9 | 13 |
| 3 | 13 | 16 |

LOGICAL STRUCTURE TABLE (401)

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | 15 | 1 | 14 | NULL | ... | NULL | NULL |
| 6 | 1 | n11 | wire | 1 | 1 | 2 | NULL | ... | NULL | NULL |
| 7 | 2 | n12 | wire | 1 | 1 | 4 | NULL | ... | NULL | NULL |
| 8 | 3 | n13 | wire | 2 | 2 | 7 | 17 | ... | NULL | NULL |

Record insertion. Depth matches the search conditions.

ASSIGN STATEMENT STAGE RECORD INSERTION

ASSIGN STATEMENT STAGE TABLE (STAGE 0)

| ltindex | tbindex | stage |
|---|---|---|
| 6 | 1 | 0 |
| 7 | 2 | 0 |
| 11 | 6 | 0 |
| 15 | 10 | 0 |
| 16 | 11 | 0 |
| 18 | 13 | 0 |
| 19 | 14 | 0 |
| 20 | 15 | 0 |
| 21 | 16 | 0 |
| 23 | 18 | 0 |
| 25 | 20 | 0 |
| 26 | 21 | 0 |
| 27 | 22 | 0 |
| 28 | 23 | 0 |

ASSIGN STATEMENT STAGE TABLE (STAGE 1)

| ltindex | tbindex | stage |
|---|---|---|
| 8 | 3 | 1 |
| 9 | 4 | 1 |
| 13 | 8 | 1 |
| 17 | 12 | 1 |
| 22 | 17 | 1 |
| 24 | 19 | 1 |

ASSIGN STATEMENT STAGE TABLE (STAGE 2)

| ltindex | tbindex | stage |
|---|---|---|
| 10 | 5 | 2 |
| 29 | 24 | 2 |
| 30 | 25 | 2 |
| 31 | 26 | 2 |
| 32 | 27 | 2 |

ASSIGN STATEMENT STAGE TABLE (STAGE 3)

| ltindex | tbindex | stage |
|---|---|---|
| 5 | 0 | 3 |
| 12 | 7 | 3 |
| 14 | 9 | 3 |

INTERMEDIATE DATA CIRCUIT (STAGE 1 INTERFACE EXTRACTION)

INTERFACE EXTRACTION TABLE RECORD FORMAT

| ltindex | dist | depth | find_stage |
|---|---|---|---|
|  |  |  |  |

| | |
|---|---|
| ltinex | Index number of logical structure table |
| dist | Cell name stored in logical structure table (dist) |
| depth | Logic depth stored in logical structure table (depth) |
| find_stage | Stage number for stage where connection with the cell of the relevant record has been found. |

ASSIGN STATEMENT STAGE TABLE (STAGE 1)

| ltindex | tbindex | stage |
|---|---|---|
| 8 | 3 | 1 |
| 9 | 4 | 1 |
| 13 | 8 | 1 |
| 17 | 12 | 1 |
| 22 | 17 | 1 |
| 24 | 19 | 1 |

407

STAGE BOUNDARY TABLE

| stindex | min | max |
|---|---|---|
| 0 | 1 | 5 |
| 1 | 5 | 9 |
| 2 | 9 | 13 |
| 3 | 13 | 16 |

REFERENCE TO ASSIGN STATEMENT STAGE TABLE

FIG. 44

ASSIGN STATEMENT STAGE TABLE (STAGE 1) — 409B

| ltindex | tbindex | stage |
|---|---|---|
| 8 | 3 | 1 |
| 9 | 4 | 1 |
| 13 | 8 | 1 |
| 17 | 12 | 1 |
| 22 | 17 | 1 |
| 24 | 19 | 1 |

STAGE BOUNDARY TABLE — 407

| stindex | min | max |
|---|---|---|
| 0 | 1 | 5 |
| 1 | 5 | 9 |
| 2 | 9 | 13 |
| 3 | 13 | 16 |

LOGICAL STRUCTURE TABLE — 401

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | 15 | 1 | 14 | NULL | ... | NULL | NULL |
| 6 | 1 | n11 | wire | 1 | 1 | 2 | NULL | ... | NULL | NULL |
| 21 | 16 | n22 | wire | 3 | 2 | 19 | 20 | ... | NULL | NULL |
| 22 | 17 | n27 | wire | 5 | 2 | 7 | 16 | ... | NULL | NULL |
| 23 | 18 | n28 | wire | 4 | 2 | 4 | 21 | ... | NULL | NULL |

REFERENCE TO LOGICAL STRUCTURE TABLE

FIG. 45

ASSIGN STATEMENT STAGE TABLE (STAGE 1) — 409B

| ltindex | tbindex | stage |
|---|---|---|
| 8 | 3 | 1 |
| 9 | 4 | 1 |
| 13 | 8 | 1 |
| 17 | 12 | 1 |
| 22 | 17 | 1 |
| 24 | 19 | 1 |

STAGE BOUNDARY TABLE — 407

| stindex | min | max |
|---|---|---|
| 0 | 1 | 5 |
| 1 | 5 | 9 |
| 2 | 9 | 13 |
| 3 | 13 | 16 |

LOGICAL STRUCTURE TABLE — 401

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | 15 | 1 | 14 | NULL | ... | NULL | NULL |
| 6 | 1 | n11 | wire | 1 | 1 | 2 | NULL | ... | NULL | NULL |
| 7 | 2 | n12 | wire | 1 | 1 | 4 | NULL | ... | NULL | NULL |
| 16 | 11 | n15 | wire | 4 | 1 | 21 | NULL | ... | NULL | NULL |
| 21 | 16 | n22 | wire | 3 | 2 | 19 | 20 | ... | NULL | NULL |
| 22 | 17 | n27 | wire | 5 | 2 | 7 | 16 | ... | NULL | NULL |
| 23 | 18 | n28 | wire | 4 | 2 | 4 | 21 | ... | NULL | NULL |

REFERENCE TO LOGICAL STRUCTURE TABLE SOURCE

RECORD INSERTION INTO INTERFACE EXTRACTION TABLE

INTERFACE WITH PSEUDO OUTPUT PORT

FIG.48

STAGE BOUNDARY TABLE (407)

| stindex | min | max |
|---|---|---|
| 0 | 1 | 5 |
| 1 | 5 | 9 |
| 2 | 9 | 13 |
| 3 | 13 | 16 |

LOGICAL STRUCTURE TABLE (401)

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | 15 | 1 | 14 | NULL | ... | NULL | NULL |
| 17 | 12 | z[0] | wire | 7 | 1 | 24 | NULL | ... | NULL | NULL |
| 32 | 27 | z[1] | wire | 12 | 2 | 30 | 31 | ... | NULL | NULL |
| 33 | NULL | z_dummy[0] | dmyout | 16 | | | | ... | NULL | NULL |
| 34 | NULL | z_dummy[1] | dmyout | 16 | | | | ... | NULL | NULL |
| 35 | NULL | co_dummy | dmyout | 16 | | | | ... | NULL | NULL |

*The depth matches greatest logic depth.*

RECORD SELECTION FOR PSEUDO OUTPUT PORT

FIG.49

STAGE BOUNDARY TABLE (407)

| stindex | min | max |
|---|---|---|
| 0 | 1 | 5 |
| 1 | 5 | 9 |
| 2 | 9 | 13 |
| 3 | 13 | 16 |

LOGICAL STRUCTURE TABLE (401)

| ltindex | tbindex | dist | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | 15 | 1 | 14 | N | ... | | |
| 17 | 12 | z[0] | wire | 7 | 1 | 24 | NULL | ... | NULL | NULL |
| 32 | 27 | z[1] | wire | 12 | 2 | 30 | 31 | ... | NULL | NULL |
| 33 | NULL | z_dummy[0] | dmyout | 16 | 1 | 17 | NULL | ... | NULL | NULL |
| 34 | NULL | z_dummy[1] | dmyout | 16 | 1 | 32 | NULL | ... | NULL | NULL |
| 35 | NULL | co_dummy | dmyout | 16 | 1 | 5 | NULL | ... | NULL | NULL |

*Check if logic depth smaller than upper stage boundary (min).*

INTERFACE EXTRACTION TABLE (411)

| ltindex | dist | depth | find_stage |
|---|---|---|---|
| 7 | n12 | 1 | 1 |
| 16 | n15 | 4 | 1 |
| 17 | z[0] | 7 | 3 |

INTERFACE EXTRACTION TABLE INSERTION (PSUEDO OUTPUT PORT)

INTERFACE EXTRACTION TABLE 411

| ltindex | dist | depth | find_stage |
|---|---|---|---|
| 2 | b[0] | 0 | 0 |
| 4 | ci | 0 | 0 |
| 3 | b[1] | 0 | 0 |
| 0 | a[0] | 0 | 0 |
| 2 | b[0] | 0 | 0 |
| 0 | a[0] | 0 | 0 |
| 4 | ci | 0 | 0 |
| 1 | a[1] | 0 | 0 |
| 3 | b[1] | 0 | 0 |
| 1 | a[1] | 0 | 0 |
| 7 | n12 | 1 | 1 |
| 6 | n11 | 1 | 1 |
| 16 | n15 | 4 | 1 |
| 11 | n17 | 1 | 1 |
| 15 | n20 | 4 | 1 |
| 7 | n12 | 1 | 1 |
| 16 | n15 | 4 | 1 |
| 23 | n28 | 4 | 1 |
| 8 | n13 | 8 | 2 |
| 9 | n14 | 5 | 2 |
| 15 | n20 | 4 | 2 |
| 28 | n21 | 3 | 2 |
| 10 | n16 | 9 | 3 |
| 32 | z[1] | 12 | 3 |
| 13 | n19 | 5 | 3 |
| 17 | z[0] | 7 | 3 |
| 32 | z[1] | 12 | 3 |

INTERFACE EXTRACTION IMAGE

FIG.53

INTERFACE EXTRACTION TABLE (411)

| Itindex | dist | depth | find stage |
|---|---|---|---|
| 2 | b[0] | 0 | 0 |
| 4 | ci | 0 | 0 |
| 3 | b[1] | 0 | 0 |
| 0 | a[0] | 0 | 0 |
| 2 | b[0] | 0 | 0 |
| 0 | a[0] | 0 | 0 |
| 4 | ci | 0 | 0 |
| 1 | a[1] | 0 | 0 |
| 3 | b[1] | 0 | 0 |
| 1 | a[1] | 0 | 0 |
| 7 | n12 | 1 | 1 |
| 6 | n11 | 1 | 1 |
| 16 | n15 | 4 | 1 |
| 11 | n17 | 1 | 1 |
| 15 | n20 | 4 | 1 |
| 7 | n12 | 1 | 1 |
| 16 | n15 | 4 | 1 |
| 23 | n28 | 4 | 1 |
| 8 | n13 | 8 | 2 |
| 9 | n14 | 5 | 2 |
| 15 | n20 | 4 | 2 |
| 28 | n21 | 3 | 2 |
| 10 | n16 | 9 | 3 |
| 32 | z[1] | 12 | 3 |
| 13 | n19 | 5 | 3 |
| 17 | z[0] | 7 | 3 |
| 32 | z[1] | 12 | 3 |

INTERFACE EXTRACTION TABLE (AFTER MERGE) (411)

| Itindex | dist | depth | find stage |
|---|---|---|---|
| 7 | n12 | 1 | 1 |
| 6 | n11 | 1 | 1 |
| 16 | n15 | 4 | 1 |
| 11 | n17 | 1 | 1 |
| 15 | n20 | 4 | 2 |

COMPARISON

Select lower stage record from among records to which reference is made.

EXTRACTION INTERFACE MERGE OPERATION

FIG.54

EXTRACTION INTERFACE MERGE OPERATION (411)

| Itindex | dist | depth | find stage |
|---|---|---|---|
| 7 | n12 | 1 | 1 |
| 6 | n11 | 1 | 1 |
| 16 | n15 | 4 | 1 |
| 11 | n17 | 1 | 1 |
| 15 | n20 | 4 | 2 |
| 23 | n28 | 4 | 1 |
| 8 | n13 | 8 | 2 |
| 9 | n14 | 5 | 2 |
| 28 | n21 | 3 | 2 |
| 10 | n16 | 9 | 3 |
| 32 | z[1] | 12 | 3 |
| 13 | n19 | 5 | 3 |
| 17 | z[0] | 7 | 3 |

INTERFACE EXTRACTION TABLE (AFTER MERGE)

FIG. 55

INTERFACE TABLE RECORD FORMAT

| stindex | input_size | input_ltindex[0] | ... | input_ltindex[1023] | output_size | output_ltindex[0] | ... | output_ltindex[1023] |
|---|---|---|---|---|---|---|---|---|
| | | | | | | | | |

414

| | |
|---|---|
| stindex | Number of pipeline stages |
| input_size | Number of input interfaces |
| input_ltindex | Logical structure table index indicating cell that should be input interface. |
| output_size | Number of output interfaces |
| output_ltindex | Logical structure table index indicating cell that should be output interface. |

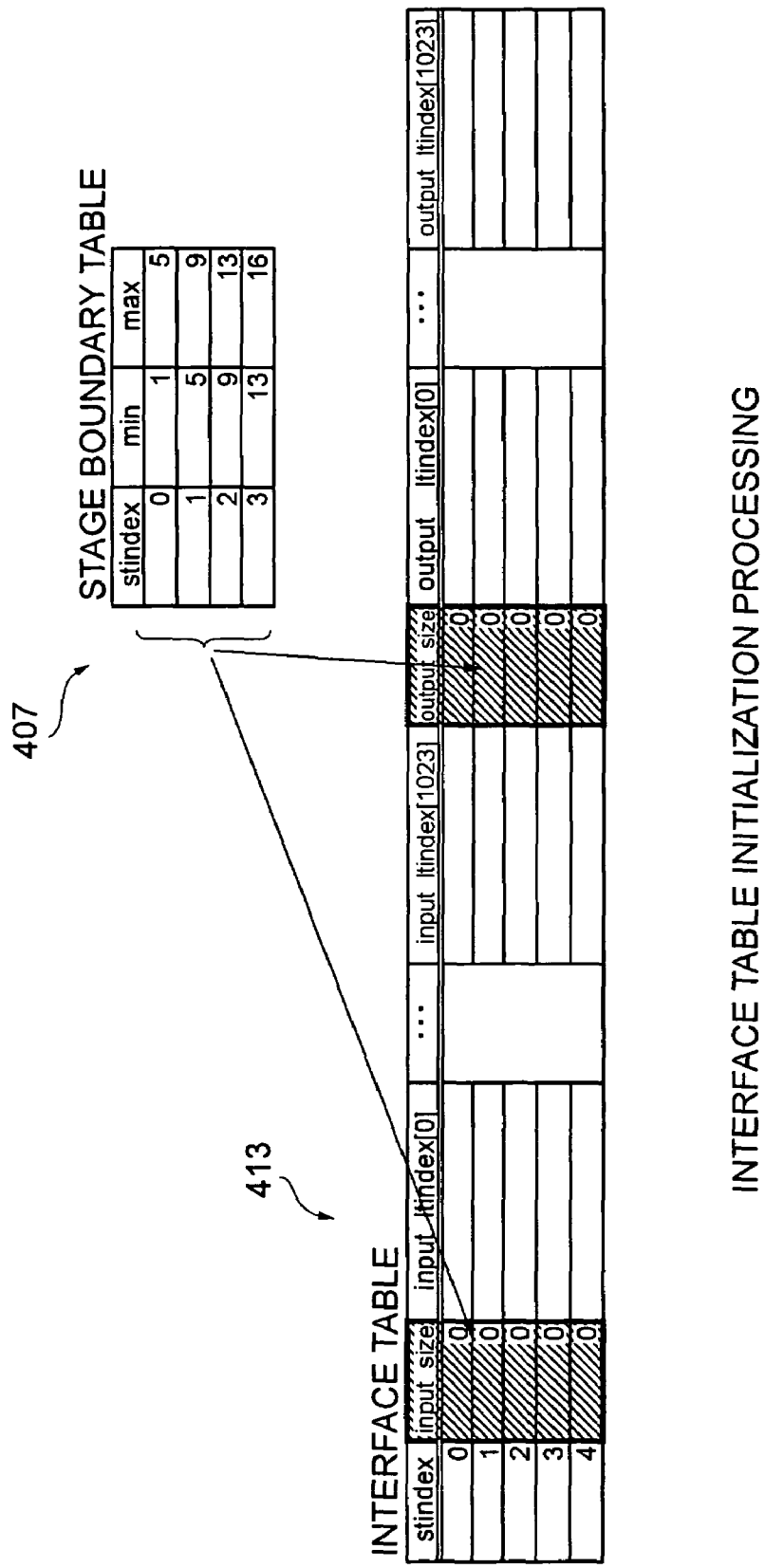

FIG. 57

INTERFACE EXTRACTION TABLE (411)

| Itindex | dist | depth | find_stage |
|---|---|---|---|
| 7 | n12 | 1 | 1 |
| 6 | n11 | 1 | 1 |
| 16 | n15 | 4 | 1 |
| 11 | n17 | 1 | 1 |
| 15 | n20 | 4 | 2 |
| 23 | n28 | 4 | 1 |
| 8 | n13 | 8 | 2 |
| 9 | n14 | 5 | 2 |
| 28 | n21 | 3 | 2 |
| 10 | n16 | 9 | 3 |
| 32 | z[1] | 12 | 3 |
| 5 | n19 | 5 | 3 |
| 13 | z[0] | 7 | 3 |

Check to see which stage boundary logic depth of interface extraction table should be included in.

STAGE BOUNDARY TABLE (407)

| stindex | min | max |
|---|---|---|
| 0 | 1 | 5 |
| 1 | 5 | 9 |
| 2 | 9 | 13 |
| 3 | 13 | 16 |

CHECKING STAGE BOUNDARY

FIG. 58

OUTPUT INTERFACE REGISTRATION

INTERFACE EXTRACTION TABLE (411)

| ltindex | dist | depth | find_stage |
|---|---|---|---|
| 7 | n12 | 1 | 1 |
| 6 | n11 | 1 | 1 |
| 16 | n15 | 4 | 1 |
| 11 | n17 | 1 | 1 |
| 15 | n20 | 4 | 2 |
| 23 | n28 | 4 | 1 |
| 8 | n13 | 8 | 2 |
| 9 | n14 | 5 | 2 |
| 28 | n21 | 3 | 3 |
| 10 | n16 | 9 | 3 |
| 32 | z[1] | 12 | 3 |
| 13 | n19 | 5 | 3 |
| 17 | z[0] | 7 | 3 |

Set records in interface table from stage including relevant record of interface extraction table to stage immediately before stage indicated in find_stage.

STAGE BOUNDARY TABLE (407)

| stindex | min | max |
|---|---|---|
| 0 | 1 | 5 |
| 1 | 5 | 9 |
| 2 | 9 | 13 |
| 3 | 13 | 16 |

INTERFACE TABLE (413)

| stindex | input_size | input_ltindex[0] | ... | input_ltindex[1023] | output_size | output_ltindex[0] | ... | output_ltindex[1023] |
|---|---|---|---|---|---|---|---|---|
| 0 | 0 | | | | 1 | 15 | | |
| 1 | 0 | | | | 1 | 15 | | |
| 2 | | | | | | | | |
| 3 | 0 | | | | 0 | | | |
| 4 | 0 | | | | 0 | | | |

Set output_ltindex of relevant stage to relevant ltindex of interface extraction table and increment output_size.

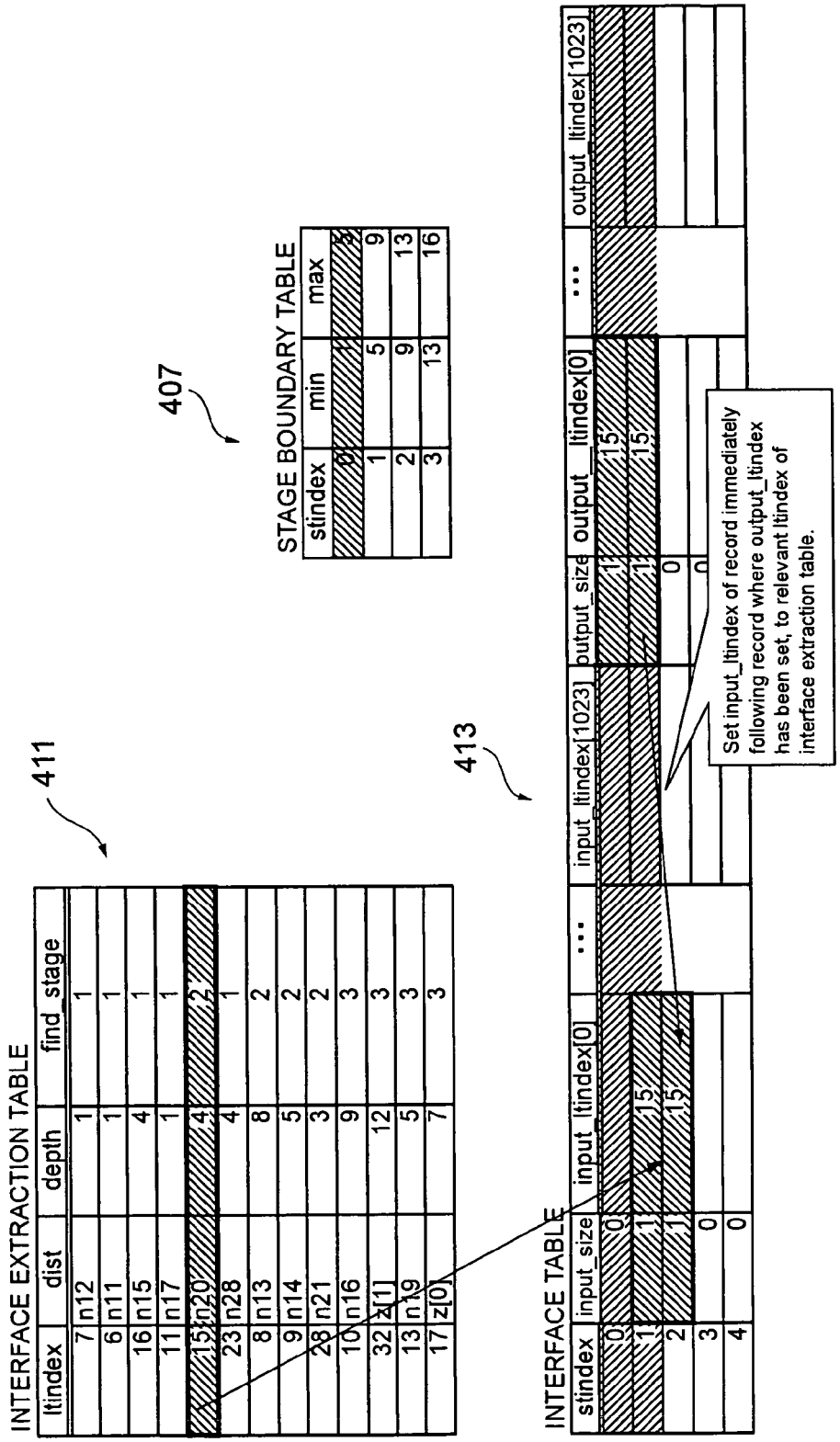

FIG. 60

INTERFACE TABLE 413

| stindex | input_size | input[0] | input[1] | input[2] | input[3] | input[4] | input[5] | input[6] | ... | output_size | output[0] | output[1] | output[2] | output[3] | output[4] | output[5] |
|---|---|---|---|---|---|---|---|---|---|---|---|---|---|---|---|---|
| 0 | 0 |  |  |  |  |  |  |  |  |  |  |  |  |  |  |  |
| 1 | 7 | 7 | 6 | 16 | 11 | 15 | 23 | 28 |  | 6 | 7 | 6 | 16 | 11 | 15 | 23 |
| 2 | 6 | 15 | 8 | 9 | 28 | 13 | 17 |  |  |  | 15 | 8 | 9 | 28 | 13 | 17 |
| 3 | 4 | 10 | 32 | 13 | 17 |  |  |  |  | 4 | 10 | 32 | 13 | 17 |  |  |
| 4 |  |  |  |  |  |  |  |  |  |  |  |  |  |  |  |  |

ADD_NXN_COMP Analyze report
 Tue Jul 26 20:35:36 2005

*********************************************

TOTAL LOGIC DEPTH          14
STAGE LENGTH          4
STAGE LOGIC DEPTH MAX      4
Critical Path    a[0] -> co _____
         Check Divide Analyze
_____

CUTPOINT| I/F Bit |
       2 |     8 |********
       3 |     6 |******
       4 |     7 |*******
       5 |     7 |*******
       6 |     6 |******
       7 |     6 |******
```

ANALYSIS REPORT

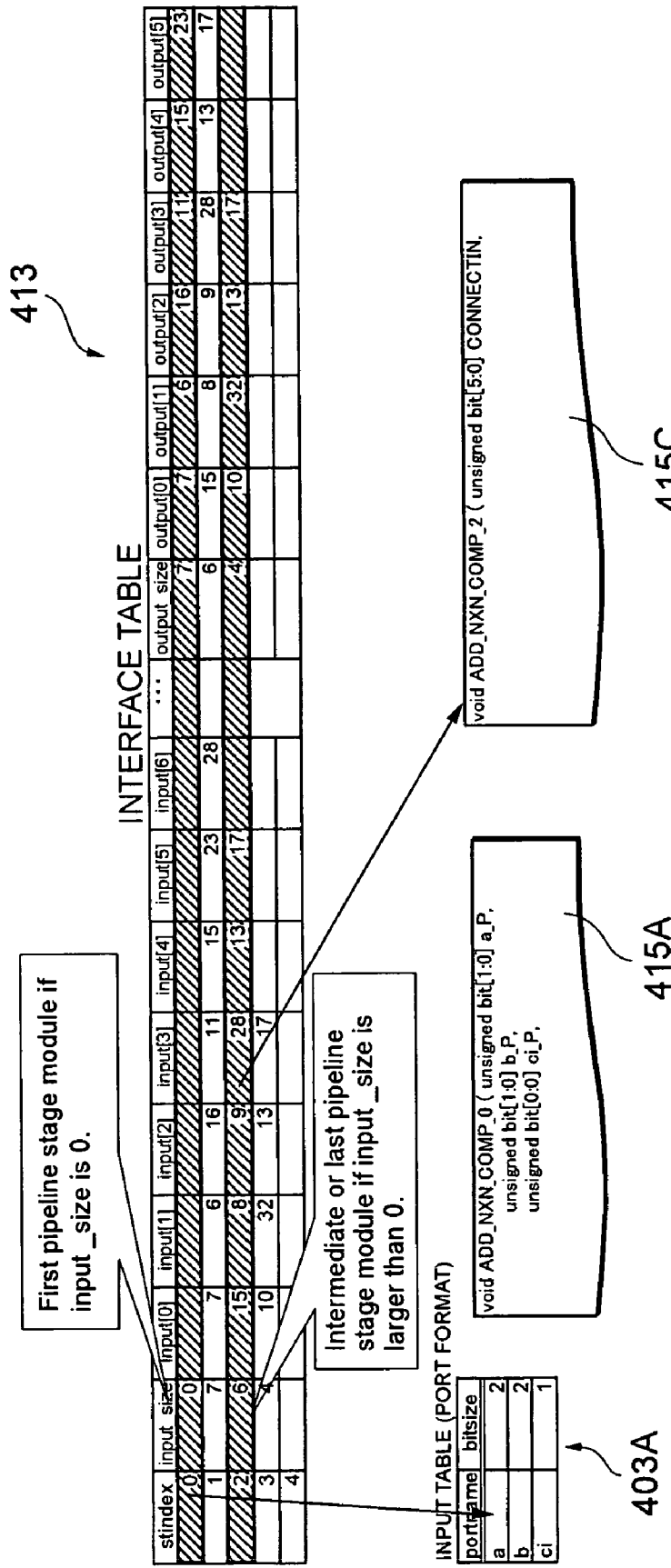
FIG.65 GENERATION OF FUNCTIONAL ARGUMENT (INPUT PORT)

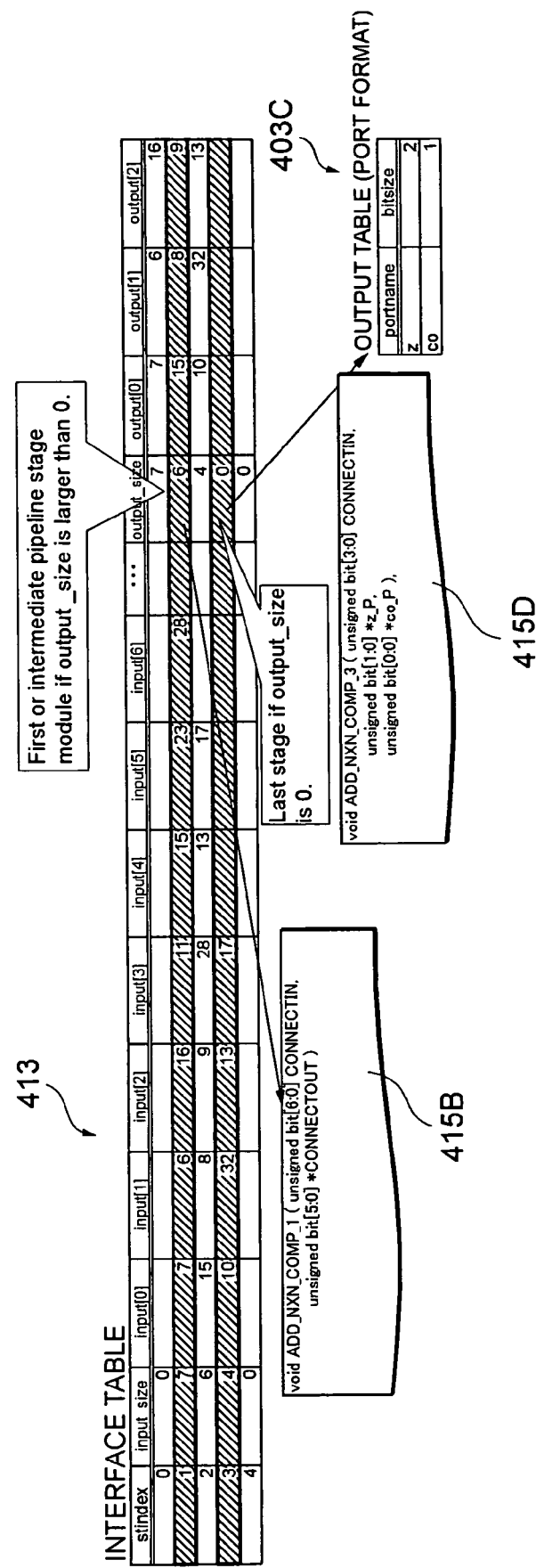

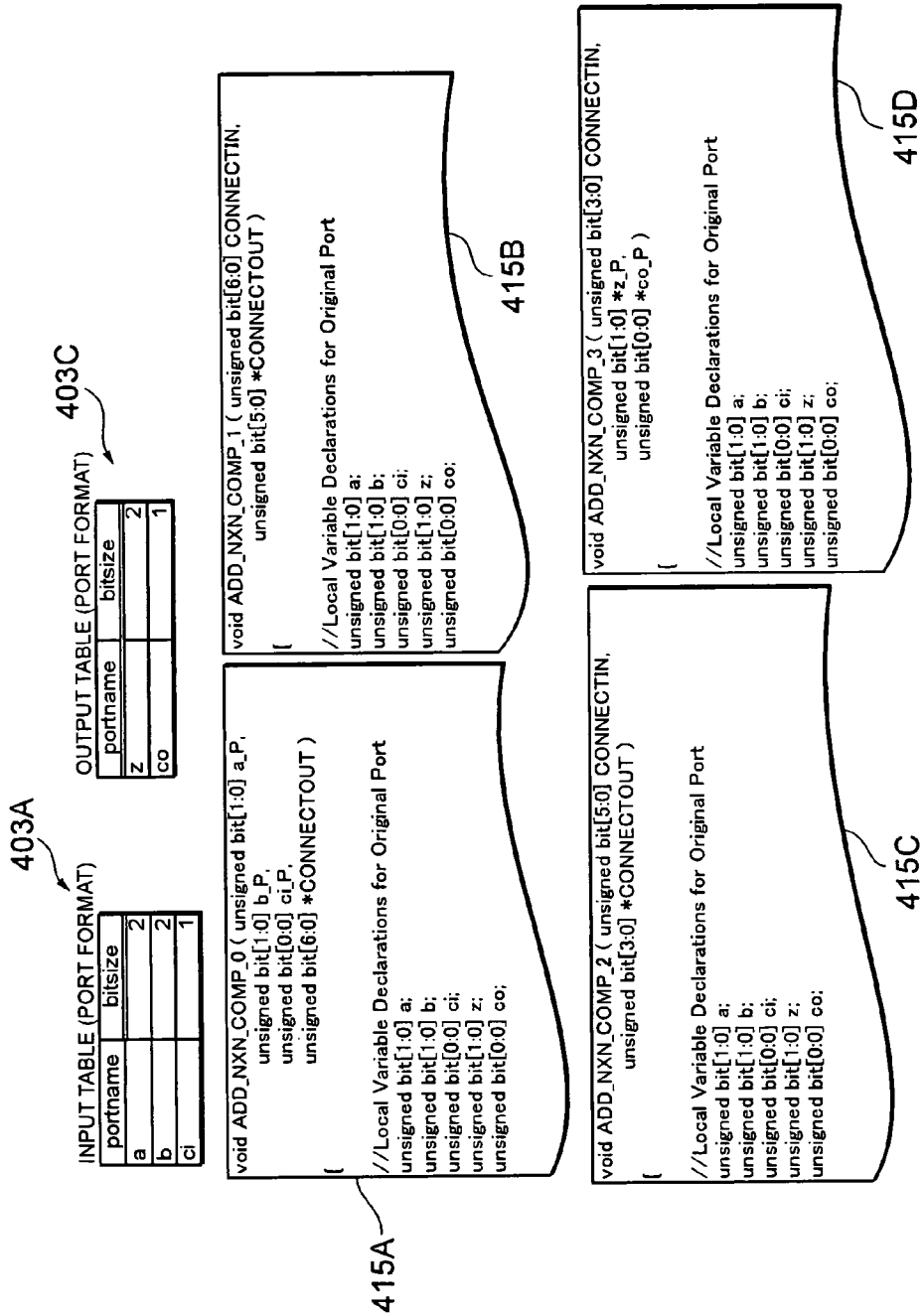

```
void ADD_NXN_COMP_0 ( unsigned bit[1:0] a_P,
                      unsigned bit[1:0] b_P,
                      unsigned bit[0:0] ci_P,
                      unsigned bit[6:0] *CONNECTOUT )
{

//Local Variable Declarations for Original Port
unsigned bit[1:0] a;
unsigned bit[1:0] b;
unsigned bit[0:0] ci;
unsigned bit[1:0] z;
unsigned bit[0:0] co;

//Local Variable Declarations for Assign Statement
unsigned bit[0:0] n11, n12, n17, n20, n15, n24, n25, n26;
unsigned bit[0:0] n22, n28, n29, n30, n31, n21;
```

ASSIGN STATEMENT STAGE TABLE (STAGE 0)  — 409A

| ltindex | tbindex | stage |
|---|---|---|
| 6 | 1 | 0 |
| 7 | 2 | 0 |
| 11 | 6 | 0 |
| 15 | 10 | 0 |
| 16 | 11 | 0 |
| 18 | 13 | 0 |
| 19 | 14 | 0 |
| 20 | 15 | 0 |
| 21 | 16 | 0 |
| 23 | 18 | 0 |
| 25 | 20 | 0 |
| 26 | 21 | 0 |
| 27 | 22 | 0 |
| 28 | 23 | 0 |

LOGICAL STRUCTURE TABLE (FINAL VERSION) — 401

| ltindex | tbindex | dist | attribute | depth | source size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | 15 | 1 | 14 | NULL | ... | NULL | NULL |
| 6 | 1 | n11 | wire | 1 | 1 | 2 | NULL | ... | NULL | NULL |
| 7 | 2 | n12 | wire | 1 | 1 | 4 | NULL | ... | NULL | NULL |

Declare local variable if attribute is "wire."

LOCAL VARIABLE DECLARATION (wire)

FIG. 69

INTERFACE TABLE 413

| stindex | input_size | input[0] | input[1] | input[2] | input[3] | input[4] | input[5] | input[6] | ... | output_size |
|---|---|---|---|---|---|---|---|---|---|---|
| 0 | 0 | | | | | | | | | 7 |
| 1 | 7 | 7 | 6 | 16 | 11 | 15 | 23 | 28 | | 6 |
| 2 | 6 | 15 | 8 | 9 | 28 | 13 | 17 | | | 4 |
| 3 | 4 | 10 | 32 | 13 | 17 | | | | | 0 |
| 4 | 0 | | | | | | | | | 0 |

| ltindex | dst | attribute | depth | source_size | source[0] | source[1] | ... | source[14] | source[15] |
|---|---|---|---|---|---|---|---|---|---|
| 0 | a[0] | input | NULL | 0 | NULL | NULL | ... | NULL | NULL |
| 1 | a[1] | input | NULL | 0 | NULL | NULL | ... | NULL | NULL |
| 2 | b[0] | input | NULL | 0 | NULL | NULL | ... | NULL | NULL |
| 3 | b[1] | input | NULL | 0 | NULL | NULL | ... | NULL | NULL |
| 4 | ci | input | NULL | 0 | NULL | NULL | ... | NULL | NULL |
| 5 | co | wire | 0 | 1 | 14 | NULL | ... | NULL | NULL |
| 6 | n11 | wire | 1 | 1 | 2 | NULL | ... | NULL | NULL |
| 7 | n12 | wire | 2 | 8 | 14 | 17 | ... | NULL | NULL |
| 8 | n13 | wire | 3 | 2 | 7 | 17 | ... | NULL | NULL |

401

Select record indicated by input_ltindex.

Declare local variable if attribute is "wire."

415B

//Local Variable Declarations for Assign Statement
unsigned bit[0:0] n13, n14, n19, n27, n23;
//Local Variable Declarations for Interface
unsigned bit[0:0] n12, n11, n15, n17, n20, n28, n21;

LOCAL VARIABLE DECLARATION (FOR PASS-BY-VALUE OF INPUT INTERFACE)

LOCAL VARIABLE DECRATION (FOR PASS-BY-VALUE OF OUTPUT INTERFACE)

FIG. 71

INTERFACE TABLE 413

| stindex | input[0] | input[1] | input[2] | input[3] | input[4] | input[5] | input[6] | ... | output size | output[0] |
|---|---|---|---|---|---|---|---|---|---|---|
| 0 | 7 | 6 | 16 | 11 | 15 | 23 | 28 | | 7 | 7 |
| 1 | 15 | 8 | 9 | 28 | 13 | 17 | | | 6 | 15 |
| 2 | | | 13 | 17 | | | | | 4 | 10 |
| 3 | | | | | | | | | 0 | |
| 4 | | | | | | | | | 0 | |

Value of input_size is 0.

INPUT TABLE (PORT FORMAT) 403A

| portname | bitsize |
|---|---|
| a | 2 |
| b | 2 |
| ci | 1 |

415A:
```
//Local Variable Declarations for Temprary Output
unsigned bit[6:0] TMP_CONNECTOUT;

//Assign Port Interface
a = a_P;
b = b_P;
ci = ci_P;
```

INPUT INTERFACE CONNECTION PROCESSING (1ST STAGE)

INPUT INTERFACE CONNECTION PROCESSING (INTERMEDIATE TO LAST STAGES)

ASSIGN STATEMENT OUTPUT PROCESSING

FIG. 74

INTERFACE TABLE 413

| stindex | input_size | input[0] | input[1] | input[2] | input[3] | input[4] | input[5] | input[6] | ... | output_size | output[0] |
|---|---|---|---|---|---|---|---|---|---|---|---|
| 0 | 0 | | | | | | | | | 7 | 7 |
| 1 | 7 | 7 | 6 | 16 | 11 | 15 | 23 | 28 | | 6 | 15 |
| 2 | 6 | 15 | 8 | 9 | 28 | 13 | 17 | | | 4 | 10 |
| 3 | 4 | 10 | 32 | 13 | 17 | | | | | 0 | |
| 4 | 0 | | | | | | | | | 0 | |

Value of output_size is 0.

OUTPUT TABLE (PORT FORMAT) 403C

| portname | bitsize |
|---|---|
| z | 2 |
| co | 1 |

415D
```
//Address Transfer Assign
*z_P = z;
*co_P = co;
```

OUTPUT INTERFACE CONNECTION (LAST STAGE)

FIG. 75

INTERFACE TABLE (413)

| stindex | input_size | ... | output[0] | output[1] | output[2] | output[3] | output[4] | output[5] | output[6] | ... |
|---|---|---|---|---|---|---|---|---|---|---|
| 0 | 0 | | 7 | 6 | 16 | 11 | 15 | 23 | 28 | |
| 1 | 7 | | 15 | 8 | 9 | 28 | 13 | 17 | | |
| 2 | 6 | | 10 | 32 | 13 | 17 | | | | |
| 3 | 4 | | | | | | | | | |
| 4 | 4 | | | | | | | | | |

LOGICAL STRUCTURE TABLE (401)

| ltindex | tbindex | dist | att | source[1] | ... | source[14] | source[15] |
|---|---|---|---|---|---|---|---|
| 0 | NULL | a[0] | input | 0 | ... | NULL | NULL |
| 1 | NULL | a[1] | input | 0 | ... | NULL | NULL |
| 2 | NULL | b[0] | input | 0 | ... | NULL | NULL |
| 3 | NULL | b[1] | input | 0 | ... | NULL | NULL |
| 4 | NULL | ci | input | 0 | ... | NULL | NULL |
| 5 | 0 | co | wire | 15 | ... | NULL | NULL |
| 6 | 1 | n11 | wire | 1 | ... | NULL | NULL |
| 7 | 2 | n12 | wire | 1 | ... | NULL | NULL |

Bit-link and connect dist values of records indicated by output_ltindex of interface table.

415A:
```
//Address Transfer Assign
TMP_CONNECTOUT = n12 @ n11 @ n15 @ n17 @ n20 @ n28 @ n21;
*CONNECTOUT = TMP_CONNECTOUT;
```
Assign bit-linked local variable to pass-by-reference argument.

OUTPUT INTERFACE CONNECTION (1ST TO INTERMEDIATE STAGES)

```
void ADD_NXN_COMP_0 ( unsigned bit[1:0] a_P,
         unsigned bit[1:0] b_P,
         unsigned bit[0:0] ci_P,
         unsigned bit[6:0] *CONNECTOUT )
{

//Local Variable Declarations for Original Port
unsigned bit[1:0] a;
unsigned bit[1:0] b;
unsigned bit[0:0] ci;
unsigned bit[1:0] z;
unsigned bit[0:0] co;

//Local Variable Declarations for Assign Statement
unsigned bit[0:0] n11, n12, n17, n20, n15, n24, n25, n26;
unsigned bit[0:0] n22, n28, n29, n30, n31, n21;

//Local Variable Declarations for Interface

//Local Variable Declarations for Temprary Output
unsigned bit[6:0] TMP_CONNECTOUT;

//Assign Port Interface
a = a_P;
b = b_P;
ci = ci_P;

//Assign Statement
n11 = ~b[0];
n12 = ~ci;
n17 = ~b[1];
n24 = ~a[0];
n29 = ~a[1];
n25 = (~b[0] & ~n24);
n26 = (~a[0] & ~n11);
n30 = (~b[1] & ~n29);
n31 = (~a[1] & ~n17);
n22 = (~n25 & ~n26);
n21 = (~n30 & ~n31);
n20 = ~n21;
n15 = ~n22;
n28 = (~ci & ~n22);

//Address Transfer Assign
TMP_CONNECTOUT = n12 @ n11 @ n15 @ n17 @ n20 @ n28 @ n21;
*CONNECTOUT = TMP_CONNECTOUT;
}
```

SpecC OUTPUT RESULT (1ST STAGE)

```
void ADD_NXN_COMP_1 ( unsigned bit[6:0] CONNECTIN,
          unsigned bit[5:0] *CONNECTOUT )
{

//Local Variable Declarations for Original Port
unsigned bit[1:0] a;
unsigned bit[1:0] b;
unsigned bit[0:0] ci;
unsigned bit[1:0] z;
unsigned bit[0:0] co;

//Local Variable Declarations for Assign Statement
unsigned bit[0:0] n13, n14, n19, n27, n23;

//Local Variable Declarations for Interface
unsigned bit[0:0] n12, n11, n15, n17, n20, n28, n21;

//Local Variable Declarations for Temprary Output
unsigned bit[5:0] TMP_CONNECTOUT;

//Assign Port Interface
  n12 = CONNECTIN[6];
  n11 = CONNECTIN[5];
  n15 = CONNECTIN[4];
  n17 = CONNECTIN[3];
  n20 = CONNECTIN[2];
  n28 = CONNECTIN[1];
  n21 = CONNECTIN[0];

//Assign Statement
  n14 = (~n11 & ~n15);
  n19 = (~n17 & ~n20);
  n27 = (~n12 & ~n15);
  n23 = (~n27 & ~n28);
  z[0] = ~n23;
  n13 = (~n12 & ~z[0]);

//Address Transfer Assign
TMP_CONNECTOUT = n20 @ n13 @ n14 @ n21 @ n19 @ z[0];
*CONNECTOUT = TMP_CONNECTOUT;
}
```

SpecC OUTPUT RESULT (2ND STAGE)

```
void ADD_NXN_COMP_2 ( unsigned bit[5:0] CONNECTIN,
        unsigned bit[3:0] *CONNECTOUT )
{

//Local Variable Declarations for Original Port
unsigned bit[1:0] a;
unsigned bit[1:0] b;
unsigned bit[0:0] ci;
unsigned bit[1:0] z;
unsigned bit[0:0] co;

//Local Variable Declarations for Assign Statement
unsigned bit[0:0] n16, n32, n33, n34;

//Local Variable Declarations for Interface
unsigned bit[0:0] n20, n13, n14, n21, n19;

//Local Variable Declarations for Temprary Output
unsigned bit[3:0] TMP_CONNECTOUT;

//Assign Port Interface
 n20 = CONNECTIN[5];
 n13 = CONNECTIN[4];
 n14 = CONNECTIN[3];
 n21 = CONNECTIN[2];
 n19 = CONNECTIN[1];
 z[0] = CONNECTIN[0];

//Assign Statement
  n16 = (~n13 & ~n14);
  n32 = ~n16;
  n34 = (~n16 & ~n21);
  n33 = (~n20 & ~n32);
  z[1] = (~n33 & ~n34);

//Address Transfer Assign
TMP_CONNECTOUT = n16 @ z[1] @ n19 @ z[0];
*CONNECTOUT = TMP_CONNECTOUT;
}
```

SpecC OUTPUT RESULT (3RD STAGE)

```
void ADD_NXN_COMP_3 ( unsigned bit[3:0] CONNECTIN,
         unsigned bit[1:0] *z_P,
         unsigned bit[0:0] *co_P )
{

//Local Variable Declarations for Original Port
unsigned bit[1:0] a;
unsigned bit[1:0] b;
unsigned bit[0:0] ci;
unsigned bit[1:0] z;
unsigned bit[0:0] co;

//Local Variable Declarations for Assign Statement
unsigned bit[0:0] n18, n10;

//Local Variable Declarations for Interface
unsigned bit[0:0] n16, n19;

//Assign Port Interface
 n16 = CONNECTIN[3];
 z[1] = CONNECTIN[2];
 n19 = CONNECTIN[1];
 z[0] = CONNECTIN[0];

//Assign Statement
 n18 = (~n16 & ~z[1]);
 n10 = (~n18 & ~n19);
 co = ~n10;

//Address Transfer Assign
 *z_P = z;
 *co_P = co;
}
```

SpecC OUTPUT RESULT (LAST STAGE)

FIG. 81

INPUT PORT GENERATION

OUTPUT PORT GENERATION

SIGNAL STATEMENT OUTPUT
(INTERMEDIATE DATA INPUT/OUTPUT PORT)

INTERFACE TABLE 413

| stindex | input_size | input[0] | input[1] | input[2] | input[3] | input[4] | input[5] | input[6] | ... | output_size |
|---|---|---|---|---|---|---|---|---|---|---|
| 0 | 0 | | | | | | | | | 7 |
| 1 | 1 | 7 | 16 | 16 | 11 | 15 | 23 | 28 | | 16 |
| 2 | 6 | 15 | 8 | 9 | 28 | 13 | 17 | | | 4 |
| 3 | 4 | 10 | 32 | 13 | 17 | | | | | 0 |
| 4 | 0 | | | | | | | | | 0 |

401

| ltindex | tbindex | dst | attribute | depth | source_size | source[0] | source[1] | ... | source[14] | source[15] |
|---|---|---|---|---|---|---|---|---|---|---|
| 0 | NULL | a[0] | input | 0 | 0 | NULL | NULL | ... | NULL | NULL |
| 1 | NULL | a[1] | input | 0 | 0 | NULL | NULL | ... | NULL | NULL |
| 2 | NULL | b[0] | input | 0 | 0 | NULL | NULL | ... | NULL | NULL |
| 3 | NULL | b[1] | input | 0 | 0 | NULL | NULL | ... | NULL | NULL |
| 4 | NULL | ci | input | 0 | 0 | NULL | NULL | ... | NULL | NULL |
| 5 | 0 | co | wire | 1 | 1 | 14 | NULL | ... | NULL | NULL |
| 6 | 1 | n11 | wire | 1 | 1 | 2 | NULL | ... | NULL | NULL |
| 7 | 2 | n12 | wire | 1 | 1 | 14 | NULL | ... | NULL | NULL |
| 8 | 3 | n13 | wire | 8 | 2 | 7 | 17 | ... | NULL | NULL |

Select record indicated by input_ltindex.

Declare signal statement if attribute is "wire."

```
--Signal Declarations for Interface
signal n12 : std_ulogic;
signal n11 : std_ulogic;
signal n15 : std_ulogic;
signal n17 : std_ulogic;
signal n20 : std_ulogic;
signal n28 : std_ulogic;
```

416B — Declare signal statement of output_size.

SIGNAL STATEMENT DECLARATION (FOR INPUT PORT CONNECTION)

INTERFACE TABLE 413

| stindex | input_size | input[0] | input[1] | input[2] | input[3] | input[4] | input[5] | input[6] | ... | output_size | output[0] |
|---|---|---|---|---|---|---|---|---|---|---|---|
| 0 | 7 | 7 | 6 | 16 | 11 | 15 | 23 | 28 | | 7 | 7 |
| 1 | 6 | 15 | 8 | 9 | 28 | 13 | 17 | | | 6 | 15 |
| 2 | 4 | 10 | 32 | 13 | 17 | | | | | 4 | 10 |
| 3 | 0 | | | | | | | | | 0 | |
| 4 | | | | | | | | | | | |

416A

```
signal n31 : std_ulogic;
signal n21 : std_ulogic;
--Signal Declarations for Interface
--Signal Declarations for Temprary Output
signal TMP_CONNECTOUT : std_ulogic_vector(6 downto 0);
```

SIGNAL STATEMENT DECLARATION (FOR OUTPUT PORT CONNECTION)

FIG. 87

INTERFACE TABLE 413

| stindex | input_size | input[0] | input[1] | input[2] | input[3] | input[4] | input[5] | input[6] | ... | output_size | output[0] |
|---|---|---|---|---|---|---|---|---|---|---|---|
| 0 | 0 | 0 | | | | | | | | 7 | 7 |
| 1 | | 7 | 6 | 16 | 11 | 15 | 23 | 28 | | 6 | 15 |
| 2 | | 15 | 8 | 9 | 28 | 13 | 17 | | | 4 | 10 |
| 3 | | 10 | 23 | 13 | 17 | | | | | 0 | |
| 4 | | | | | | | | | | 0 | |

Value of input_size is 0.

INPUT TABLE (PORT FORMAT) 403A

| portname | bitsize |
|---|---|
| a | 2 |
| b | 2 |
| ci | 1 |

416A

```
--Signal Declarations for Temprary Output
signal TMP_CONNECTOUT : std_ulogic_vector(6 downto 0);

begin
--Assign Port Interface
a <= a_I;
b <= b_I;
ci <= ci_I;
```

INPUT INTERFACE CONNECTION PROCESSING (1ST STAGE)

INPUT INTERFACE CONNECTION PROCESSING (INTERMEDIATE TO LAST STAGES)

ASSIGN STATEMENT OUTPUT PROCESSING

```
library IEEE;
use IEEE.std_logic_1164.all;

entity ADD_NXN_COMP_0 is
  port (
  a_I : in std_ulogic_vector(1 downto 0);
  b_I : in std_ulogic_vector(1 downto 0);
  ci_I : in std_ulogic;
  CONNECTOUT : out std_ulogic_vector(6 downto 0)
    );
end ADD_NXN_COMP_0;

architecture VHDL of ADD_NXN_COMP_0 is

--Signal Declarations for Original Port
 signal a : std_ulogic_vector(1 downto 0);
 signal b : std_ulogic_vector(1 downto 0);
 signal ci : std_ulogic;
 signal z : std_ulogic_vector(1 downto 0);
 signal co : std_ulogic;
--Signal Declarations for Assign Statement
 signal n11 : std_ulogic;
 signal n12 : std_ulogic;
 signal n17 : std_ulogic;
 signal n20 : std_ulogic;
 signal n15 : std_ulogic;
 signal n24 : std_ulogic;
 signal n25 : std_ulogic;
 signal n26 : std_ulogic;
 signal n22 : std_ulogic;
 signal n28 : std_ulogic;
 signal n29 : std_ulogic;
 signal n30 : std_ulogic;
 signal n31 : std_ulogic;
 signal n21 : std_ulogic;
--Signal Declarations for Interface
--Signal Declarations for Temprary Output
 signal TMP_CONNECTOUT : std_ulogic_vector(6 downto 0);

begin
--Assign Port Interface
a <= a_I;
b <= b_I;
ci <= ci_I;

--Assign Statement
n11 <= not b(0);
n12 <= not ci;
n17 <= not b(1);
n24 <= not a(0);
n29 <= not a(1);
n25 <= (not b(0) and not n24);
n26 <= (not a(0) and not n11);
n30 <= (not b(1) and not n29);
n31 <= (not a(1) and not n17);
n22 <= (not n25 and not n26);
n21 <= (not n30 and not n31);
n20 <= not n21;
n15 <= not n22;
n28 <= (not ci and not n22);

--Output Assign Statement
TMP_CONNECTOUT <= n12 & n11 & n15 & n17 & n20 & n28 & n21;
CONNECTOUT <= TMP_CONNECTOUT;

end VHDL;
```

VHDL OUTPUT RESULT (1ST STAGE)

```
library IEEE;
use IEEE.std_logic_1164.all;

entity ADD_NXN_COMP_1 is
  port (
  CONNECTIN : in std_ulogic_vector(6 downto 0);
  CONNECTOUT : out std_ulogic_vector(5 downto 0)
  );
end ADD_NXN_COMP_1;

architecture VHDL of ADD_NXN_COMP_1 is

--Signal Declarations for Original Port
signal a : std_ulogic_vector(1 downto 0);
signal b : std_ulogic_vector(1 downto 0);
signal ci : std_ulogic;
signal z : std_ulogic_vector(1 downto 0);
signal co : std_ulogic;
--Signal Declarations for Assign Statement
signal n13 : std_ulogic;
signal n14 : std_ulogic;
signal n19 : std_ulogic;
signal n27 : std_ulogic;
signal n23 : std_ulogic;
--Signal Declarations for Interface
signal n12 : std_ulogic;
signal n11 : std_ulogic;
signal n15 : std_ulogic;
signal n17 : std_ulogic;
signal n20 : std_ulogic;
signal n28 : std_ulogic;
signal n21 : std_ulogic;
--Signal Declarations for Temprary Output
signal TMP_CONNECTOUT : std_ulogic_vector(5 downto 0);

begin
--Assign Port Interface
n12 <= CONNECTIN(6);
n11 <= CONNECTIN(5);
n15 <= CONNECTIN(4);
n17 <= CONNECTIN(3);
n20 <= CONNECTIN(2);
n28 <= CONNECTIN(1);
n21 <= CONNECTIN(0);

--Assign Statement
n14 <= (not n11 and not n15);
n19 <= (not n17 and not n20);
n27 <= (not n12 and not n15);
n23 <= (not n27 and not n28);
z(0) <= not n23;
n13 <= (not n12 and not z(0));

--Output Assign Statement
TMP_CONNECTOUT <= n20 & n13 & n14 & n21 & n19 & z(0);
CONNECTOUT <= TMP_CONNECTOUT;

end VHDL;
```

VHDL OUTPUT RESULT (2ND STAGE)

```
library IEEE;
use IEEE.std_logic_1164.all;

entity ADD_NXN_COMP_2 is
  port (
  CONNECTIN : in std_ulogic_vector(5 downto 0);
  CONNECTOUT : out std_ulogic_vector(3 downto 0)
   );
end ADD_NXN_COMP_2;

architecture VHDL of ADD_NXN_COMP_2 is

—Signal Declarations for Original Port
 signal a : std_ulogic_vector(1 downto 0);
 signal b : std_ulogic_vector(1 downto 0);
 signal ci : std_ulogic;
 signal z : std_ulogic_vector(1 downto 0);
 signal co : std_ulogic;
—Signal Declarations for Assign Statement
 signal n16 : std_ulogic;
 signal n32 : std_ulogic;
 signal n33 : std_ulogic;
 signal n34 : std_ulogic;
—Signal Declarations for Interface
 signal n20 : std_ulogic;
 signal n13 : std_ulogic;
 signal n14 : std_ulogic;
 signal n21 : std_ulogic;
 signal n19 : std_ulogic;
—Signal Declarations for Temprary Output
 signal  TMP_CONNECTOUT : std_ulogic_vector(3 downto 0);

begin
—Assign Port Interface
 n20 <= CONNECTIN(5);
 n13 <= CONNECTIN(4);
 n14 <= CONNECTIN(3);
 n21 <= CONNECTIN(2);
 n19 <= CONNECTIN(1);
 z(0) <= CONNECTIN(0);

—Assign Statement
 n16 <= (not n13 and not n14);
 n32 <= not n16;
 n34 <= (not n16 and not n21);
 n33 <= (not n20 and not n32);
 z(1) <= (not n33 and not n34);

—Output Assign Statement
 TMP_CONNECTOUT <= n16 & z(1) & n19 & z(0);
 CONNECTOUT <= TMP_CONNECTOUT;

end VHDL;
```

VHDL OUTPUT RESULT (3RD STAGE)

```
library IEEE;
use IEEE.std_logic_1164.all;

entity ADD_NXN_COMP_3 is
  port (
  CONNECTIN : in std_ulogic_vector(3 downto 0);
  z_O : out std_ulogic_vector(1 downto 0);
  co_O : out std_ulogic
     );
end ADD_NXN_COMP_3;

architecture VHDL of ADD_NXN_COMP_3 is

—Signal Declarations for Original Port
 signal a : std_ulogic_vector(1 downto 0);
 signal b : std_ulogic_vector(1 downto 0);
 signal ci : std_ulogic;
 signal z : std_ulogic_vector(1 downto 0);
 signal co : std_ulogic;
—Signal Declarations for Assign Statement
 signal n18 : std_ulogic;
 signal n10 : std_ulogic;
—Signal Declarations for Interface
 signal n16 : std_ulogic;
 signal n19 : std_ulogic;

begin
—Assign Port Interface
n16 <= CONNECTIN(3);
z(1) <= CONNECTIN(2);
n19 <= CONNECTIN(1);
z(0) <= CONNECTIN(0);

—Assign Statement
n18 <= (not n16 and not z(1));
n10 <= (not n18 and not n19);
co <= not n10;

—Output Assign Statement
z_O <= z;
co_O <= co;

end VHDL;
```

VHDL OUTPUT RESULT (LAST STAGE)

COMPUTER PROGRAM PRODUCT, METHOD, AND SYSTEM FOR HARDWARE MODEL CONVERSION

CROSS-REFERENCES TO RELATED APPLICATIONS

This application relates to and claims priority from Japanese Patent Application No. 2005-276646, filed on September 22, the entire disclosure of which is incorporated herein by reference.

BACKGROUND OF THE INVENTION

The present invention relates to a computer program product, method, and system for hardware model conversion.

In recent LSI development, upsizing of LSI circuits is proceeding. The mainstream technique for that purpose is to design a new circuit by using the past circuit designing resources in order to shorten the design period. As a technique for enhancing operation frequency, there is a know method of pipelining the existing circuit designing resources described in JP-A-8-44773. Particularly, in a disk array system equipped with a plurality of disk drives having a RAID (Redundant Arrays of Independent/Inexpensive Disks) configuration, an error correcting circuit with a large number of logic stages is required. Accordingly, pipelining the error correcting circuit is effective in improving performance. Although an HDL (Hardware Description Language) has been the mainstream design language used for LSI design, as the upsizing of LSI circuits proceeds, the HDL is being replaced by a system level description language (such as SpecC or SystemC) that is more abstract than the HDL. JP-A-2004-21841 discloses a technique for inputting an RTL (register transfer level) Verilog HDL source and converting it to a program that can be executed by a computer.

SUMMARY OF THE INVENTION

In order to manually pipeline the existing circuit designing resources, it is necessary to understand circuit algorithms and remodel the existing circuit into a new pipeline circuit. It is difficult to achieve the desired design simply by using the past designing resources without modification. At the same time, in order to manually rewrite, in the system level description language, the existing circuit designing resources described in HDL, it is again necessary to understand circuit algorithms and remodel the existing circuit into a new pipeline circuit. It is difficult to achieve the desired design simply by using the past designing resources without modification. If the existing circuit is remodeled manually, the problem of quality deterioration arises due to the generation of bugs caused by an increase in man-hours required for rewriting and verification.

Therefore, this invention aims to solve the problems described above, and it is an object of the invention to automate the pipelining of the existing circuit and conversion of the hardware description language (HDL) that has been conducted manually. Further objects of the invention will become clear in later embodiment descriptions.

According to an aspect of this invention, in order to achieve the above-described object, a data structure used for processing executed by a computer system to analyze a circuit connection structure of a plurality of mutually connected assign cells is generated. One assign statement described in intermediate data obtained by logic synthesis of an HDL-described circuit is associated with one assign cell. The data structure includes a plurality of records corresponding one-to-one with the assign cells. Each record includes: a data unit for storing a logic depth that indicates the largest number of assign cells aligned on a circuit connection path from an input port of the intermediate data to the assign cell associated with the record; and a pointer for indicating an assign cell to be connected to the assign cell associated with the record.

The computer system for hardware model conversion refers to the above-described data structure and performs model conversion of the HDL-described circuit to a pipeline structure so that the assign cells having the same logic depth will belong to the same pipeline stage.

The computer system can analyze the number of bits for an interface signal line between the respective pipeline stages by utilizing the above-described data structure when the HDL-described circuit is converted to the pipeline structure.

The computer system can perform language conversion of the HDL-described circuit to the system level description language by converting the HDL syntax based on the above-described data structure, and output the converted version of the HDL-described circuit.

This invention can realize automation of the pipelining of the existing circuit and conversion of the hardware description language (HDL) that has conventionally been conducted manually.

BRIEF DESCRIPTION OF THE DRAWINGS

FIG. 4 shows an HDL-described circuit that is a 2-bit full adder described in VHDL.

FIG. 6 is an explanatory diagram of intermediate data that has undergone the logic synthesis processing.

FIG. 9 is an explanatory diagram of an assign statement table according to the embodiment.

FIG. 10A shows a port-format input table; FIG. 10B shows a bit-division-format input table; FIG. 10C shows a port-format output table; and FIG. 10D shows a bit-division-format output table.

FIG. 11 is an explanatory diagram of an assign statement element table according to the embodiment.

FIG. 13 shows a logical structure table record format according to the embodiment.

FIG. 14 is an explanatory diagram of a logical structure table to which input port information is set.

FIG. 15 is an explanatory diagram of the logical structure table after initialization processing.

FIG. 16 is an explanatory diagram illustrating processing for setting source values in the logical structure table.

FIG. 17 is an explanatory diagram illustrating processing for setting source values in the logical structure table.

FIG. 18 is an explanatory diagram illustrating processing for setting source values in the logical structure table.

FIG. 19 is an explanatory diagram of the logical structure table after values are set in source fields for each record.

FIG. 20 is an explanatory diagram of processing for setting a logic depth in the logical structure table.

FIG. 21 is an explanatory diagram of processing for setting the logic depth in the logical structure table.

FIG. 22 is an explanatory diagram of processing for setting the logic depth in the logical structure table.

FIG. 23 is an explanatory diagram of a logical structure table whose greatest logic depth has been determined.

FIG. 26 is an explanatory diagram of the logical structure table.

FIG. 30 shows a user setting file format.

FIG. 34 shows a stage boundary table record format according to the embodiment.

FIG. 35 shows a stage boundary table according to the embodiment.

FIG. 36 is a flowchart illustrating pipeline division processing.

FIG. 37 is an explanatory diagram of an assign statement stage table record format.

FIG. 38 is an explanatory diagram of assign statement stage extraction processing.

FIG. 39 is an explanatory diagram of assign statement stage extraction processing.

FIGS. 40A to 40D are explanatory diagrams of an assign statement stage table.

FIG. 42 is an explanatory diagram of an interface extraction table record format.

FIG. 43 is an explanatory diagram of interface stage extraction processing.

FIG. 44 is an explanatory diagram of the interface stage extraction processing.

FIG. 45 is an explanatory diagram of the interface stage extraction processing.

FIG. 48 is an explanatory diagram of the interface stage extraction processing.

FIG. 49 is an explanatory diagram of the interface stage extraction processing.

FIG. 53 is an explanatory diagram of processing for merging the extracted interfaces.

FIG. 54 is an explanatory diagram of the interface extraction table after the merge processing.

FIG. 55 is an explanatory diagram of an interface table record format.

FIG. 56 is an explanatory diagram of interface generation processing.

FIG. 57 is an explanatory diagram of the interface generation processing.

FIG. 58 is an explanatory diagram of the interface generation processing.

FIG. 59 is an explanatory diagram of the interface generation processing.

FIG. 60 is an explanatory diagram of an interface table.

FIG. 63 is an explanatory diagram of an analysis report.

FIG. 65 is an explanatory diagram of functional argument declaration processing.

FIG. 66 is an explanatory diagram of the functional argument declaration processing.

FIG. 67 is an explanatory diagram of local variable declaration processing.

FIG. 68 is an explanatory diagram of the local variable declaration processing.

FIG. 69 is an explanatory diagram of the local variable declaration processing.

FIG. 71 is an explanatory diagram of input interface connection processing.

FIG. 74 is an explanatory diagram of output interface connection processing.

FIG. 75 is an explanatory diagram of the output interface connection processing.

FIG. 76 is an output example of a SpecC file at the first stage.

FIG. 77 is an output example of a SpecC file at the second stage.

FIG. 78 is an output example of a SpecC file at the third stage.

FIG. 79 is an output example of a SpecC file at the fourth stage.

FIG. 81 is an explanatory diagram of entity section declaration processing.

FIG. 84 is an explanatory diagram of the signal statement declaration processing.

FIG. 85 is an explanatory diagram of the signal statement declaration processing.

FIG. 87 is an explanatory diagram of input interface connection processing.

FIG. 92 is an output example of a VHDL file at the first stage.

FIG. 93 is an output example of a VHDL file at the second stage.

FIG. 94 is an output example of a VHDL file at the third stage.

FIG. 95 is an output example of a VHDL file at the fourth stage.

DETAILED DESCRIPTION OF THE INVENTION

Figure 1:
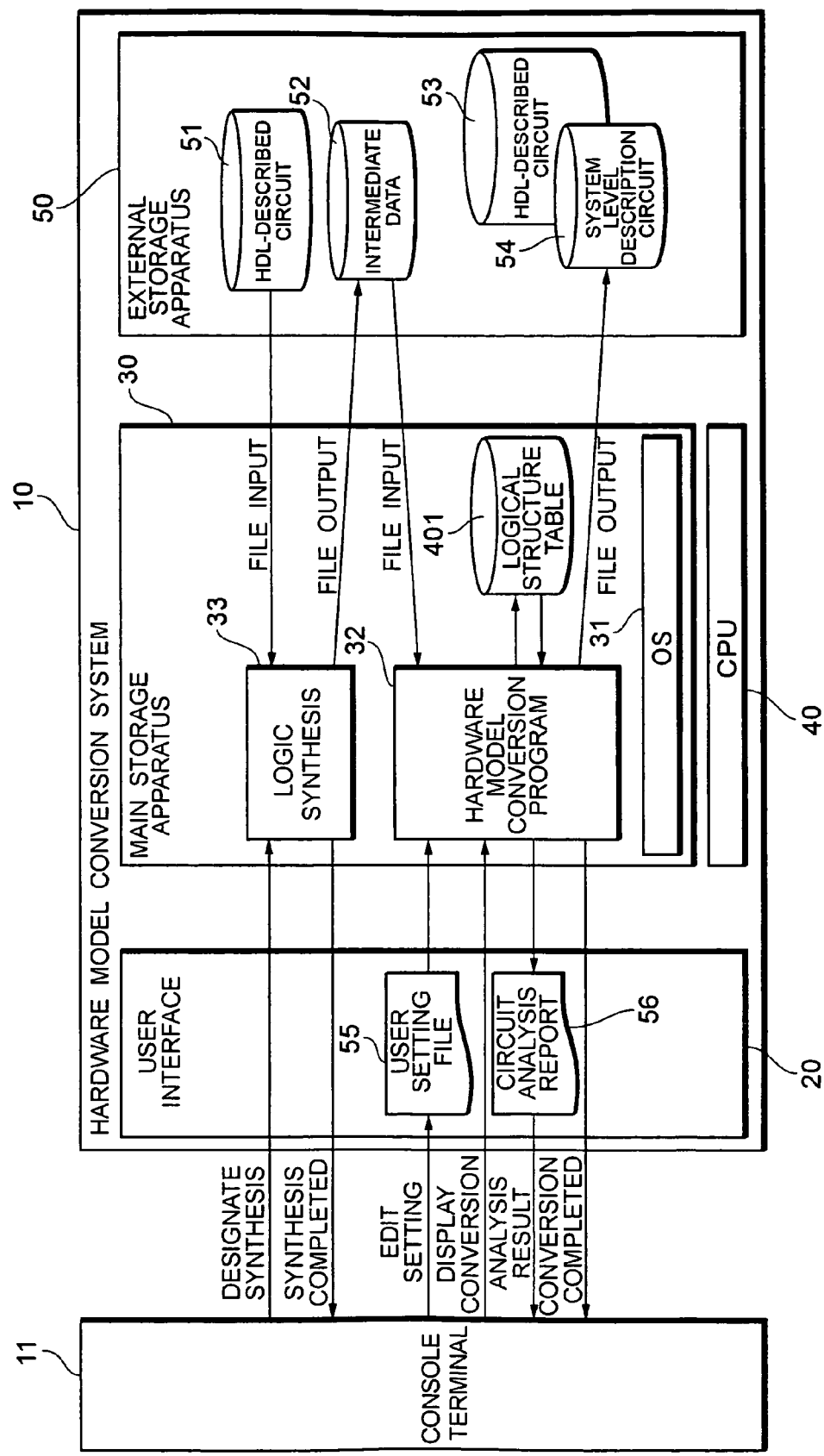
FIG. 1 is a schematic block diagram of a hardware model conversion system according to an embodiment of this invention.

In this embodiment, a logical structure table that shows the circuit connection structure of an HDL-described circuit is created as preprocessing for pipeline division or language conversion of the HDL-described circuit. One assign statement described in intermediate data obtained by logic synthesis of an HDL-described circuit is associated with one assign cell. The data structure table is used for a computer system to analyze the circuit connection structure in which a plurality of assign cells is mutually connected. The data structure table includes a plurality of records corresponding one-to-one with the assign cells. Each record includes: a data unit for storing a logic depth that indicates the largest number of assign cells aligned on a circuit connection path from an input port of the intermediate data to the assign cell associated with the record; and a pointer for indicating an assign cell to be connected to the assign cell associated with the record.

The hardware model conversion system refers to the data structure table and performs model conversion of the HDL-described circuit to a pipeline structure so that the assign cells having the same logic depth will belong to the same pipeline stage. Also, the hardware model conversion system can analyze the bit number of an interface signal line between the respective pipeline stages by utilizing the data structure table when the HDL-described circuit is converted to the pipeline structure. Moreover, the hardware model conversion system can perform language conversion of the HDL-described circuit to the system level description language by converting the HDL syntax based on the data structure table, and output the converted version of the HDL-described circuit.

Main terms used in this specification are described as follows:

"HDL" is a generic term for a programming language for describing electric circuits. Examples of a HDL are VHDL and VerilogHDL.

A "system level description language" is a language that enables description of architectures regardless of hardware or software. Examples of a system level description language include: C language and C++ language; SystemC and SpecC, which are extended versions of the C language for hardware description; and System-Verilog, which is an extended version of VerilogHDL.

A "pipeline" is a hardware configuration that functions as a means for enhancing command processing capability, and where one internal action is divided into a plurality of pipeline stages so that the divided pipeline stages can operate independently. At each pipeline stage, parallel processing can be executed. High-speed processing is made possible by executing a command operation with the divided pipeline stages partly overlapping each other.

A "pipeline stage" is one processing unit of a command operation divided according to the pipeline configuration.

"Latency" means a period of time or the number of cycles required from the start of a command operation to its completion.

A "simultaneous processing statement" is a statement describing processing that operates in parallel in terms of time.

"Serial processing" is processing executed serially from the top of the relevant program.

"Logic synthesis" is a technique to automatically convert RTL (register transfer level) HDL source code into a gate-level netlist.

"Logic depth" means the largest number of assign cells aligned on a circuit connection path from an input port to an arbitrary assign cell.

An embodiment of this invention is described below in detail with reference to the attached drawings. This embodiment does not limit the scope of claims, and not all the characteristics described in this embodiment are indispensable for the achievement of the object of this invention.

FIG. 1 shows the outline configuration of a hardware model conversion system 10 according to an embodiment of this invention. The hardware model conversion system 10 includes a user interface 20, a main storage apparatus 30, a CPU 40, and an external storage apparatus 50. The hardware model conversion system 10 is, for example, a personal computer, a workstation, or a mainframe computer.

The hardware model conversion system 10 is connected to a console terminal 11. The console terminal 11 is an input device such as a keyboard or a mouse. A user gives a logic synthesis instruction, a pipeline division instruction, a language conversion instruction or similar to the hardware model conversion system 10 by either conducting input operation of the console terminal 11 and then editing a user setting file 55, or via the user interface 20. The user interface is, for example, a GUI (Graphical User Interface) displayed on a display unit mounted on the hardware model conversion system 10. The user interface 20 provides the user with an input operation environment for the user setting file 55 and also has the function of displaying an analysis report 56.

The main storage apparatus 30 stores an operating system 31, a hardware model conversion program 32, and a logic synthesis tool 33. Meanwhile, the external storage apparatus 50 stores an HDL-described circuit 51, intermediate data 52, an HDL-described circuit 53, and a system level description circuit 54.

The logic synthesis tool 33 receives a logic synthesis instruction from the user and converts the HDL-described circuit 51 to intermediate data 52. The hardware model conversion program 32 analyzes the circuit connection relationship in the intermediate data 52 and loads this connection relationship as a list structure to a logical structure table 401.

If the pipeline division is designated in the user setting file 55, the hardware model conversion program 32 converts the HDL-described circuit 51 to a pipeline structure.

If the output language is designated in the user setting file 55, the hardware model conversion program 3 converts the remodeled output circuit to the language designated by the user and output the resultant circuit. For example, if the designated output language is HDL, the hardware model conversion program 32 converts the HDL-described circuit 51 described in VHDL to a HDL-described circuit 53 described in Verilog HDL, or converts the HDL-described circuit 51 described in Verilog HDL to a HDL-described circuit 53 described in VHDL. If the designated output language is the system level description language, the hardware model conversion program 32 converts the HDL-described circuit 51 described in VHDL or Verilog HDL to a system level description circuit 54 described in a system level description language (such as SpecC, SystemC or the like).

If the circuit analysis is designated in the user setting file 55, the hardware model conversion program 32 outputs analysis results in the analysis report 56.

The hardware model conversion program 32 may be stored not only in the main storage apparatus 30, but also on a computer-readable recording medium. Preferred examples of the recording medium include: optical recording media (optically data-readable recording media such as CD-RAMs, CD-ROMs, DVD-RWs, DVD-ROMs, DVD-Rs, PD disks, MD disks, or MO disks); magnetic recording media (magnetically data-readable recording media such as flexible disks, magnetic cards, or magnetic tapes); and memory devices (for example, semiconductor memory devices such as DRAMs, or ferroelectric memory devices such as FRAMs).

Figure 2:
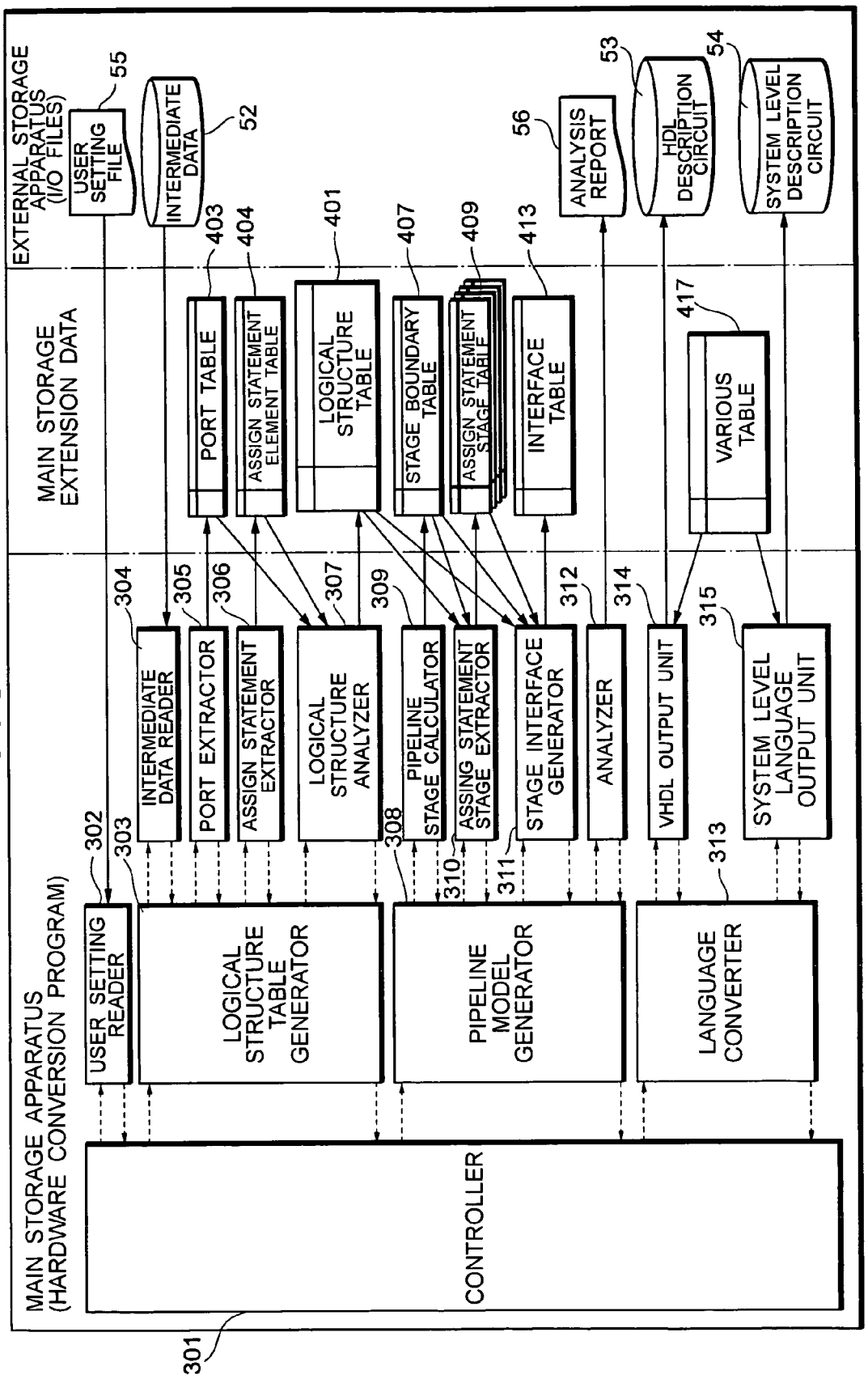
FIG. 2 is a functional block diagram of the hardware model conversion system according to the embodiment.

FIG. 2 is a functional block diagram of the hardware model conversion system 10. This functional block is realized by cooperation between the hardware model conversion program 32 and the CPU 40.

The hardware model conversion program 32 functions as a controller 301, a user setting reader 302, a logical structure table generator 303, an intermediate data reader 304, a port extractor 305, an assign statement extractor 306, a logical structure analyzer 307, a pipeline model generator 308, a pipeline stage calculator 309, an assign statement stage extractor 310, a stage interface generator 311, an analyzer 312, a language converter 313, a VHDL output unit 314, and a C language output unit.

The controller 301 controls the user setting reader 302, the logical structure table generator 303, the pipeline model generator 308, and the language converter 313. The user setting reader 302 reads the user setting file 55.

The logical structure table generator 303 controls the intermediate data reader 304, the port extractor 305, the assign statement extractor 306, and the logical structure analyzer 307, and creates the logical structure table 401 by executing logical structure table generation processing (S12) described later. The intermediate data reader 304 reads the intermediate data 52. The port extractor 305 creates a port table 403. The port table 403 shows an input table 403A, an input table 403B, an output table 403C, and an output table 403D described later. The assign statement extractor 306 creates an assign statement element table 404. The logical structure analyzer 307 creates the logical structure table 401 based on the port table 403 and the assign statement element table 404.

The pipeline model generator 308 controls the pipeline stage calculator 309, the assign statement stage extractor 310, the stage interface extractor 311, and the analyzer 312, and performs pipeline model generation processing by executing pipeline model generation processing (S13) described later. The pipeline stage calculator 309 creates a stage boundary table 407. The assign statement stage extractor 310 creates an assign statement stage table 409 based on the logical structure table 401 and the stage boundary table 407. The assign statement stage table 409 is a general term used to refer to assign statement stage tables 409A to 409D described later. The stage interface generator 311 creates an interface table 413 based on the logical structure table 401, the stage boundary table 407, and the assign statement stage table 409. The analyzer 312 creates the analysis report 56.

The language converter 313 controls the VHDL output unit 314 and the C language output unit 315, and performs language conversion for the output circuit by executing language conversion processing (S14) described later. The VHDL output unit 314 refers to various tables 417 and converts the language of an input circuit into HDL and outputs the HDL-described circuit 53. The various tables 417 is a general term used to refer to the logical structure table 401, the port table 403, the assign statement element table 404, the stage boundary table 407, the assign statement stage table 409, and the interface table 413. The C language output unit 314 refers to the various tables 417 and converts the language of the input circuit to the system level description language and outputs the system level description circuit 54.

Figure 3:
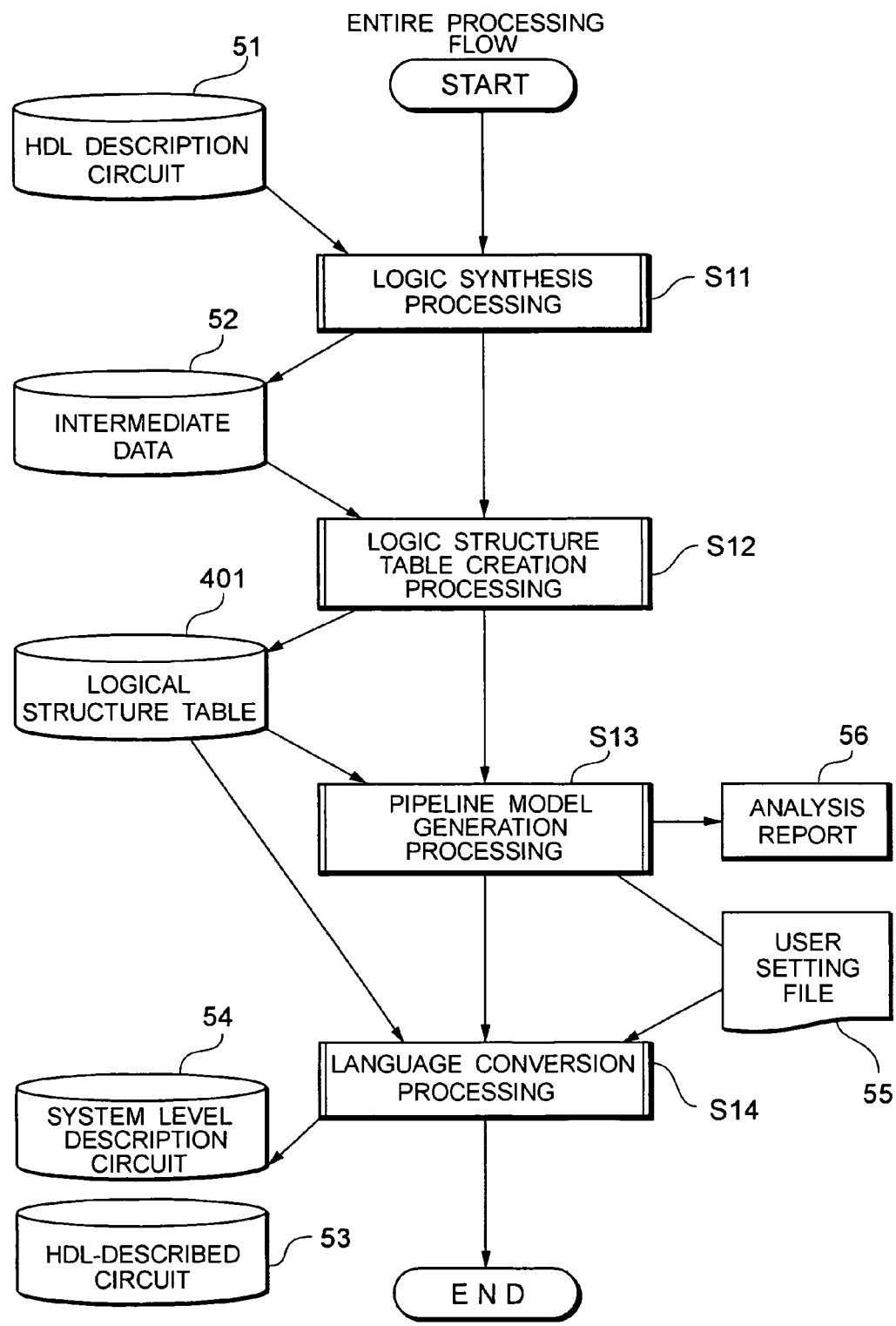
FIG. 3 is the entire processing flow of the hardware model conversion system according to the embodiment.

Now referring to FIG. 3, the entire processing flow for the hardware model conversion method according to this embodiment will be described below.

The HDL-described circuit 51 is input for remodelling. The existing circuit designing resources can be used as the HDL-described circuit 51. In order to use the HDL-described circuit 51 as the input data for remodelling purposes, the HDL-described circuit 51 needs to satisfy the following requirements:

(A) it should be a combinational circuit without a sequential circuit (such as flip-flop or latch);

(B) it should include no inout port;

(C) it may have a hierarchical structure, but its source code should include output of the lowermost function; and (D) it should be described in a way enabling logic synthesis.

The logic synthesis tool 33 receives the information about the HDL-described circuit 51, performs logic synthesis, and outputs the intermediate data 52 described in Verilog HDL (S11). The intermediate data 52 is a Boolean logic circuit. The logic synthesis tool 33 performs the following processing during the logic synthesis:

(1) flattening of the hierarchical structure;

(2) Boolean flattening; and (3) Boolean logic compression.

The hardware model conversion program 32 reads the intermediate data 52 and performs the following processing to create the logical structure table 401 (S12):

(4) extraction of I/O ports and assign statements;

(5) analyzing the port and wire connection relationship and loading this connection relationship as a list structure to the logical structure table 401; and (6) Setting of the logic depth in each record in the logical structure table 401.

The hardware model conversion program 32 reads the logical structure table 401 and outputs, to the analysis report 56, the analysis information that provides an indication for conversion of the HDL-described circuit 51 to the pipeline structure (S13). Referring to the output result of the analysis report 56, the user inputs optimum settings for dividing the HDL-described circuit 51 to the pipeline structure, to the user setting file 55. The hardware model conversion program 32 performs the following processing according to the pipeline division instruction defined in the user setting file 55 (S13):

(7) stage division of the internal circuit based on latency or logic depth;
(8) grouping of assign statements associated with the logical structure table 401; and
(9) generation of interfaces between pipeline stages.

The hardware model conversion program 32 performs the following processing according to the output language instruction (the system level description language or the HDL) defined in the user setting file 55 (S14):

(10) rearrangement from simultaneous processing statements to executable statements that can be processed sequentially; and
(11) conversion to the output language.

The user obtains the output circuit converted to the pipeline structure through the processing sequence from (1) to (11). The output circuit is generated as the HDL-described circuit 53 or the system level description circuit 54 according to the user's language designation.

Next, the hardware model conversion method according to this embodiment will be described in detail with reference to the relevant drawings. For ease of explanation, a 2-bit full adder described in VHDL is used as an example of the HDL-described circuit 51. FIG. 4 shows the HDL-described circuit 51 which is a full adder described in VHDL.

Figure 5:
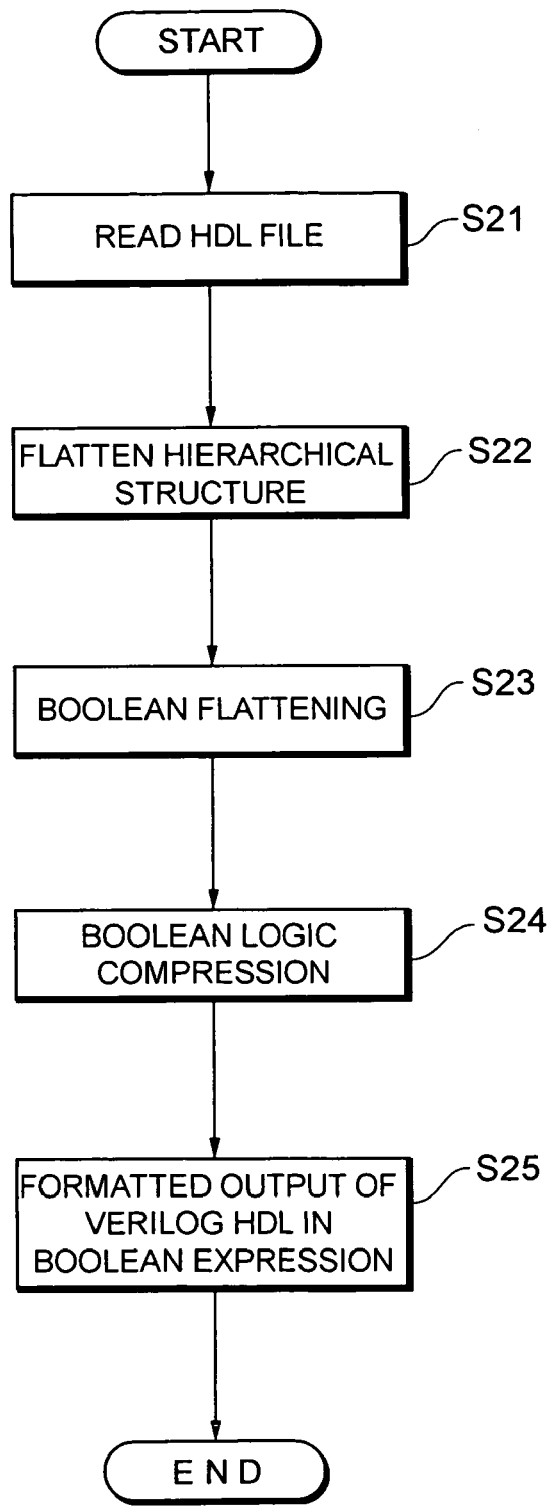
FIG. 5 is a flowchart illustrating a logic synthesis processing flow.

FIG. 5 is a flowchart of the logic synthesis processing (S11). The logic synthesis tool 33 reads the HDL-described circuit 51 (S21) and collects logical expressions in one stage, thereby flattening the hierarchical structure (S22). The logic synthesis tool 33 then flattens the logic level, eliminates intermediate variables, applies the Boolean distributive law, and deletes all the intermediate parentheses (S23). Subsequently, the logic synthesis tool 33 conducts logic compression at a 1-bit Boolean level (S24), and outputs this logically-compressed Boolean expression in the Verilog HDL format (S25), thereby generating the intermediate data 52. The intermediate data 52 is sometimes called an "intermediate Verilog file" as a matter of convenience.

FIG. 6 shows the intermediate data 52. Since the intermediate data 52 is output at the Boolean level of a combinational circuit under the aforementioned requirements (A) to (D), the intermediate data 52 should satisfy the following preconditions:

(E) There are only two attributes for a port declaration section, i.e., "input port" and "output port," and there is no inout port;
(F) In the declaration section, the only attribute used for an internal signal is "wire," and neither "reg" nor "parameter" is used;
(G) The only syntax used in the circuit description section is "assign statements," while "function," "always statement," or "model" are not used; and
(H) All the operations in the circuit description section are only logical operations (or Boolean operations).

Figure 7:
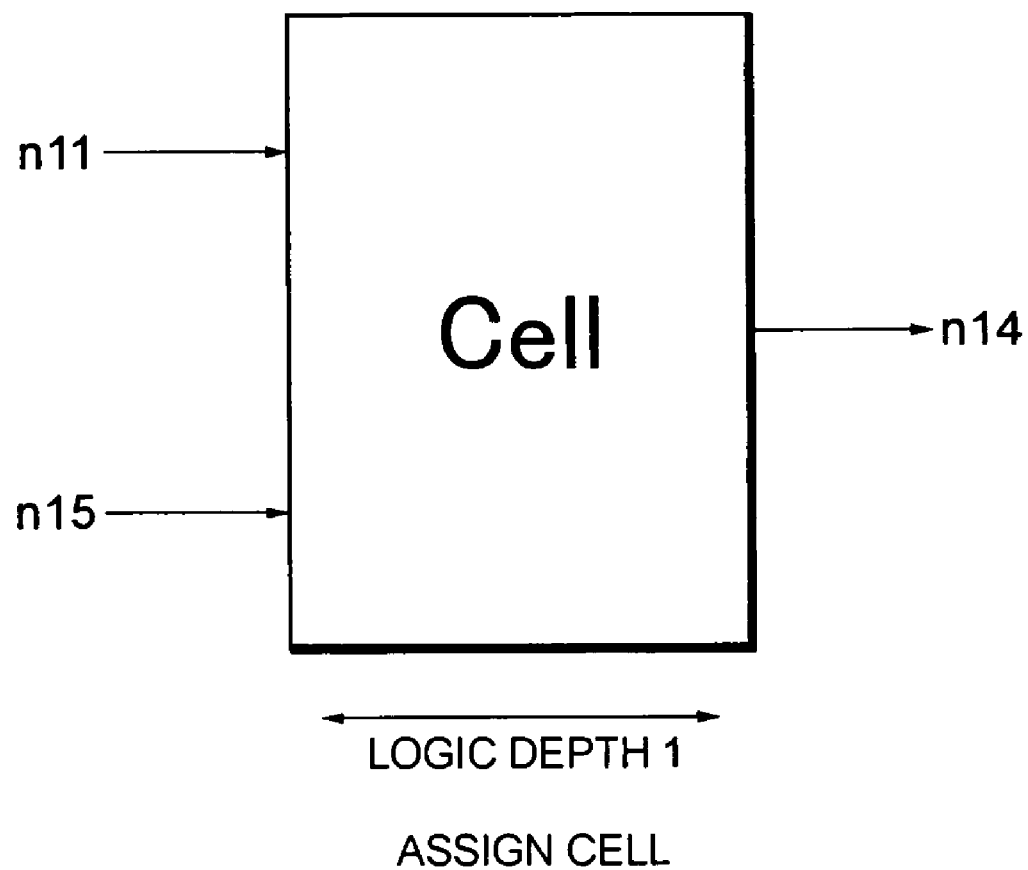
FIG. 7 is an explanatory diagram of an assign cell according to the embodiment.

Assign statements included in the intermediate data 52 will be described below. An assign statement means continuous assignment and is mainly used to define a simple combinational circuit that can be described by a combination of operators. In this embodiment, an assign statement is considered as one circuit cell and this circuit cell is called an "assign cell." For example, a description of "assign n14=( n11&n15)" included in the intermediate data 52 can be replaced by the assign cell shown in FIG. 7. In the intermediate data 52, the left-hand side of an assign statement corresponds to the output of the relevant assign cell, while the right-hand side of the assign statement corresponds to the input for the relevant assign cell. Only one assign cell is assigned to one wire.

Figure 8:
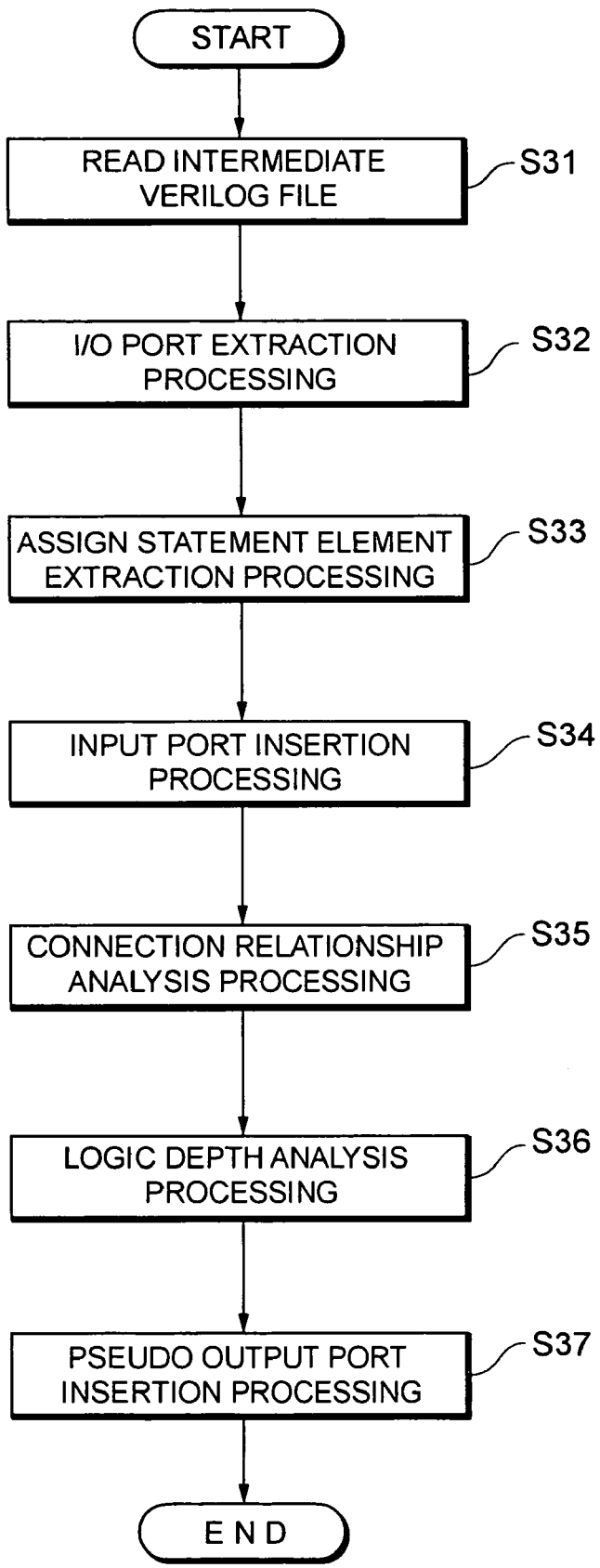
FIG. 8 is a flowchart illustrating logical structure table creation processing according to the embodiment.

FIG. 8 is a flowchart illustrating logical structure table creation processing (S12). The hardware model conversion program 32 sequentially executes processing for reading the intermediate data 52 (S31), I/O port extraction processing (S32), assign statement element extraction processing (S33), input port insertion processing (S34), assign cell connection relationship analysis processing (S35), assign cell logic depth analysis processing (S36), and pseudo output port insertion processing (S37).

Next, the logical structure table creation processing will be described in detail with reference to the relevant drawings. During the intermediate data read processing (S31), the hardware model conversion program 32 reads the intermediate data 52 one line at a time and divides it into an assign statement part and a remaining part. Although the assign statement part may sometimes have a line break in the middle of the statement, internal correction is performed by considering a line-end symbol ";" as a key, dividing the assign statement part at ";" and storing each divided section as one assign statement. The assign statement part extracted from the intermediate data 52 is stored in the assign statement table 402 as shown in FIG. 9.

During the I/O port extraction processing (S32), the hardware model conversion program 32 extracts respective input ports and output ports from the intermediate data 52 and stores them in the tables shown in FIGS. 10A to 10D. FIG. 10A shows a port-format input table 403A. FIG. 10B shows a bit-division-format input table 403B. FIG. 10C shows a port-format output table 403C. FIG. 10D shows a bit-division-format output table 403D. In the input table 403A and the output table 403C, the term "portname" indicates the port name, and the term "bitsize" means the bit length.

During the assign statement element extraction processing (S33), the hardware model conversion program 32 extracts assign statement elements from the assign statement table 402. The assign statement elements are wires that constitute the right-hand and left-hand sides of an assign statement respectively. The extracted assign statement elements are stored in an assign statement element table 404 shown in FIG. 11. The term "tbindex" in this assign statement element table 404 means the assign statement order of appearance, "dist" means the signal name on the left-hand side of the relevant assign statement, "opsize" means the number of signals connected to the relevant assign statement, and "op[0]" to "op[15]" are signal names connected to the right-hand side of the relevant assign statement. If there is no signal connected to the right-hand side of the assign statement, the relevant field of op[0] to op[15] is set to a "NULL" value. There is no limitation on the number of signal names connected to the right-hand side of the assign statement as indicated as op[0] to op[15]. This embodiment is explained assuming that there are 16 signal names.

Figure 12:
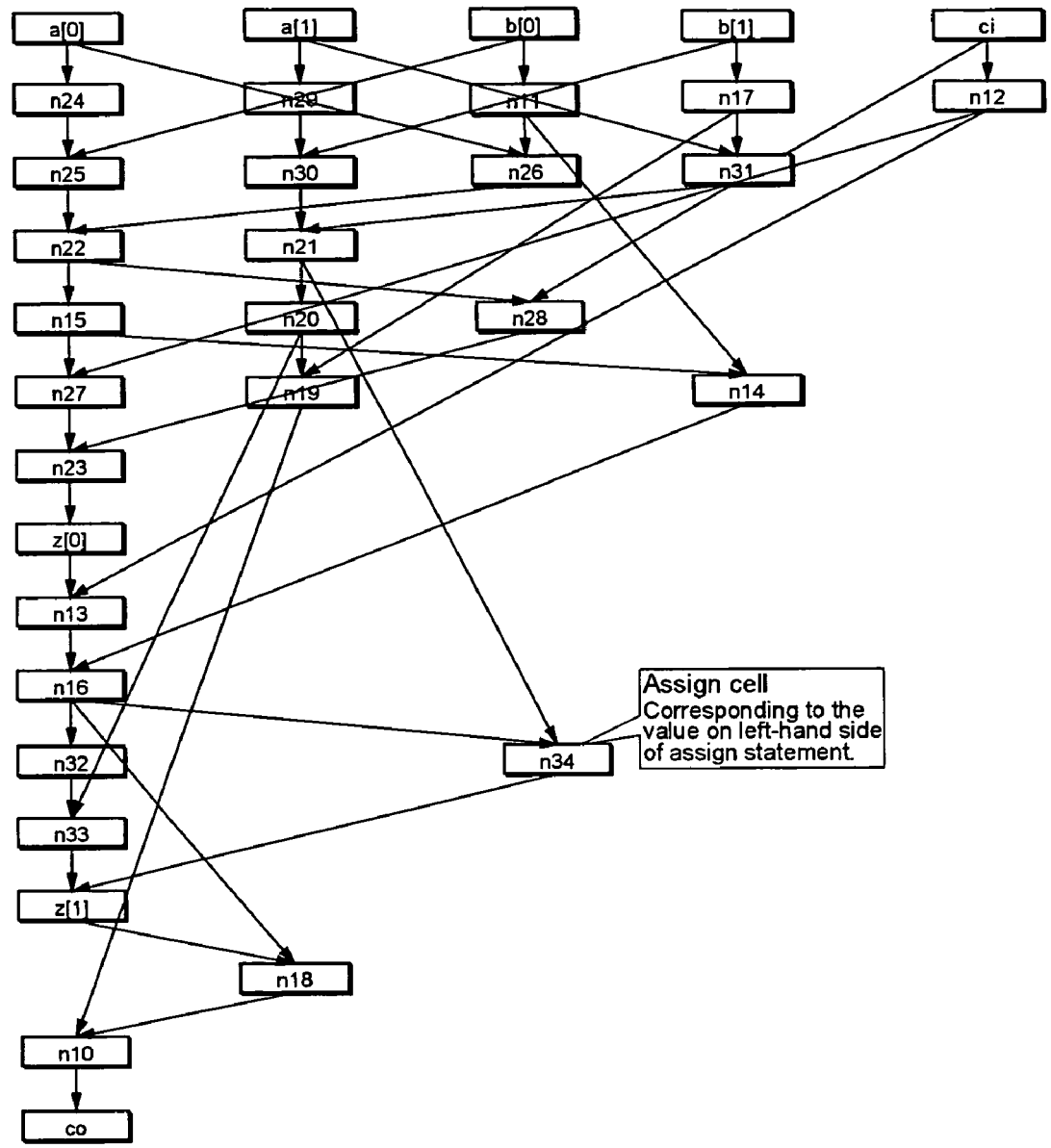
FIG. 12 is an explanatory diagram showing an intermediate data circuit connection according to the embodiment.

It is easy to see that all the wires and ports extracted from the intermediate data 52 are outputted as the "dist" values on the left-side hand of the assign statements, and are connected to the "op" input values, which are the values on the right-hand side of the assign statements. This circuit connection relationship can be expressed as shown in FIG. 12. The aforementioned logical structure table 401 shows an assign cell connection relationship.

FIG. 13 shows a record format 400 that defines the table structure of the logical structure table 401. As shown in FIG. 13, the record format 400 has a table structure for storing Itindex, tbindex, dist, attribute, depth, source_size, and source[0] to source[15]. The term "Itindex" indicates the index number in the logical structure table 401. The term "tbindex" indicates the index number in the assign statement element table 404. The term "dist" indicates the signal name on the left-hand side of an assign statement. The "attribute" indicates signal characteristics of "dist." Examples of the signal characteristics include "input," "output," "wire," and "dmyout." The term "dmyout" is a signal characteristic of a pseudo output port. The term "depth" indicates the logic depth. The term "source_size" indicates the number of signals connected to the right-hand side of the assign statement. The terms "source[0]" to "source[15]" indicate signal names connected to the right-hand side of the assign statement.

During the input port insertion processing (S34), the hardware model conversion program 32 extracts, from the input table 403B, input port information located at the uppermost position of the relevant circuit and stores that information in the logical structure table 401. FIG. 14 shows the logical structure table in which the input port information is stored. Since in the input ports nothing exists on the left-hand side of the assign statements, the "NULL" value is set in the "tbindex" fields. The input port names extracted from the input table 403B are set in the "dist" fields. The term "input" is set in the attribute fields. Since the input ports are located at the uppermost position of the circuit, the "depth" and "source_size" fields are set to "0." Also, the "NULL" value is set in the "source[0]" to "source[15]" fields.

During the connection relationship analysis processing (S35), the hardware model conversion program 32 sets the assign statement part in the logical structure table 401. As initialization processing, the hardware model conversion program 32 sets the information extracted from the assign statement element table 404, in the logical structure table 401. FIG. 15 shows the logical structure table 401 after the initialization processing, by which the assign statement part is set. The "tbindex" field of each record in the logical structure table 401 is set to "tbindex" of each record in the assign statement element table 404. The "dist" field in each record in the logical structure table 401 is set to "dist" in each record in the assign statement element table 404. Since it is not possible to determine at this moment whether the attribute of each record in the logical structure table 401 is "wire" or an output port, the "attribute" fields are tentatively set to "wire" as a default value Subsequently, as preparation before setting the values of the respective "source[0]" to "source[15]" fields of each record of the logical structure table 401, the records of the logical structure table 401 are fetched one by one according to the "Itindex" order of the logical structure table 401 as shown in FIG. 16. Of the records in the assign statement element table 404, reference is made to the records having the same "tbindex" value as the "tbindex" value of the record just fetched from the logical structure table 401.

Then, as shown in FIG. 17, regarding the respective elements of "op[0]" to "op[15]" in the currently-referenced record in the assign statement element table 404, the hardware model conversion program 32 searches each record in the logical structure table 401 for the "dist" field including the same value as that of the relevant value in any of "op[0]" to "op[15]."

If the hardware model conversion program 32 finds the "dist" field in the logical structure table 401 including the same value as that of the relevant record in any of "op[0]" to "op[15]" in the assign statement element table 404, the index number (Itindex) of the record storing the hit "dist" value of the logical structure table 401 is set in the relevant field from "source[0]" to "source[15]" of the record first fetched from the logical structure table 401, and the "source_size" field of that record is then incremented.

The hardware model conversion program 32 can set appropriate values in the respective "source[0]" to "source [15]" fields of each record by executing the above-described processing for all the records in the logical structure table 401. FIG. 19 shows the logical structure table 401 after the appropriate values are set in all the "source[0]" to "source [15]" fields.

During the logic depth analysis processing (S36), the hardware model conversion program 32 sets the "depth" value of each record in the logical structure table 401. First, the "depth" is set to a dummy logic depth "TMP_DEPTH." "TMP_DEPTH=0" is the initial value.

As shown in FIG. 20, the hardware model conversion program 32 fetches each record of the logical structure table 401 according to the "Itindex" order.

Then as shown in FIG. 21, the hardware model conversion program 32 checks the "depth" field of each record having the same value in the "Itindex" field as each relevant value of the "source[0]" to "source[15]" fields of the record fetched from the logical structure table 401.

As shown in FIG. 22, if the "depth" value of a record having the same value in the "Itindex" field as the relevant value of any of the "source[0]" to "source[15]" fields of the record fetched from the logical structure table 401 corresponds to "TMP_DEPTH" of the currently-fetched record, the hardware model conversion program 32 sets the "depth" value of the fetched record to "TMP_DEPTH+1." On the other hand, if no match is found, nothing happens.

This processing is executed according to the "Itindex" order in the logical structure table 401, and the "TMP_DEPTH" value of each record is incremented. This processing is repeated until the logic depths of all the records of the logical structure table 401 are decided. When the "depth" setting of all the records is completed, the then "TMP_DEPTH" value becomes the greatest logic depth.

FIG. 23 shows the logical structure table 401 with a finalized greatest logic depth.

Since the output port is located at the lowermost position in the relevant circuit, the logic depth of the output port should become the greatest logic depth. However, in the logical structure table 401, which has undergone the above-described processing sequence from S31 to S36, the logic depths of some output ports are not the greatest logic depth, but are intermediate logic depths. For example, the greatest logic depth of the logical structure table 401 shown in FIG. 23 is "15," while the logic depth of the output port "z[0]" is "7" and the logic depth of the output port "z[1]" is "12."

Figure 24:
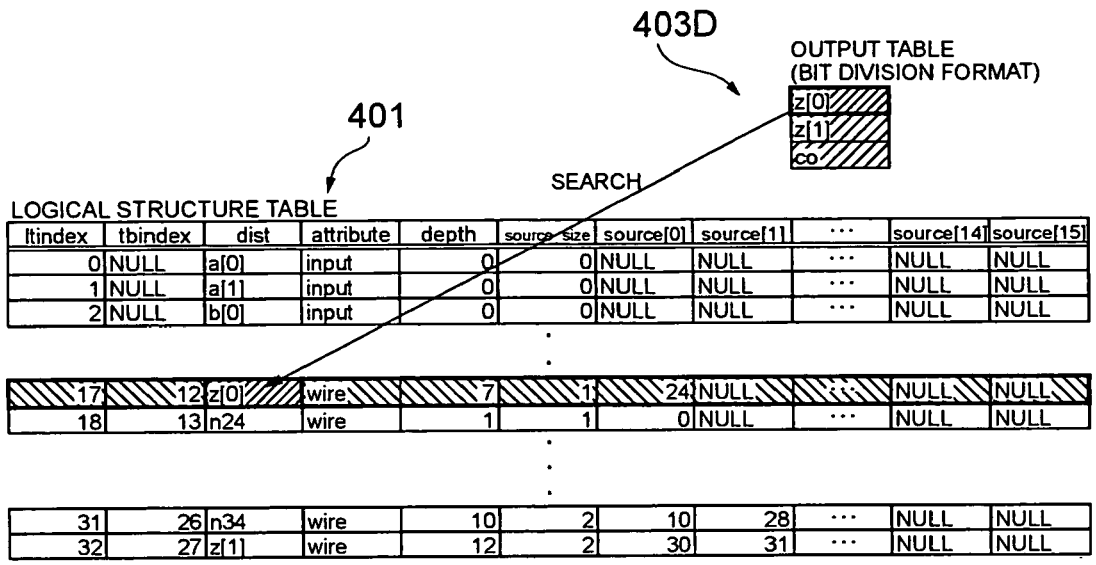
FIG. 24 is an explanatory diagram of processing for inserting records of a pseudo output port into the logical structure table.

In order to correct this situation, the hardware model conversion program 32 inserts pseudo output port records into the logical structure table 401 during the pseudo output port insertion processing (S37). As shown in FIG. 24, the hardware model conversion program 32 refers to the output table 403D and searches the logical structure table 401 for the "dist" field including the same port name as that stored in the output table 403D.

Figure 25:
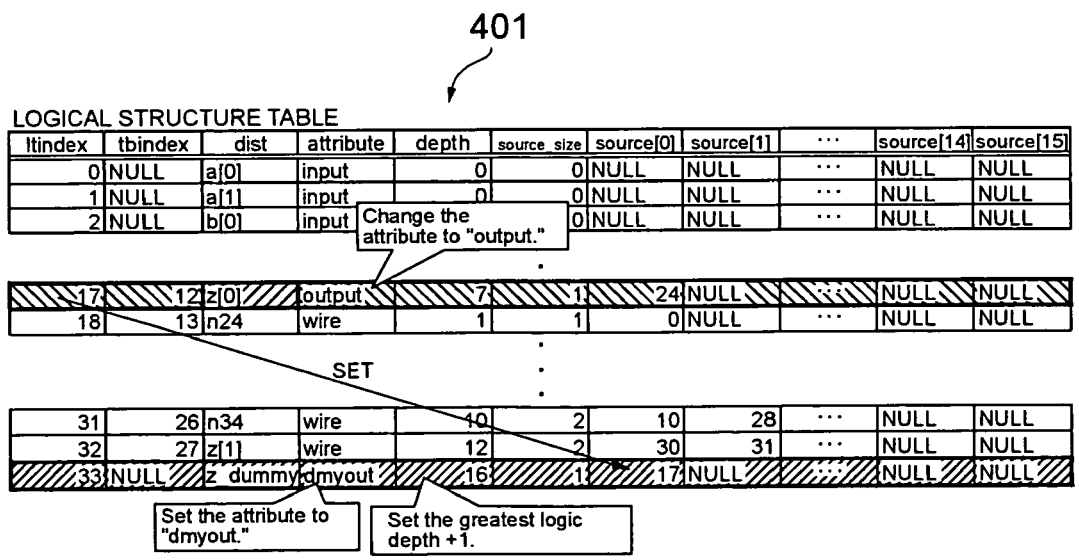
FIG. 25 is an explanatory diagram of processing for inserting records of a pseudo output port into the logical structure table.

When the hardware model conversion 32 finds the record in the logical structure table 40 storing the same "dist" value as the output port name as shown in FIG. 25, it changes the attribute of that record to "output" and inserts the record of the pseudo output port into the end of the logical structure table 401. Since the pseudo output port does not exist in the assign statement element table 404, a "NULL" value is set in the "tbindex" field of the pseudo output port record. The pseudo output port name corresponding to the output port name is set in the "dist" field of the pseudo output port record. The "dmyout" is set in the "attribute" field. The "greatest logic depth +1" is set in the "depth" field. The "Itindex" value of the output port is set in the "source[0]" field. The value "1" is set in the "source_size" field. This processing is executed for the output port.

FIG. 26 shows the logical structure table 401 with the finalized record information for the pseudo output ports.

Figure 27:
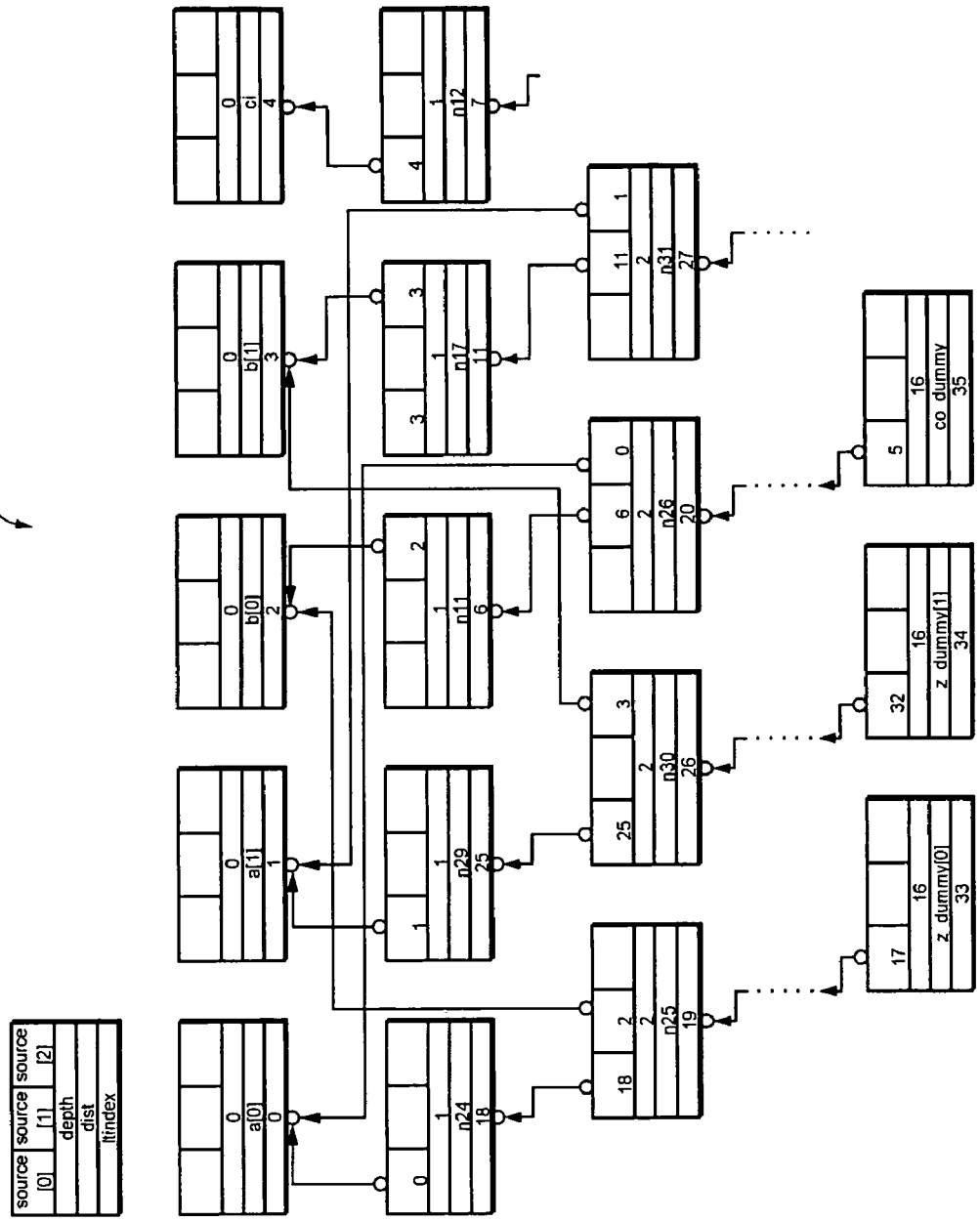
FIG. 27 is an explanatory diagram of a list structure obtained by transforming the logical structure table.

FIG. 27 shows an example in which the logical structure table 401 is transformed to a list structure 405. The records of the list structure 405 store "Itindex," "tbindex," "dist," "attribute," "depth," "source_size," and "source[0]" to "source[15]." The source in each record is a pointer for indicating a record having the same value in its "Itindex" field as the source value. The logical structure table 401 can be considered as a modified list structure in which the respective records are connected according to the connection relationship in the intermediate data 52.

Figure 28:
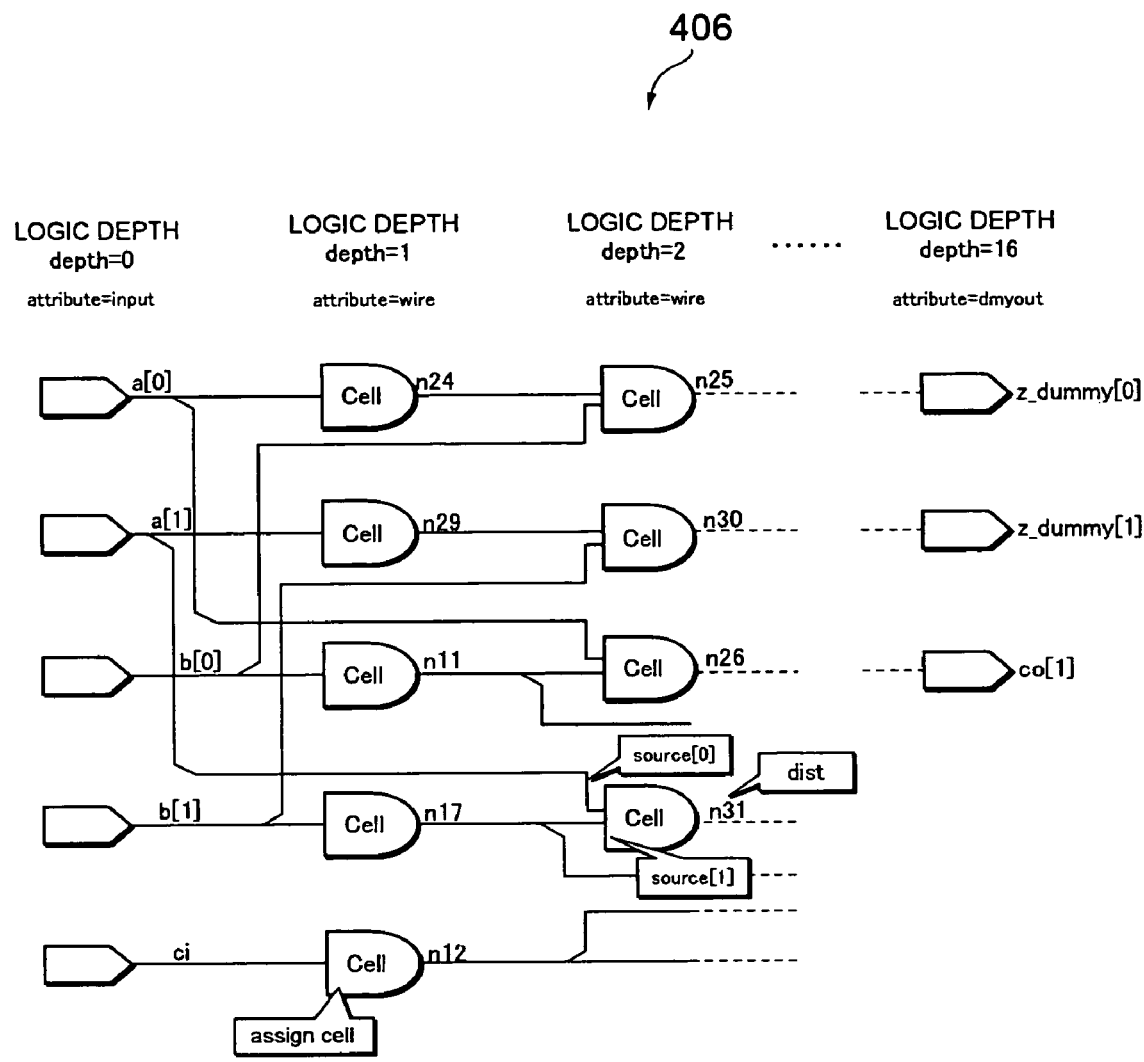
FIG. 28 shows a circuit structure of the logical structure table.

FIG. 28 shows a circuit structure 406 where the assign cell connection relationship of the intermediate data 52 is observed as a circuit diagram. Each record in the logical structure table 401 corresponds one-to-one with a port or cell constituting an assign cell. The "dist" indicates the output signal name of the assign cell. The "source" indicates the input signal name of the port or assign cell. The "depth" indicates the largest number of assign cells aligned along the path from the upper side of the circuit to an arbitrary assign cell. The longest path leading from the input port to the output port is the critical path. The logic depth corresponds to the number of logic stages in a physical circuit structure. However, the logic synthesis tool 33 does not perform mapping at physical gates during the logic synthesis. Therefore, the logic depth does not necessarily correspond one-to-one with the number of logic stages. Since the assign cells having the same logic depth do not have any connection relationship, they can be processed in parallel.

Figure 29:
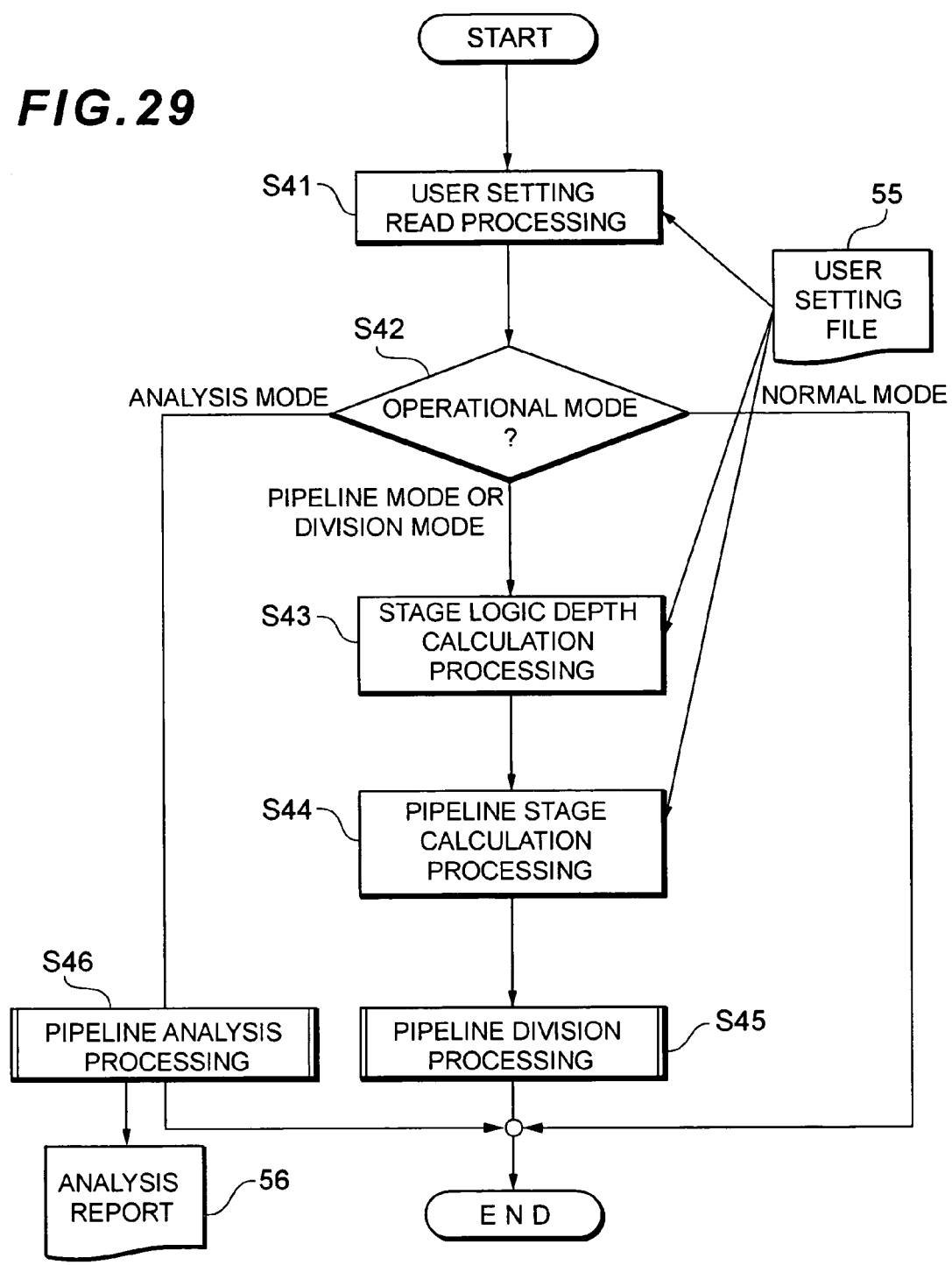
FIG. 29 is a flowchart illustrating pipeline model generation processing.

FIG. 29 is a flowchart illustrating the pipeline model generation processing (S13). The hardware model conversion program 32 reads the user setting file 55 (S41) and checks the operational mode (S42). If the operational mode is a pipeline mode or a division mode, the hardware model conversion program 32 executes stage logic depth calculation processing (S43), pipeline stage calculation processing (S44), and pipeline division processing (S45). On the other hand, if the operational mode is an analysis mode, the hardware model conversion program 32 executes pipeline analysis processing (S46).

Next, the pipeline model generation processing will be described in detail with reference to the relevant drawings. During user setting read processing (S41), the hardware model conversion program 32 reads the user setting file 55 and decides necessary parameters for the pipeline analysis processing or the pipeline division processing.

FIG. 30 shows the format of the user setting file 55. The operational modes defined by "conv_model_mode" are explained as follows:

(1) Normal Mode conv_model_mode=normal

In the normal mode, only language conversion from the HDL description language to the system level language is conducted.

(2) Pipeline Mode conv_model_mode=pipeline

Figure 31:
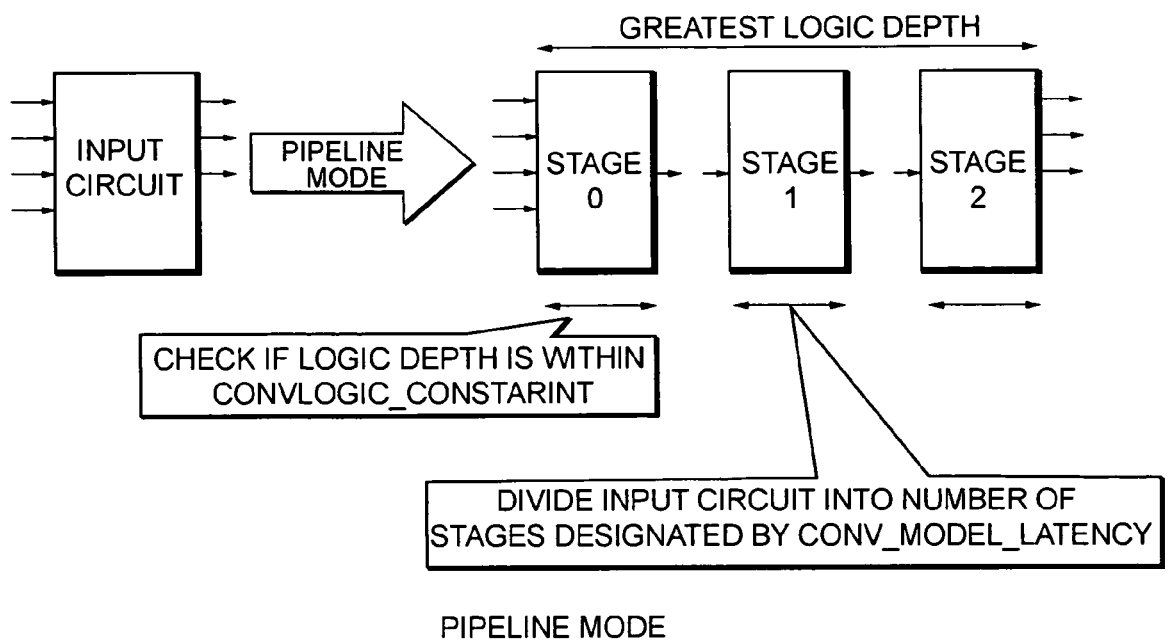
FIG. 31 illustrates the outline of a pipeline mode.

In the pipeline mode, N-stage pipeline division is conducted because of restrictions on "conv_model_latency" and "conv_logic_constraint." FIG. 31 shows the outline of the pipeline mode.

(3) Division Mode conv_model_mode=divide

Figure 32:
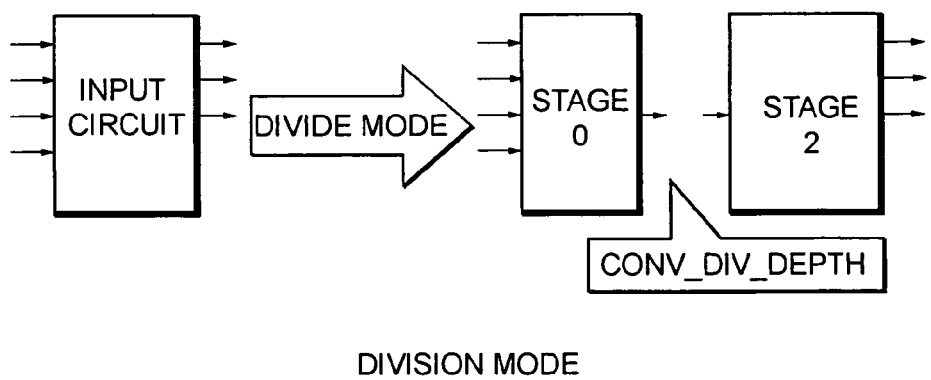
FIG. 32 illustrates the outline of a divide mode.

In the division mode, the number of stage divisions is fixed to "2" and pipeline division is conducted. The logic depth indicating the position at which the circuit should be divided into two stages is designated by "conv_div_depth." FIG. 32 shows the outline of the division mode.

(4) Analysis Mode conv_model_mode=analyze

In the analysis mode, the bit number of each interface signal line between the stages where the input circuit is divided into two stages at a certain logic depth is associated with its logic depth and then output to the analysis report 56.

(5) Output Language Designation conv_model_type=VHDL

An input circuit described in Verilog HDL should be language-converted to and output as a circuit described in VHDL.

conv_model_type=Verilog

An input circuit described in VHDL should be language-converted to and output as a circuit described in Verilog HDL.

conv_model_type=SystemC

An input circuit described in VHDL or Verilog HDL should be language-converted to and output as a circuit described in SystemC.

conv_model_type=SpecC

An input circuit described in VHDL or Verilog HDL should be language-converted to and output as a circuit described in SpecC.

(6) conv_logic_constraint

The variable "conv_logic_constraint" means an upper limit of the greatest logic depth per stage. If the logic depth per stage exceeds "conv_logic_constraint," it will be considered as an error and an error report will be sent to the user. The variable "conv_logic_constraint" is sometimes also called "logic depth restriction."

(7) conv_model_latency

The variable "conv_model_latency" indicates the number of stage divisions. For example, if "conv_model_latency=N" is set, the input circuit will be divided into N stages.

(8) conv_div_depth

The variable "conv_div_depth" indicates the division position, i.e., the logic depth, at which to divide the input circuit into two parts in the division mode.

Figure 33:
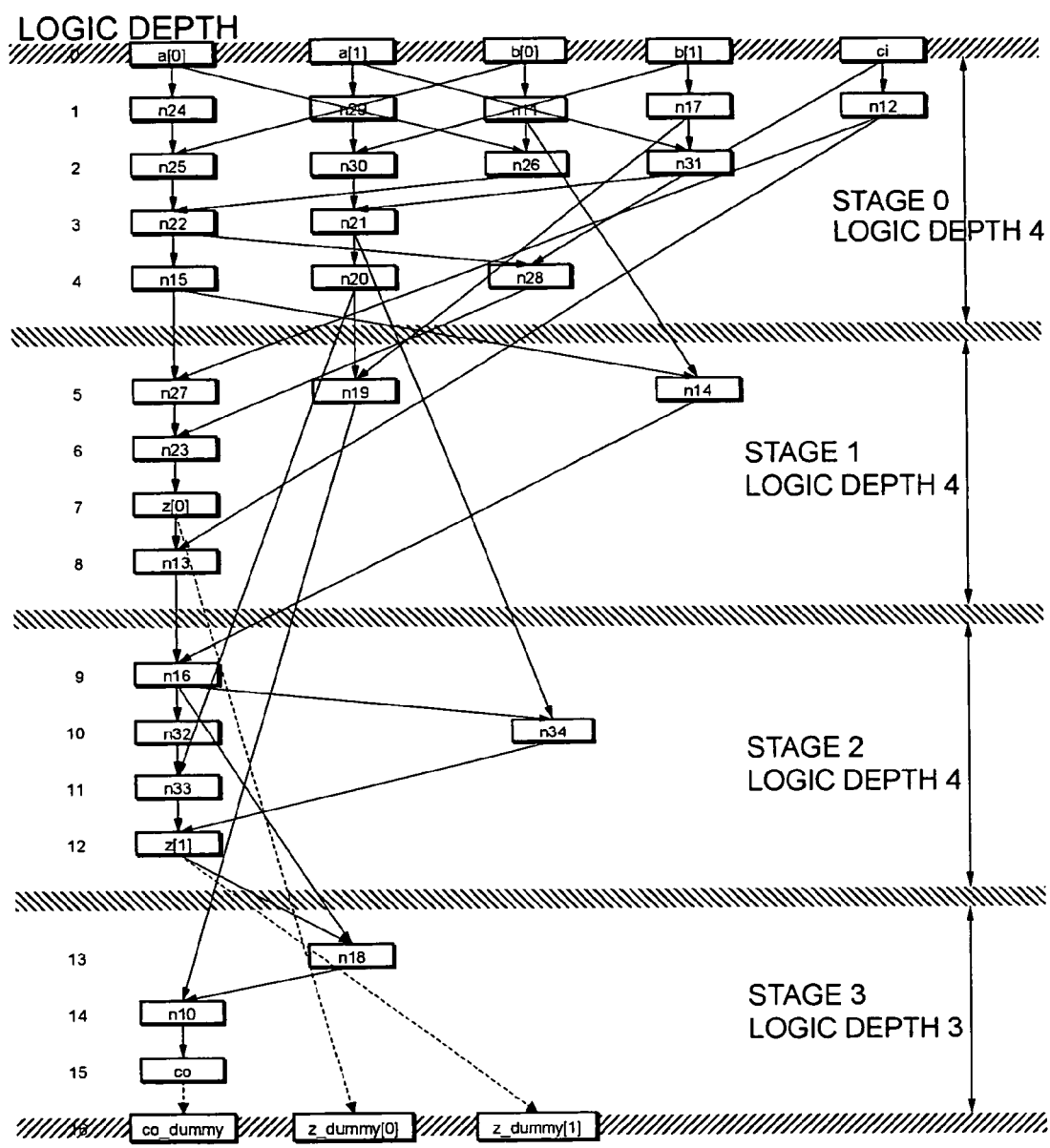
FIG. 33 shows a circuit connection structure after pipeline division.

The hardware model conversion program 32 performs stage division (as shown in FIG. 33) of the circuit structure (as shown in FIG. 12) using the logic depth per stage as a parameter. FIG. 33 shows a circuit connection structure in which pipeline division has been conducted by setting the logic depth per stage to "4."

During the stage logic depth calculation processing (S43), the hardware model conversion program 32 calculates the logic depth per stage when dividing the input circuit into a plurality of stages in the pipeline mode. The hardware model conversion program 32 calculates the logic depth per stage based on the greatest logic depth obtained from the logical structure table 401, using the following formula:

Logic Depth per Stage={(Greatest Logic Depth−2)/
(conv_model_latency)}+1

The part "−2" on the right-hand side of the formula means subtraction of the input port and the pseudo output port. If the logic depth per stage exceeds "conv_logic_constraint, it is considered an error and an error report is made to the user.

During the pipeline stage calculation processing (S44), the hardware model conversion program 32 creates a stage boundary table 407 shown in FIG. 35. The stage boundary table 407 has a record format 408 shown in FIG. 34. In FIG. 34, the term "stindex" indicates a stage number, the term "min" indicates the upper stage boundary, and the term "max" indicates the lower stage boundary.

The values set in each record of the stage boundary table 407 are calculated using the following formulas:

(1) Pipeline Mode

Upper Stage Boundary=(Logic Depth Restriction×
Stage Number)+1

Lower Stage Boundary={Logic Depth Restriction×
(Stage Number)+1}+1

However, if the greatest logic depth of the logical structure table 401 (including the pseudo output port) is smaller than the lower stage boundary, the following formula is used:

Lower Stage Boundary=Greatest Logic Depth

The stage boundary table 407 as shown in FIG. 35 is obtained by calculating the upper stage boundary and the lower stage boundary by applying the above calculation formulas.

Input ports with a logic depth of "0" and pseudo output ports with a greatest logic depth of "16" are not included in the pipeline stages.

(2) Division Mode

In the division mode, the number of divided stages is limited to "2" and the division position is designated according to the "conv_div_depth" value. Accordingly, the values set in each record of the stage boundary table 407 are calculated using the following formulas.

Stage 0:
stindex=0

Upper Stage Boundary=1

Lower Stage Boundary=conv_div_depth+1

Stage 1:
stindex=1

Upper Stage Boundary=conv_div_depth+1

Lower Stage Boundary=Greatest Logic Depth

FIG. 36 is a flowchart illustrating pipeline division processing (S45). The hardware model conversion program 32 executes assign statement stage extraction processing (S51), interface stage extraction processing (S52), extraction interface merge processing (S53), and interface generation processing (S54).

The hardware model conversion program 32 checks which pipeline stage the assign statements belong to, during the assign statement stage extraction processing (S51). In this specification, each table storing the assign statements belonging to the relevant pipeline stage is called an "assign statement stage table."

FIG. 37 shows a record format 410 that defines the table structure of the assign statement stage table. As shown in FIG. 37, the record format 410 has a table structure for storing "Itindex," "tbindex," and "stage." The term "Itindex" indicates the index number (Itindex) of the relevant assign statement in the logical structure table 401. The term "tbindex" indicates the "tbindex" value of the relevant assign statement in the logical structure table 401. The term "stage" indicates the pipeline stage number.

The assign statement stage extraction processing is executed by the following procedures. First, the hardware model conversion program 32 fetches each record in the stage boundary table 407 as shown in FIG. 38. While referring to the logic depth (depth) of the logical structure table 401, the hardware model conversion program 32 searches for records with a logic depth larger than the upper stage boundary (min) of the stage boundary table 407 and smaller than the lower stage boundary (max) of the stage boundary table 407. If a desired record having a logic depth larger than the upper stage boundary (min) and smaller than the lower stage boundary (max) is found in the logical structure table 401, the "tlindex" and "tbindex" values of that record and the "stindex" of the stage boundary table 407 are stored in the assign statement stage table record format 410 as shown in FIG. 39. This processing is repeated for all the pipeline stages, thereby creating the assign statement stage table.

As shown in FIGS. 40A to 40D, the assign statement stage table is prepared for each pipeline stage. FIG. 40A shows an assign statement stage table 409A for pipeline stage "0." FIG. 40B shows an assign statement stage table 409B for pipeline stage "1." FIG. 40C shows an assign statement stage table 409C for pipeline stage "2." FIG. 40D shows an assign statement stage table 409D for pipeline stage "3."

Figure 41:
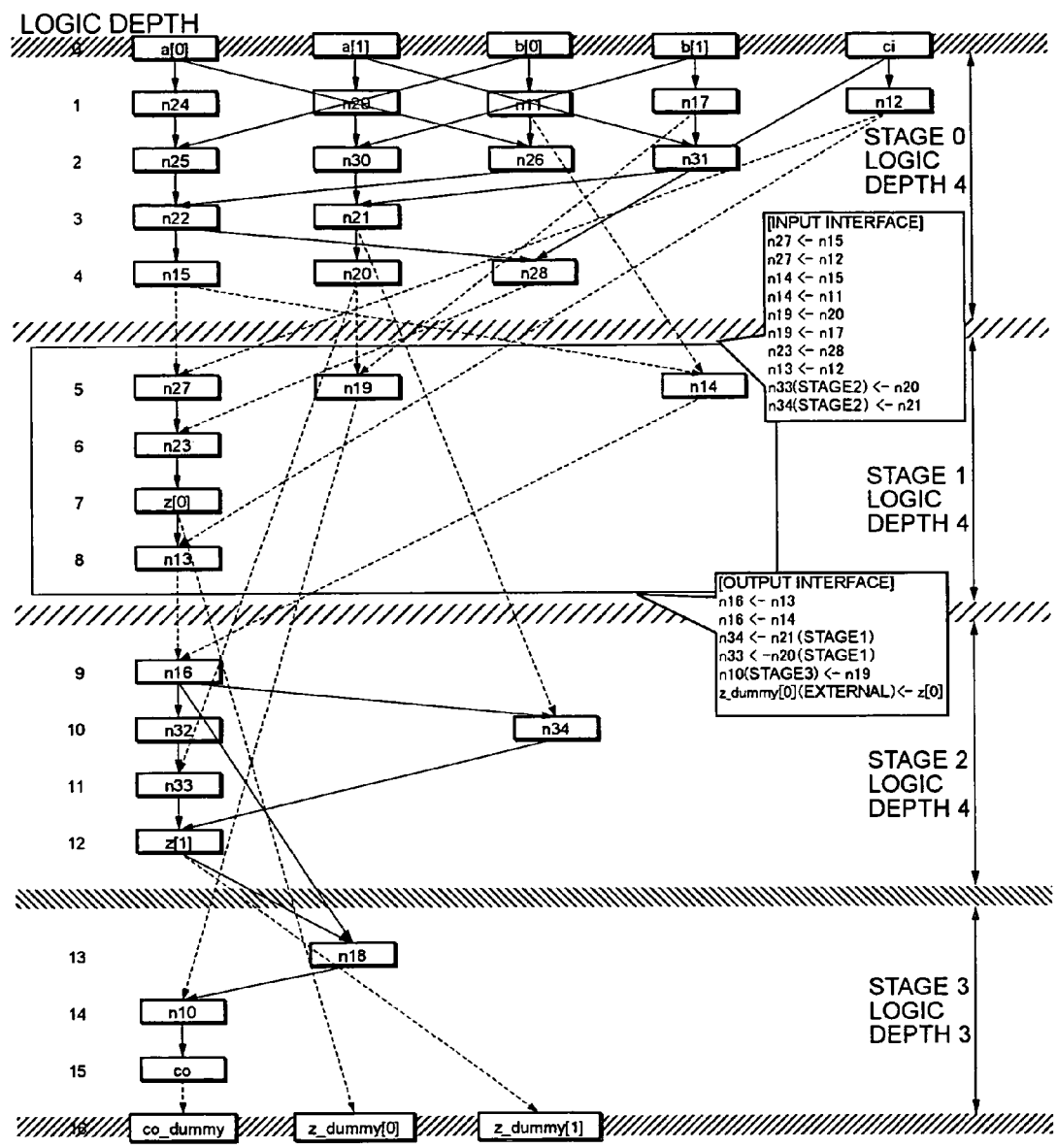
FIG. 41 is an explanatory diagram of an intermediate data circuit.

During the interface stage extraction processing (S52), the hardware model conversion program 32 extracts connections between the assign cells, i.e., the interfaces between the pipeline stages. In the pipeline stage "1", for example, of an intermediate data circuit shown in FIG. 41, it is possible to extract an input interface entering the pipeline stage 1 from the upper side of the pipeline stage 1 and an output interface exiting the pipeline stage 1 toward the lower side of the pipeline stage 1.

However, attention should be paid because of the possibility of an assign cell connection relationship that extends from the upper side of the pipeline stage 1 and passes through and exits the pipeline stage 1 toward the lower side of the pipeline stage 1, or a one-to-many connection relationship that connects a plurality of assign cells located on the upper side of the pipeline stage 1 to the same assign cell in the pipeline stage 1.

If any assign cell exists on the upper side of each pipeline stage to be connected as an input to a certain assign cell in that pipeline stage, the relationship between the assign cell on the upper side and another assign cell in the relevant pipeline stage forms an interface. In this specification, a table storing the connection relationship in this manner is called an "interface extraction table."

FIG. 42 shows a record format 412 that defines the table structure of the interface extraction table. As shown in FIG. 42, the record format 412 has a table structure for storing "Itindex," "dist," "depth," and "find_stage." The term "Itindex" indicates the index number in the logical structure table 401. The term "dist" indicates an assign cell name (dist) stored in the logical structure table 401. The term "depth" indicates the logic depth (depth) stored in the logical structure table 401. The term "find_stage" indicates the pipeline stage number for the stage where an assign cell found to be connected to the assign cell having the assign cell name in the "dist" field exists.

The interface stage extraction processing is executed by the following procedures. First, the hardware model conversion program 32 fetches each record in the stage boundary table 407 in sequence from the upper side of the stage. Then, the hardware model conversion program 32 refers to the assign statement stage table 409B corresponding to the pipeline stage of each fetched record.

As shown in FIG. 44, the hardware model conversion program 32 fetches each record of the assign statement stage table 409B in sequence, and then fetches the record in the logical structure table 401 indicated by "Itindex" of the assign statement stage table 409B. Subsequently, as shown in FIG. 45, the hardware model conversion program 32 selects the records having the same "Itindex" values as the values stored in "source[0]" to "source[15]" of the record currently fetched from the logical structure table 401.

Figure 46:
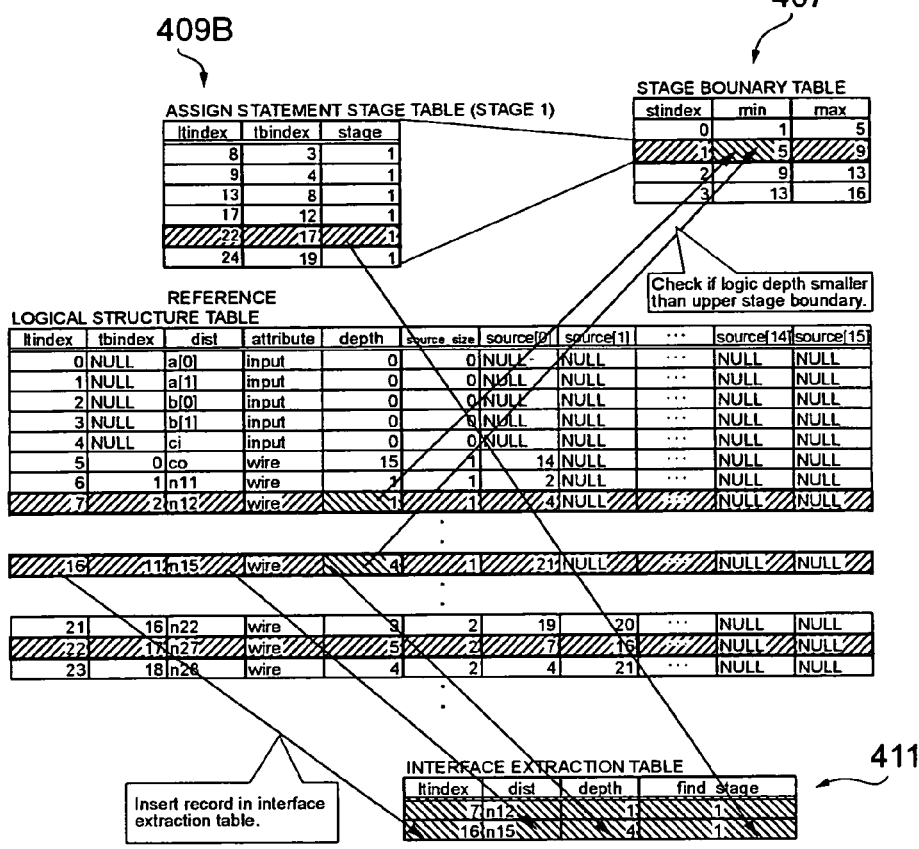
FIG. 46 is an explanatory diagram of the interface stage extraction processing.
Figure 47:
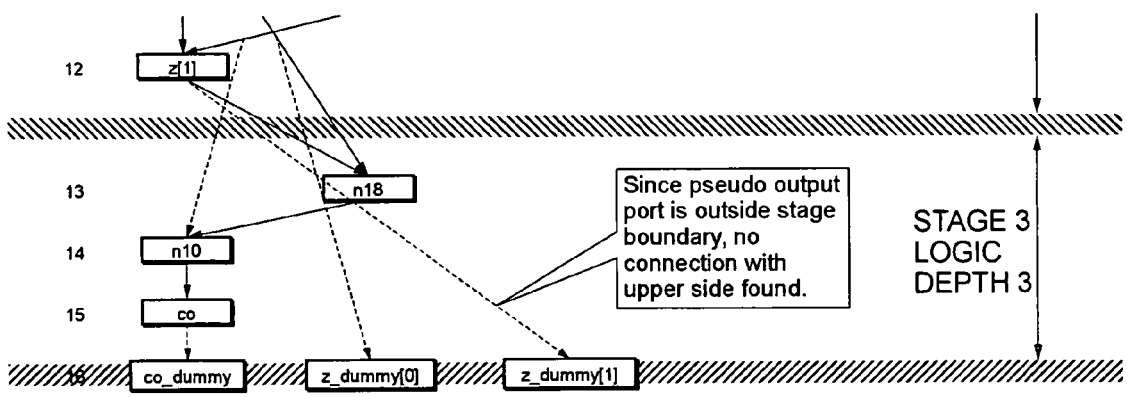
FIG. 47 is an explanatory diagram of the interface stage extraction processing.

Then, as shown in FIG. 46, if the logic depth of the selected record is smaller than the upper stage boundary (min) of the first-fetched stage boundary table 407, the hardware model conversion program 32 stores the "Itindex," "dist," and "depth" values from the logical structure table 401 and the "stage" value of the assign statement stage table 409B, in the "Itindex," "dist," "depth," and "find_stage" fields of each record of the interface extraction table 411. This processing is repeated for all the pipeline stages, thereby creating the interface extraction table 411.

However, an interface between the output ports connected to the pseudo output ports cannot be ascertained just by the above-described processing. This is because the pseudo output ports are outside the pipeline stage boundary and, therefore, the connection to the upper side cannot be seen.

Accordingly, the interfaces connected to the pseudo output ports are extracted in the following manner. As shown in FIG. 48, the hardware model conversion program 32 fetches the record of the last stage in the stage boundary table 407 and selects the records of the pseudo output ports storing the greatest logic depth of the logical structure table 401.

Figures 50, 51:
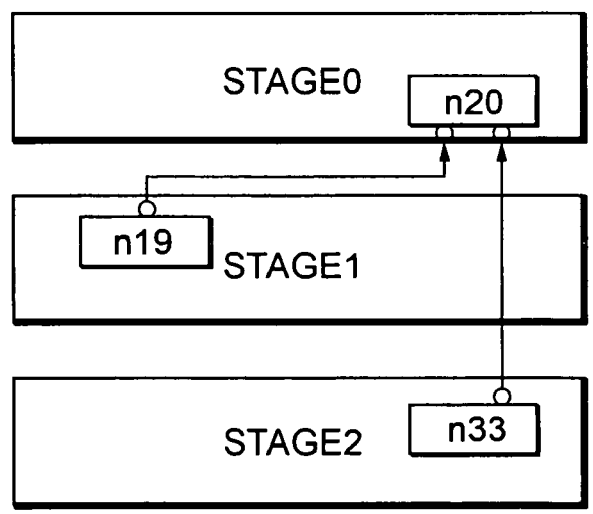
FIG. 50 is an explanatory diagram of an interface extraction table.
FIG. 51 is an explanatory diagram of extracted interfaces.

As shown in FIG. 49, the hardware model conversion program 32 selects, from the logical structure table 401, the records with the same "Itindex" value as the value in "source[0]" to "source[15]" of the record currently fetched from the logical structure table 401. If the logic depth of the selected record is smaller than the upper stage boundary (min) of the stage boundary table 407, the hardware model conversion program 32 stores the "Itindex," "dist," and "depth" values of the selected record of the logical structure table 401, in the "Itindex," "dist," and "depth" fields in the interface extraction table 411. The interface extraction table 411 is completed by executing the above-described processing. FIG. 50 shows the final version of the interface extraction table 411.

Next, the meaning of extraction of interfaces between the pipelines will be described below. The interface extraction table 411 shows from which pipeline stage reference is made to the assign cell specified by "dist" stored in each record in the table 411 (in other words, the table 411 shows which pipeline stage located on the lower side the relevant assign cell is connected to). For example, as shown in FIG. 51, the assign cell n20 belonging to the pipeline stage 0 is connected to the assign cell n19 belonging to the pipeline stage 1 and the assign cell n33 belonging to the pipeline stage 2. The interface extraction table 411 shown in FIG. 50 shows the connection relationship illustrated in FIG. 51.

The interface extraction table 411 at this stage where the interface stage extraction processing (S52) is completed has some overlapping information, for example, where one assign cell is connected to two other assign cells.

In this specification, each pipeline stage is considered as one module and is sometimes called a "pipeline stage module" for ease of explanation. The information in the interface extraction table 411 indicates which lower-side pipeline stage refers to which assign cell. This information can be replaced by I/O interface information from the pipeline stage modules.

Figure 52:
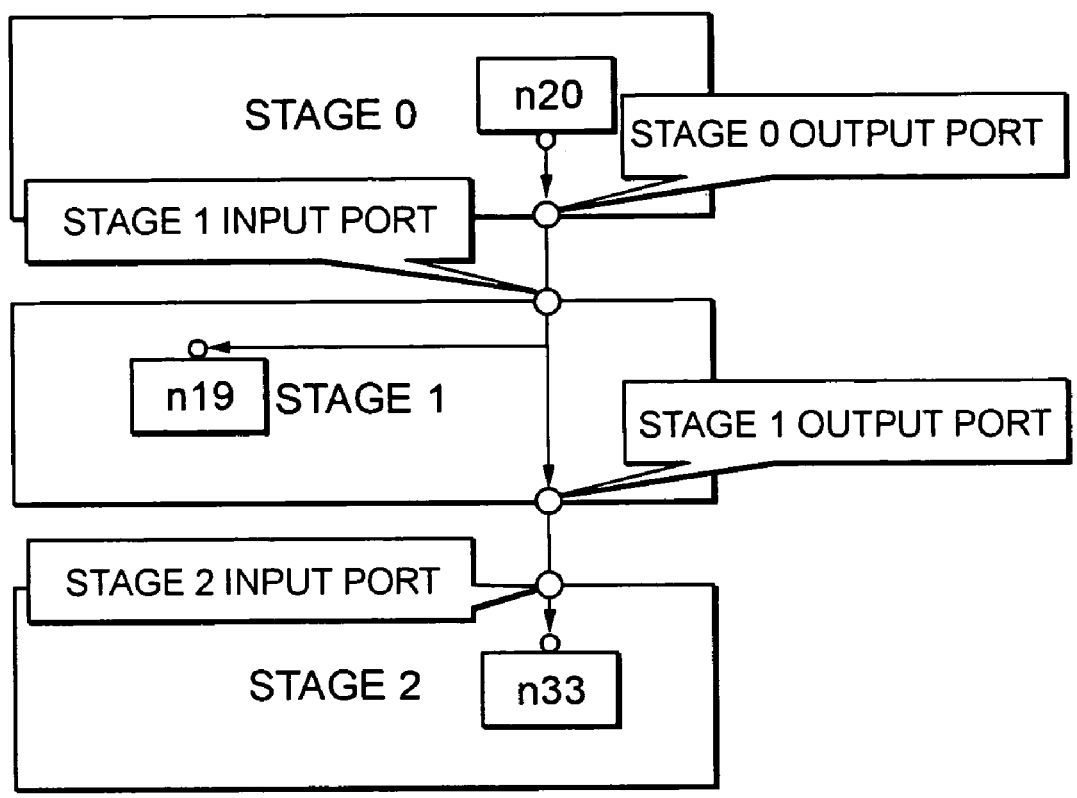
FIG. 52 is an explanatory diagram of interfaces between pipeline modules.

For example, as shown in FIG. 52, the assign cell (n19) of the pipeline stage module 1 and the assign cell (n33) of the pipeline stage module 2 refer to (or are connected to) the assign cell (n20) of the pipeline stage module 0. When the assign cell (n33) refers to the assign cell (n20), it is invariably decided that an output port to connect the assign cell (n20) to the assign cell (n33) should be generated in the pipeline stage module 1.

Therefore, it is understandable that if, according to the interface extraction table 411, the assign cell to which reference is made from the lower-side pipeline stage module and the lowermost pipeline stage module that refers to the above assign cell are found, the interfaces that should be generated between the pipeline stage modules can be decided as a matter of course.

Incidentally, the assign cells referred to from the pipeline stage module 0 are the input ports and, therefore, they cannot be an interface between pipeline line stage modules.

During the merge processing of the extracted interfaces (S53), the hardware model conversion program 32 merges the records of the interface extraction table 411, to which reference is made from a plurality of pipeline stage modules, to the record that refers to the lowermost pipeline stage module.

FIG. 54 shows the interface extraction table 411 after the merge processing.

During the interface generation processing (S54), the hardware model conversion program 32 uses the interface extraction table 411 after the merge processing and generates interface ports between the pipeline stage modules. In this specification, a table storing interface information generated in the interface generation processing is called an "interface table."

FIG. 55 shows a record format 414 that defines the table structure of the interface table. As shown in FIG. 55, the record format 414 has a table structure for storing "stindex," "input_size," "input_Itindex," "output_size," and "output_Itindex." The term "stindex" indicates the number of pipeline stages. The term "input_size" indicates the number of input interfaces. The term "input_Itindex" indicates the index number in the logical structure table 401 for the assign cell that becomes an input interface. The term "output_size" indicates the number of output interfaces. The term "output_Itindex" indicates the index number in the logical structure table 401 for the assign cell that becomes an output interface.

The interface generation processing is executed by the following procedures. As shown in FIG. 56, the hardware model conversion program 32 creates records in the interface table 413, as many as the number of records stored in the stage boundary table 407 plus one. Then, the "input_size" value and the "output_size" value of each record in the interface table 413 are each initialized to "0" and the index number is set in the "stindex" field.

Then, as shown in FIG. 57, the hardware model conversion program 32 checks each record in the interface extraction table 411 and refers to the stage boundary table 407. The hardware model conversion program 32 checks to see which pipeline stage managed on the stage boundary table 407 the logic depth of the record currently fetched from the interface extraction table 411 is included in.

When the pipeline stage including the logic depth of the record currently fetched from the interface extraction table 411 is found, as shown in FIG. 58, the hardware model conversion program 32 copies the "Itindex" value of the record currently fetched from the interface extraction table 411 to the respective "output_Itindex" fields of the records in the interface table 413, in the area from the record in the interface table 413 having the same "stindex" value as the "stindex" value in the stage boundary table 407 that indicates the index number in the above-found pipeline stage, to the record having the same "stindex" value as the "stindex" value that indicates the index number immediately before the pipeline stage indicated in the "find_stage" field of the record currently fetched from the interface extraction table 411. The hardware model conversion program 32 then increments the "output_size" value.

The output interface of a pipeline stage module becomes the input interface of the next pipeline stage module. Therefore, as shown in FIG. 59, the "input_index" field of the record immediately following the record in the interface table 413 in which the "output_Itindex" has been set, is set to the "Itindex" value of the record fetched from the interface extraction table 411. This processing is repeated for all the records in the interface extraction table 411.

FIG. 60 shows the final version of the interface table 413. The "input_Itindex" and "output_Itindex" values of the interface table 413 become the index numbers in the logical structure table 401. Accordingly, it is clear to see which pipeline stage refers to which assign cells.

When performing the pipeline division processing, the user enters the division conditions to the user setting file 55. Moreover, the hardware model conversion program 32 can present, to the user, optimum division conditions based on the analysis report 56. As an example of optimum division conditions, there is a condition that enables reduction of the bit number of an interface signal line between the pipeline stages. Furthermore, the pipeline division may be performed with previously set division conditions.

Figure 61:
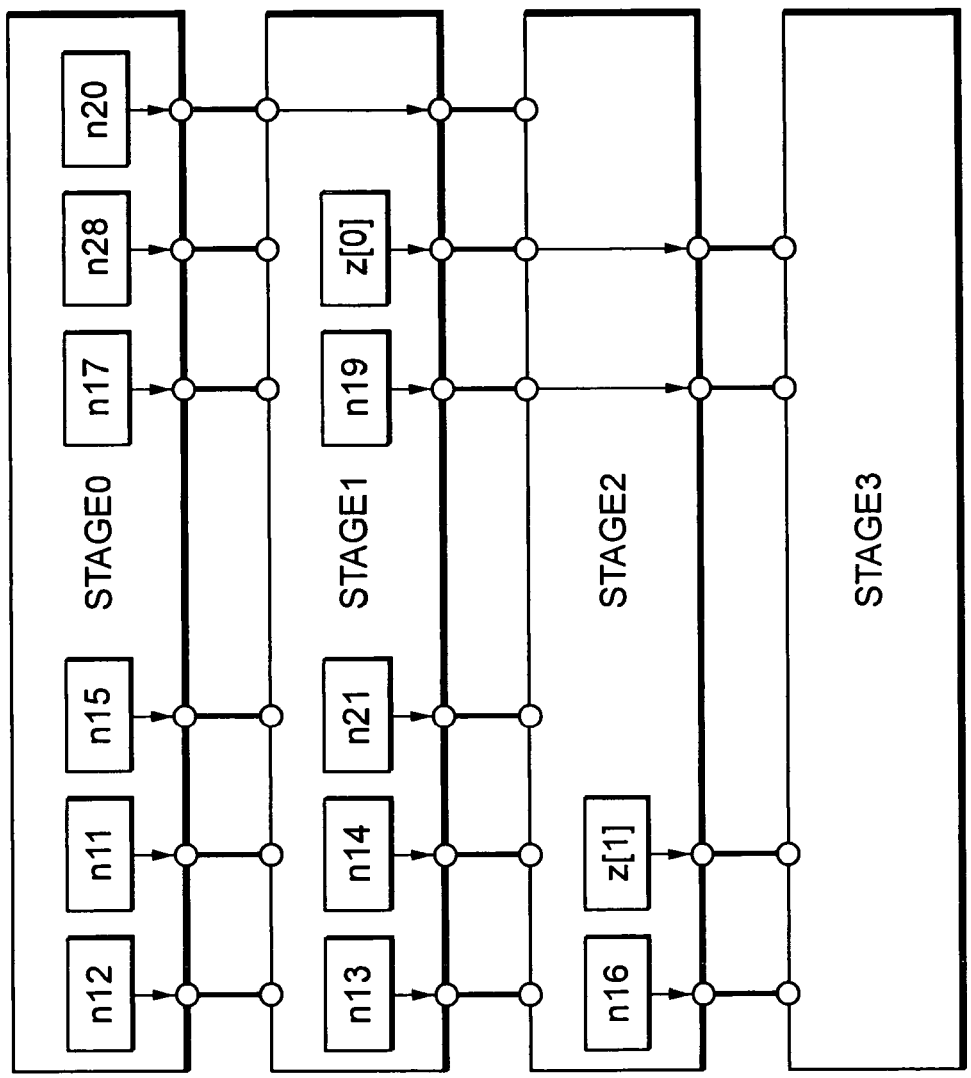
FIG. 61 is an explanatory diagram of pipeline stage module interfaces.

FIG. 61 shows interfaces between the pipeline modules generated by the interface generation processing.

Figure 62:
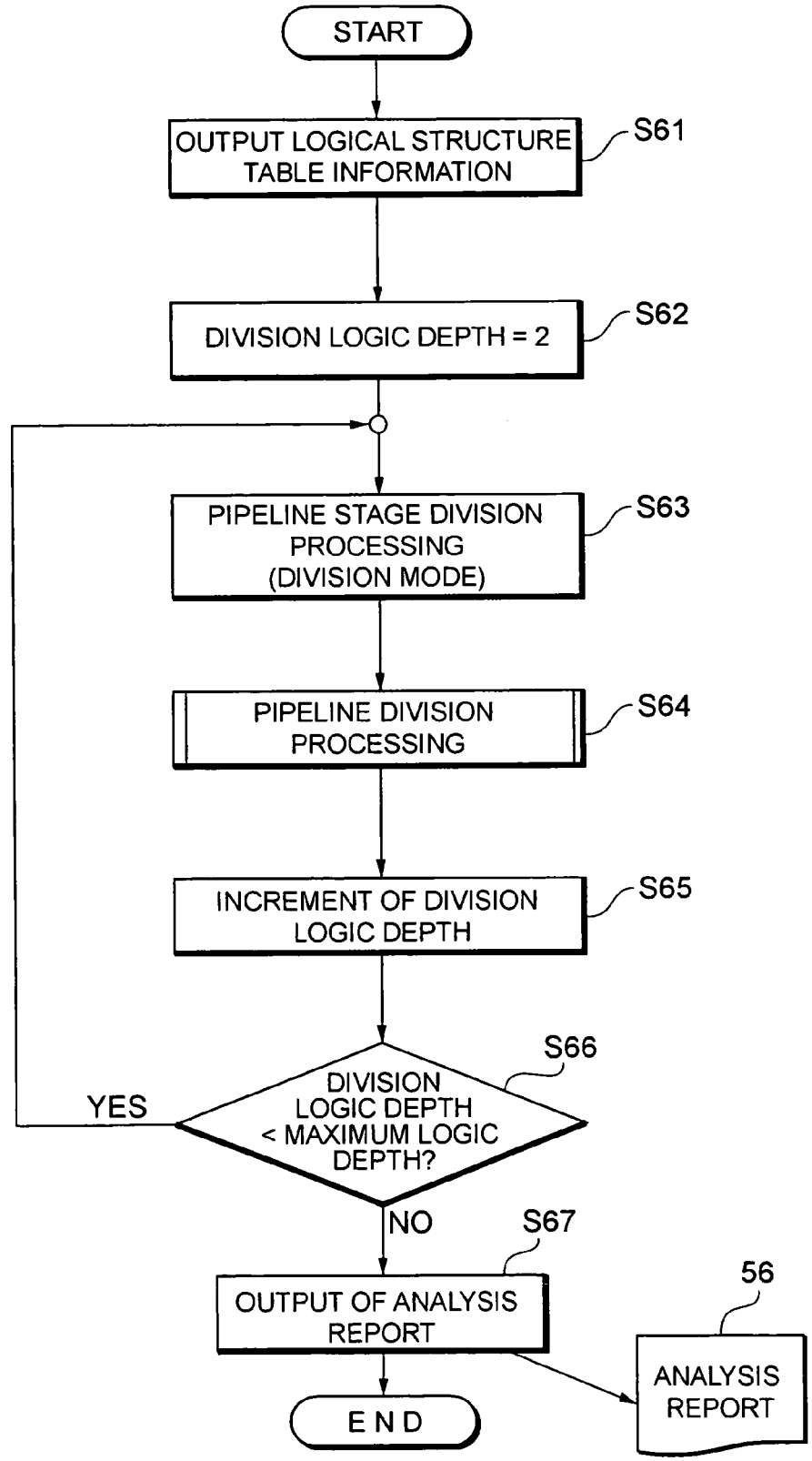
FIG. 62 is a flowchart illustrating pipeline analysis processing.

FIG. 62 is a flowchart illustrating the pipeline analysis processing (S46). The pipeline analysis processing is processing for providing the user with circuit information as a reference to perform the pipeline division. The hardware model conversion program 32 collects the input circuit information obtained from the logical structure table 401 and various restrictive conditions obtained from the user setting file 55 and then outputs the following information (S61):

(1) "greatest logic depth–2" of the logical structure table 401 (excluding the input ports and the pseudo output ports);
(2) "latency number" (value designated by the user) when the pipeline division is conducted;
(3) "greatest logic depth" per pipeline stage when the pipeline division is conducted; and
(4) the critical path.

Next, the hardware model conversion program 32 executes the processing sequence from S62 to S66, thereby calculating the interface bit size when the input circuit is divided into two stages in the division mode.

Specifically speaking, the hardware model conversion program 32 sets the initial logic depth value indicating the division position to "2" (S62), and calculates the logic depth of divided pipeline stages (S63). This processing is similar to the pipeline stage calculation processing at S44.

The hardware model conversion program 32 then executes pipeline division processing (S64). This processing is similar to the pipeline division processing at S45. Through this processing, the interface bit size can be obtained according to the "input_size" or "output_size" value in the interface table 413 when the pipeline division is conducted at the logic depth designated at S63.

Subsequently, the hardware model conversion program 32 increments the logic depth indicating the division position (S65), and checks whether the logic depth indicating the division position is smaller than the greatest logic depth or not (S66). If the logic depth indicating the division position is smaller than the greatest logic depth (S66: YES), the processing returns to S63.

On the other hand, if the logic depth indicating the division position is equal to the greatest logic depth (S66: NO), the hardware model conversion program 32 outputs the analysis report 56 (S67).

FIG. 63 shows an output example of the analysis report 56. In FIG. 63, the term "TOTAL LOGIC DEPTH" indicates the greatest logic depth. The term "STAGE LENGTH" indicates the number of pipeline stages. The term "STAGE LOGIC DEPTH MAX" indicates the logic depth per stage. The term "Critical Path" indicates the longest connection path among the paths from the input ports to the output ports. The part "CUTPOINT |I/F Bit |" indicates the bit number of the interface signal lines between the pipeline stages. The user can set the pipeline division conditions by referring to the analysis report 56 so that the bit number of the interface signal lines between the pipeline stages will be reduced. It is preferable to have a smaller bit number for the interface signal lines between the pipeline stages because the smaller bit number can make the circuit configuration simpler.

Figure 64:
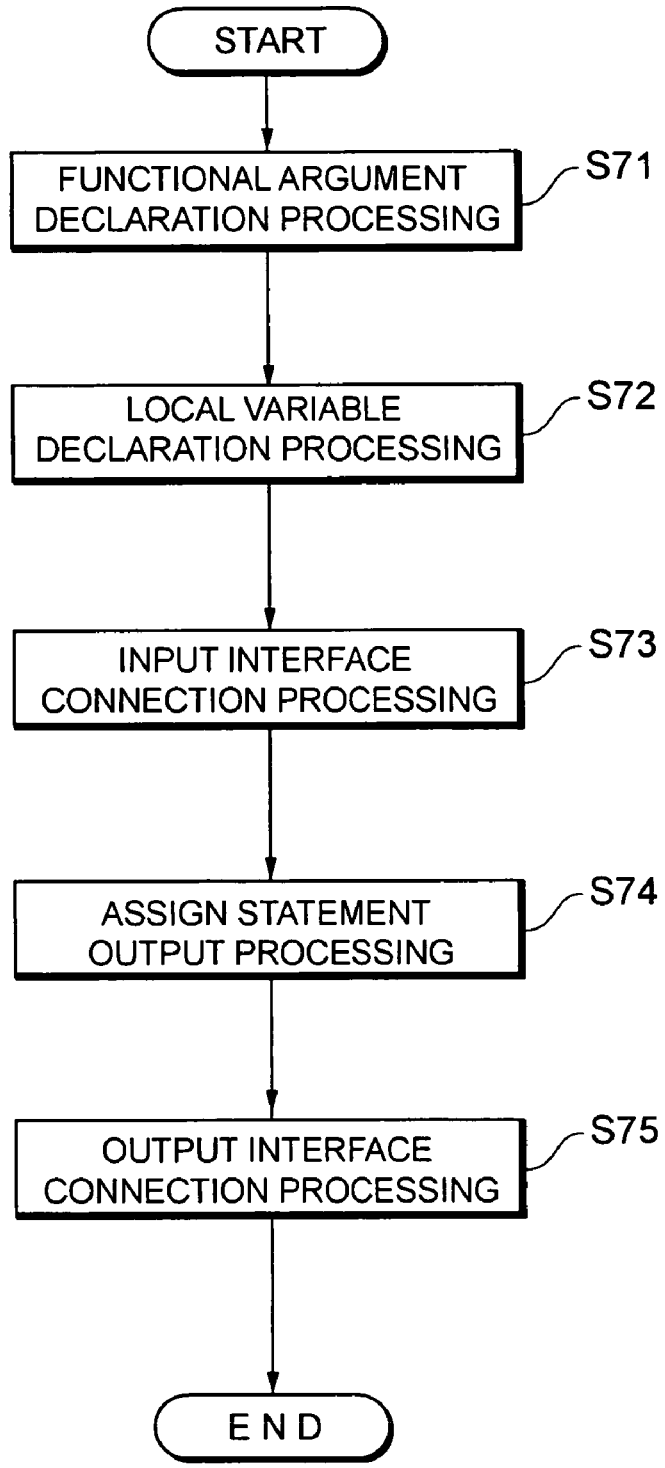
FIG. 64 is a flowchart illustrating language conversion processing.

FIG. 64 is a flowchart illustrating the language conversion processing (S14) using SpecC as the output language. When the hardware model conversion program 32 reads the user setting file 55 edited by the user and finds that "conv_model_type=SpecC" is set as the designation for the output language, it executes functional argument declaration processing (S71), local variable declaration processing (S72), input interface connection processing (S73), assign statement output processing (S74), and output interface connection processing (S74).

By executing the above-described processing sequences, the hardware model conversion program 32 outputs SpecC files 415A to 415D shown in FIGS. 76 to 79. The SpecC file 415A shows the function at the pipeline stage 0 (the first stage). The SpecC file 415B shows the function at the pipeline stage 1 (the second stage). The SpecC file 415C shows the function at the pipeline stage 2 (the third stage). The SpecC file 415D shows the function at the pipeline stage 3 (the last stage).

The functional argument declaration processing (S71) will be described below. In the language conversion processing using SpecC as the output language, the pipeline stage module is considered as one function when performing the language conversion. Specifically speaking, the function is defined by considering the input port as a pass-by-value functional argument, and the output port as a pass-by-reference functional argument. A name corresponding to the circuit name is given as a function name.

As shown in FIG. 65, the hardware model conversion program 32 refers to the interface table 413 in order to define the pass-by-value functional argument as the input port. If the "input_size" of the relevant record of the interface table 413 is "0," the hardware model conversion program 32 acquires the input port name and the bit size from the input table 403A and outputs the corresponding argument to the SpecC file 415A in order to define, in the SpecC file 415A, the pass-by-value functional argument at the pipeline stage 0, i.e., the first stage.

If the "input_size" of the relevant record of the interface table 413 is "1" or more, the hardware model conversion program 32 outputs the pass-by-value argument having a bit size of "input_size" to the SpecC files 415B to 415D in order to define, in the SpecC files 415B to 415D, the pass-by-value functional arguments at the pipeline stages 1 to 3.

As shown in FIG. 66, the hardware model conversion program 32 refers to the interface table 413 in order to define the pass-by-reference functional arguments as the output ports. If the "output_size" of the relevant record in the interface table 413 is "0," the hardware model conversion program 32 acquires the output port name and the bit size from the output table 403C and outputs the corresponding pass-by-reference functional argument to the SpecC file 415D in order to define, in the SpecC file 415D, the pass-by-value functional argument at the pipeline stage 3, i.e., the last stage.

If the "output_size" value of the record of the interface table 413 is "1" or more, the hardware model conversion program 32 outputs the pass-by-reference argument having the bit size of "output_size" to the SpecC files 415A to 415C in order to define the pass-by-value functional argument at the pipeline stages 0 to 2.

During the local variable declaration processing (S72), the hardware model conversion program 32 declares local variables used inside the function. As shown in FIG. 67, the hardware model conversion program 32 outputs the local variables corresponding to the input ports and the output ports of the intermediate data 52, to the SpecC files 415A to 415D based on the port information obtained from the input table 403A and the output table 403C.

Then, the hardware model conversion program 32 defines the logical variables that correspond to "wire" in the intermediate data 52. As shown in FIG. 68, the hardware model conversion program 32 refers to the assign state stage table 409A and the logical structure table 401, and searches the logical structure table 401 for records with the same "Itindex" value as the "Itindex" value of the logical structure table 409A. If the attribute of the found record is "wire," the hardware model conversion program 32 considers that record as a 1-bit-sized local variable and defines it in the SpecC file 415A. Regarding the SpecC files 415B to 415D as well, the hardware model conversion program 32 declares the local variables corresponding to "wire" in the same manner.

Subsequently, the hardware model conversion program 32 declares local variables used for pass-by-value for the input interfaces of the pipeline stages 1 to 3. As shown in FIG. 69, the hardware model conversion program 32 refers to the interface table 413 and the logical structure table 401, and searches the logical structure table 401 for the record having the same "Itindex" value as the "input_Itindex" value of the "pipeline stage 1" record from the interface table 413. If the attribute of the found record is "wire," the hardware model conversion program 32 considers that record as a 1-bit-sized local variable and defines it in the SpecC file 415B. The hardware conversion program 32 declares local variables used for pass-by-value for the input interface of the pipeline stages 2 and 3 in the same manner.

Figure 70:
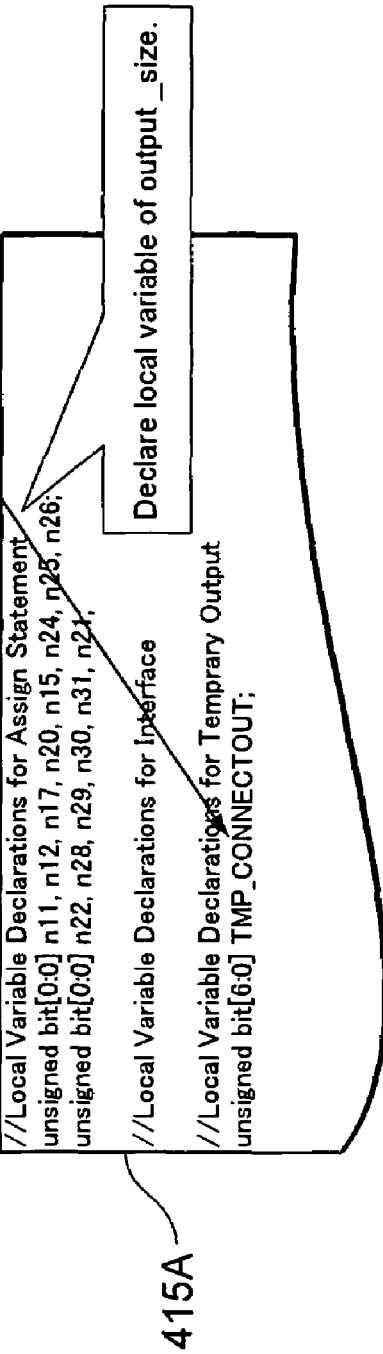
FIG. 70 is an explanatory diagram of the local variable declaration processing.

Next, the hardware model conversion program 32 declares local variables used for passing the output interfaces of the pipeline stages 0 to 2. As shown in FIG. 70, the hardware model conversion program 32 refers to the interface table 413. If the "output_size" value of the "pipeline stage 0" record from the interface table 413 is "1" or more, the hardware model conversion program 32 declares the local variable of the bit size corresponding to "output_size" in the SpecC file 415A. The hardware model conversion program 32 also declares the local variables used for passing the output interfaces of the pipeline stages 1 and 2 in the same manner.

Next, the input interface connection processing (S73) will be described. The hardware conversion program 32 executes the processing for connecting the input ports of the intermediate data 52 at the pipeline stage 0 and the processing for connecting the input interfaces at the pipeline stages 1 to 3.

As shown in FIG. 71, the hardware model conversion program 32 refers to a record from the interface table 413. If the "input_size" value is 0, it means that the record corresponds to the pipeline stage 0, i.e., the first stage. The hardware model conversion program 32 then refers to the input table 403A, connects the input port arguments output by the functional argument declaration processing (S71) to the input port local variables declared by the local variable declaration processing (S72) (see SpecC file 415A).

Figure 72:
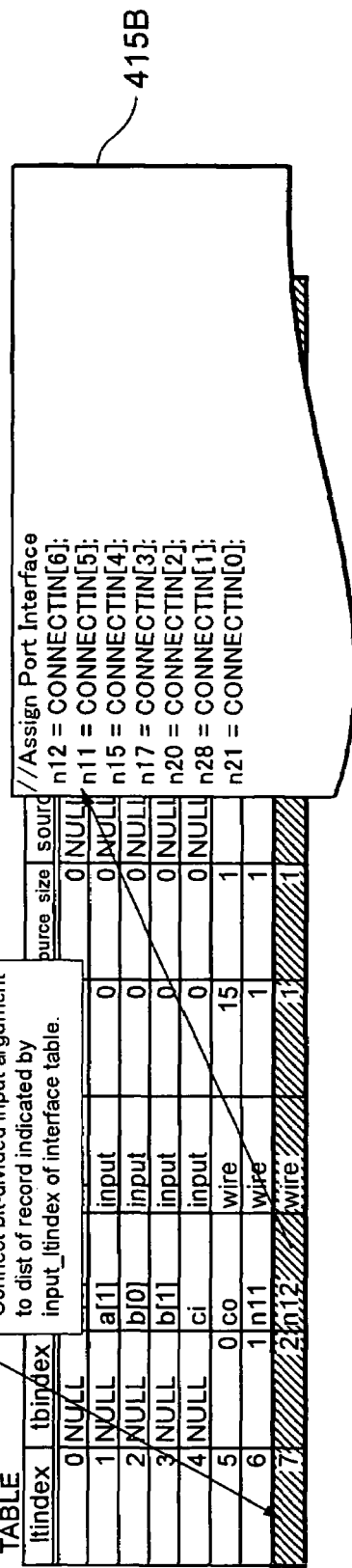
FIG. 72 is an explanatory diagram of the input interface connection processing.

As shown in FIG. 72, if the "input_size" value of the relevant record from the interface table 413 is "1" or more, the hardware model conversion program 32 searches the logical structure table 401 for the record having the same "Itindex" value as the "input_Itindex" value of the interface table 413, and bit-divides, into one-bit units, the input interface arguments output by the functional argument declaration processing (S71) and connects it to the "dist" value of the found record after the search (see SpecC file 415B).

The assign statement output processing (S74) is described below. In the assign statement output processing, the assign statements of the intermediate data 52 are output to the SpecC files 415A to 415D respectively.

Figure 73:
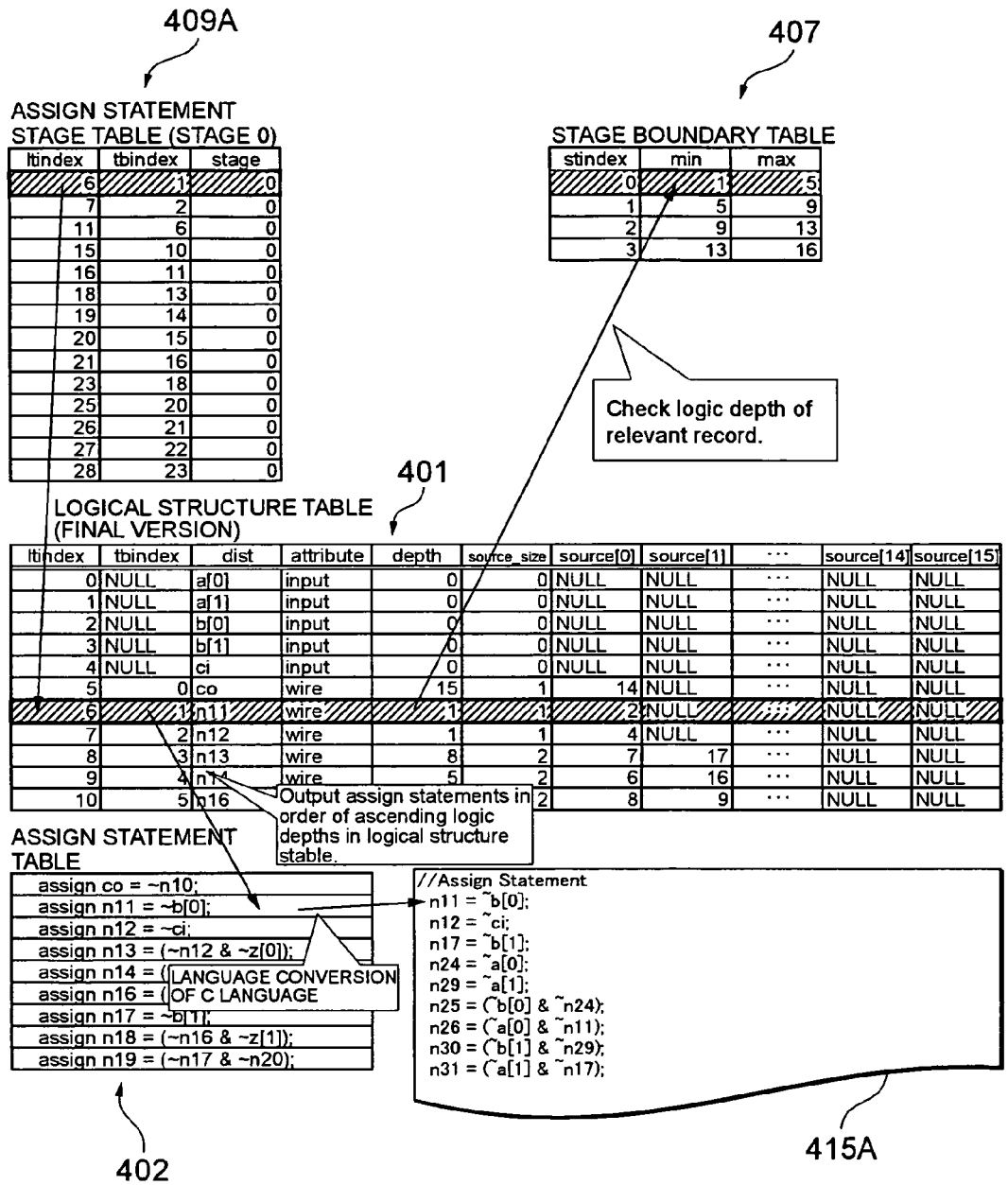
FIG. 73 is an explanatory diagram of assign statement output processing.

As shown in FIG. 73, the hardware model conversion program 32 refers to the assign statement stage table 409A, the stage boundary table 407, the logical structure table 401, and the assign statement table 402. The hardware model conversion program 32 searches the logical structure table 401 for records having the same "Itindex" value as the "Itindex" value in the assign statement stage table 409A. If the logic depth of a found record is within the range of the upper stage boundary (min) and the lower stage boundary (max) of the stage boundary table 407, the hardware model conversion program 32 outputs the assign statement in the assign statement table 402 as indicated by the "tbindex" of the record from the logical structure table 401, to the SpecC file 415A. The assign statements are output to the SpecC file 415A in ascending order of logic depth. By outputting the assign statements to the SpecC file 415A in ascending order of logic depth, the simultaneous processing statements unique to the HDL can be converted to an assignment that can be executed sequentially in the C language. Moreover, the term "assign" in the assign statements output to the SpecC file 415A is deleted for the purpose of language conversion from Verilog HDL to SpecC. The hardware model conversion program 32 repeats the same processing for the SpecC files 415B to 415D, and outputs the assign statements to the SpecC files 415B to 415D.

Next, the output interface connection processing (S75) is described below. The hardware model conversion program 32 executes processing for connecting the output ports of the intermediate data 52 at the pipeline stage 3 and processing for connecting the output interfaces at the pipeline stages 0 to 2.

As shown in FIG. 74, the hardware model conversion program 32 refers to the record from the interface table 413. If the "output_size" value is 0, it means that the record corresponds to the pipeline stage 3, i.e., the last stage. The hardware model conversion program 32 then refers to the output table 403C and connects the pass-by-reference functional arguments generated by the functional argument declaration processing (S71) to the local variables corresponding to the output ports (see SpecC file 415D).

As shown in FIG. 75, if the "output_size" value of the relevant record from the interface table 413 is "1" or more, the hardware model conversion program 32 searches the logical structure table 401 for each record having the same "Itindex" value as the "output_Itindex" value from the interface table 413, bit-links the "dist" values of the found records sequentially, and assigns the bit-linked "dist" values to the local variable for passing the output interface, generated by the local variable declaration (S72). The assigned local variable for passing the output interface is then assigned to the pass-by-reference argument declared by the functional argument declaration processing (S71) (see SpecC file 415A).

Via the processing sequence described above, the SpecC files 415A to 415D shown in FIGS. 76 to 79 are output as the system level description circuit 54 to the external storage apparatus 50.

Figure 80:
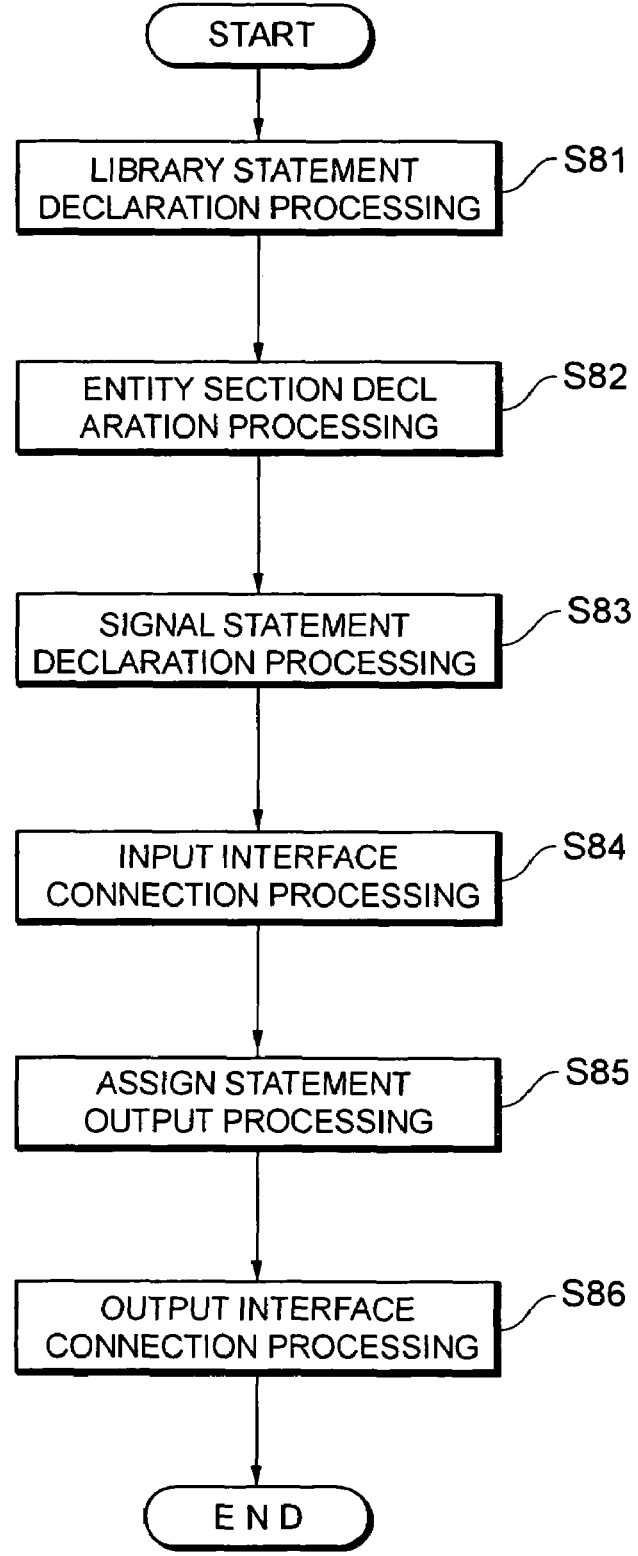
FIG. 80 is a flowchart illustrating language conversion processing.

FIG. 80 is a flowchart illustrating the language conversion processing (S14) for designating the output language as VHDL. The hardware model conversion program 32 reads the user setting file 55 that has been edited by the user; and if the hardware model conversion program 32 finds that "conv_model_type=VHDL" is set as the designation for the output language, it executes library statement declaration processing (S81), entity section declaration processing (S82), signal statement declaration processing (S83), input interface connection processing (S84), assign statement output processing (S85), and output interface connection processing (S86).

By executing the above-described processing sequence, the hardware model conversion program 32 outputs VHDL files 416A to 416D shown in FIGS. 92 to 95. The VHDL file 416A shows the function at the pipeline stage 0 (the first stage). The VHDL file 416B shows the function at the pipeline stage 1 (the second stage). The VHDL file 416C shows the function at the pipeline stage 2 (the third stage). The VHDL file 416D shows the function at the pipeline stage 3 (the last stage).

As a result of the library statement declaration processing (S81), the hardware model conversion program 32 outputs the following library statement:

Library IEEE;
use IEE.std_logic_1164.all;

Next, entity section declaration processing (S82) is described below. A name corresponding to the circuit name, for example, is given as the entity name.

As shown in FIG. 81, the hardware model conversion program 32 refers to the interface table 413 in order to define the input ports for each pipeline stage. If the "input_size" value of a record corresponding to a certain pipeline stage out of all the records in the interface table 413 is "0," the hardware model conversion program 32 acquires the input port names and the bit size from the input table 403A and defines the input ports at the pipeline stage 0, i.e., the first stage, in the VHDL file 416A. Moreover, if the "input_size" value of a record corresponding to a certain pipeline stage is "1" or more, that pipeline stage is any one of the pipeline stages 1 to 3 and, therefore, the hardware model conversion program defines the input ports having the bits indicated by the relevant "input_size," in the VHDL files 416B to 416D.

Figure 82:
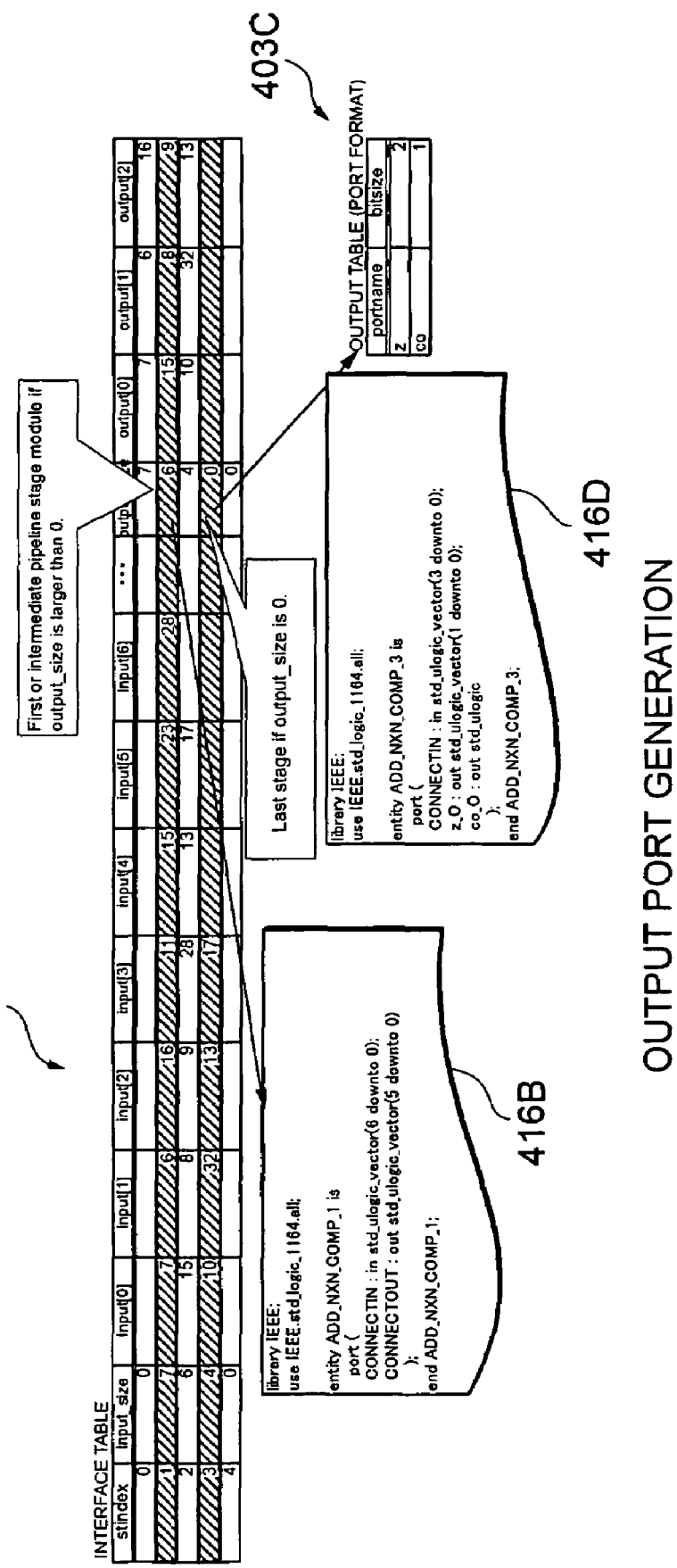
FIG. 82 is an explanatory diagram of the entity section declaration processing.

As shown in FIG. 82, the hardware model conversion program 32 refers to the interface table 413 in order to define the output ports for each pipeline stage. If, from among all the records in the interface table 413, the "output_size" value of the record corresponding to a certain pipeline stage is "0," the hardware model conversion program 32 acquires the output port names and the bit size from the output table 403C and defines the output ports at the pipeline stage 3, i.e., the last stage, in the VHDL file 416D. Moreover, if the "output_size" value of the record corresponding to a certain pipeline stage is "1" or more, that pipeline stage is any one of the pipeline stages 0 to 2 and, therefore, the hardware model conversion program 32 defines the output ports having bits indicated by the relevant "output_size," in the VHDL files 416A to 416C.

Figure 83:
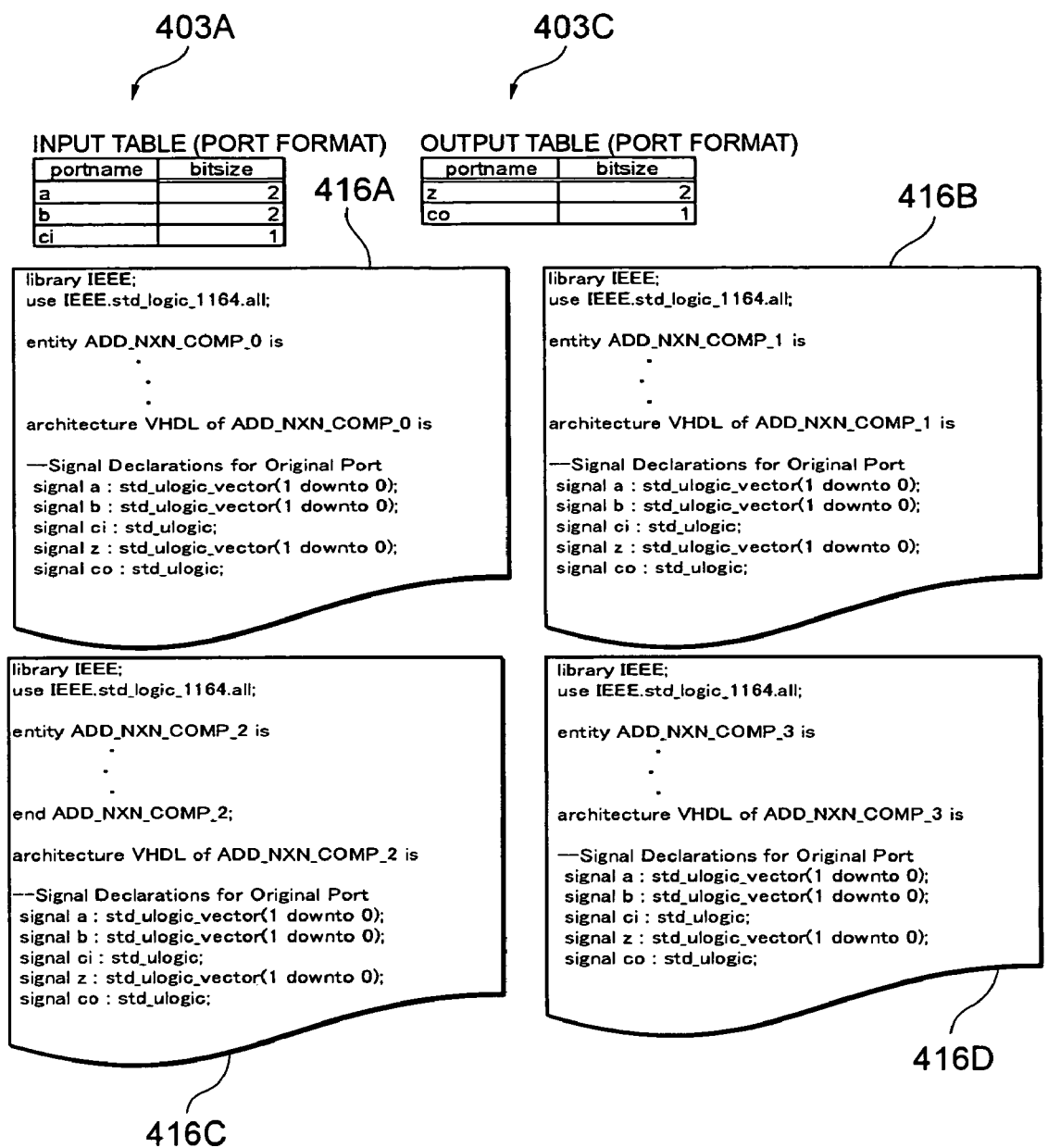
FIG. 83 is an explanatory diagram of signal statement declaration processing.

Next, the signal statement declaration processing (S83) is described below. As shown in FIG. 83, the hardware model conversion program 32 outputs signal statements corresponding to the input ports and the output ports of the intermediate data 52, to the VHDL files 416A to 416D according to the port information obtained from the input table 403A and the output table 403C.

As shown in FIG. 84, the hardware model conversion program 32 refers to the logical structure table 401 and the stage table 409A and searches the logical structure table 401 for records having the same "Itindex" value as the "Itindex" value of the record from the assign statement stage table 409A. If the attribute of a found record is "wire," the hardware model conversion program 32 defines that record as 1-bit-sized signal statement in the VHDL file 416A.

As shown in FIG. 85, the hardware model conversion program 32 declares the signal statements connected to the input ports at the pipeline stages 1 to 3. The hardware model conversion program 32 refers to the interface table 413 and the logical structure table 401. If there is a record from the logical structure table 401 having the same "Itindex" value as the "input_Itindex" value of the record corresponding to the pipeline stage 1, out of all the records in the interface table 413, and the attribute of that record is "wire," the hardware model conversion program 32 declares the signal statement in the VHDL files 416. Concerning the pipeline stages 2 and 3 as well, the hardware model conversion program 32 declares the signal statements in the VHDL files 416C and 416D.

Figure 86:
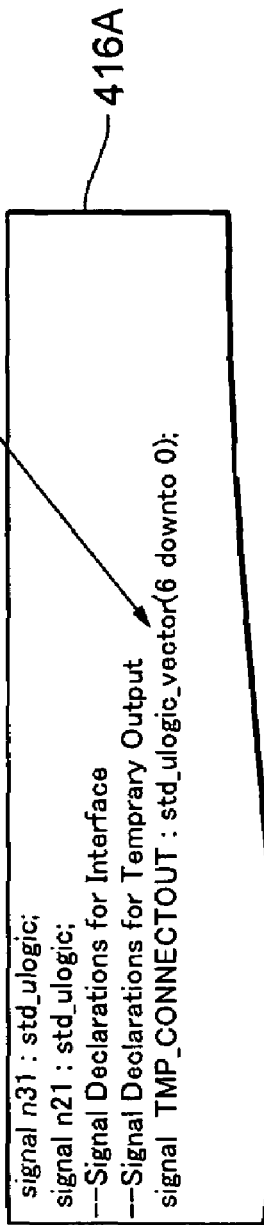
FIG. 86 is an explanatory diagram of the signal statement declaration processing.

As shown in FIG. 86, the hardware model conversion program 32 declares the signal statements used for connections to the output interfaces at the pipeline stages 0 to 2. As shown in FIG. 86, the hardware model conversion program 32 refers to the interface table 413. If the "output_size" value of the interface table 413 is not "0," the hardware model conversion program 32 declares the signal statement in the bit size indicated by the relevant "output_size" value.

Next, input interface connection processing (S84) is described. The hardware model conversion program 32 executes the processing for connecting the input ports of the intermediate data 52 at the pipeline stage 0 and the processing for connecting the input interfaces at the pipeline stages 1 to 3.

As shown in FIG. 87, the hardware model conversion program 32 refers to a record from the interface table 413. If the "input_size" value is 0, it means that the record corresponds to the pipeline stage 0, i.e., the first stage. The hardware model conversion program 32 then refers to the input table 403A and connects the input ports generated by the entity section declaration processing (S82) to the input port signal declared by the signal statement declaration processing (S83) (see VHDL file 416A).

Figure 88:
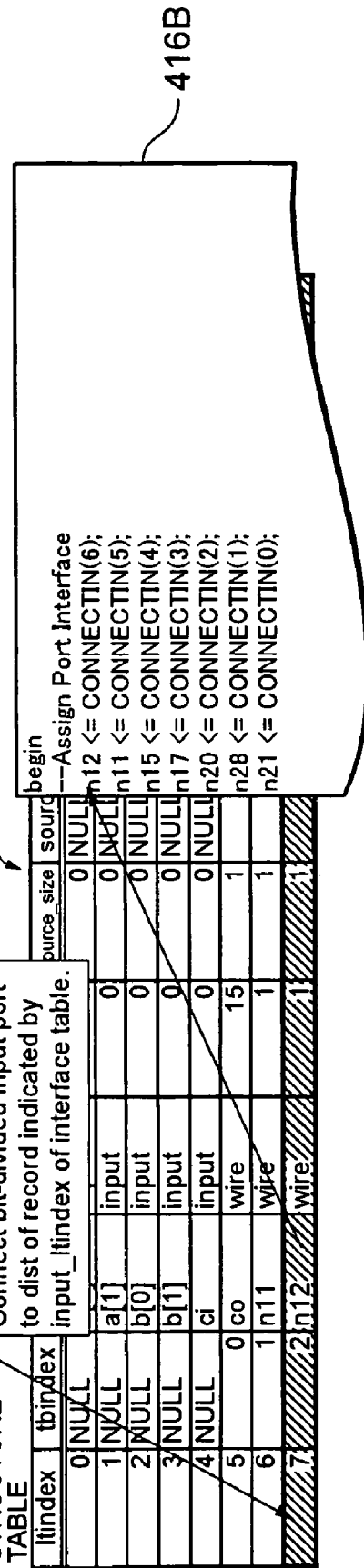
FIG. 88 is an explanatory diagram of the input interface connection processing.

As shown in FIG. 88, if the "input_size" value of the relevant record from the interface table 413 is "1" or more, the hardware model conversion program 32 searches the logical structure table 401 for records having the same "Itindex" value as the "input_Itindex" value of the interface table 413, and bit-divides, into one bit units, the pipeline interface declared by the entity section declaration processing (S82) and connects it to the "dist" value of a found record after the search (see VHDL file 416B).

Assign statement output processing (S85) is described below. In the assign statement output processing, the assign statements of the intermediate data 52 are respectively output to the VHDL files 416A to 416D.

Figure 89:
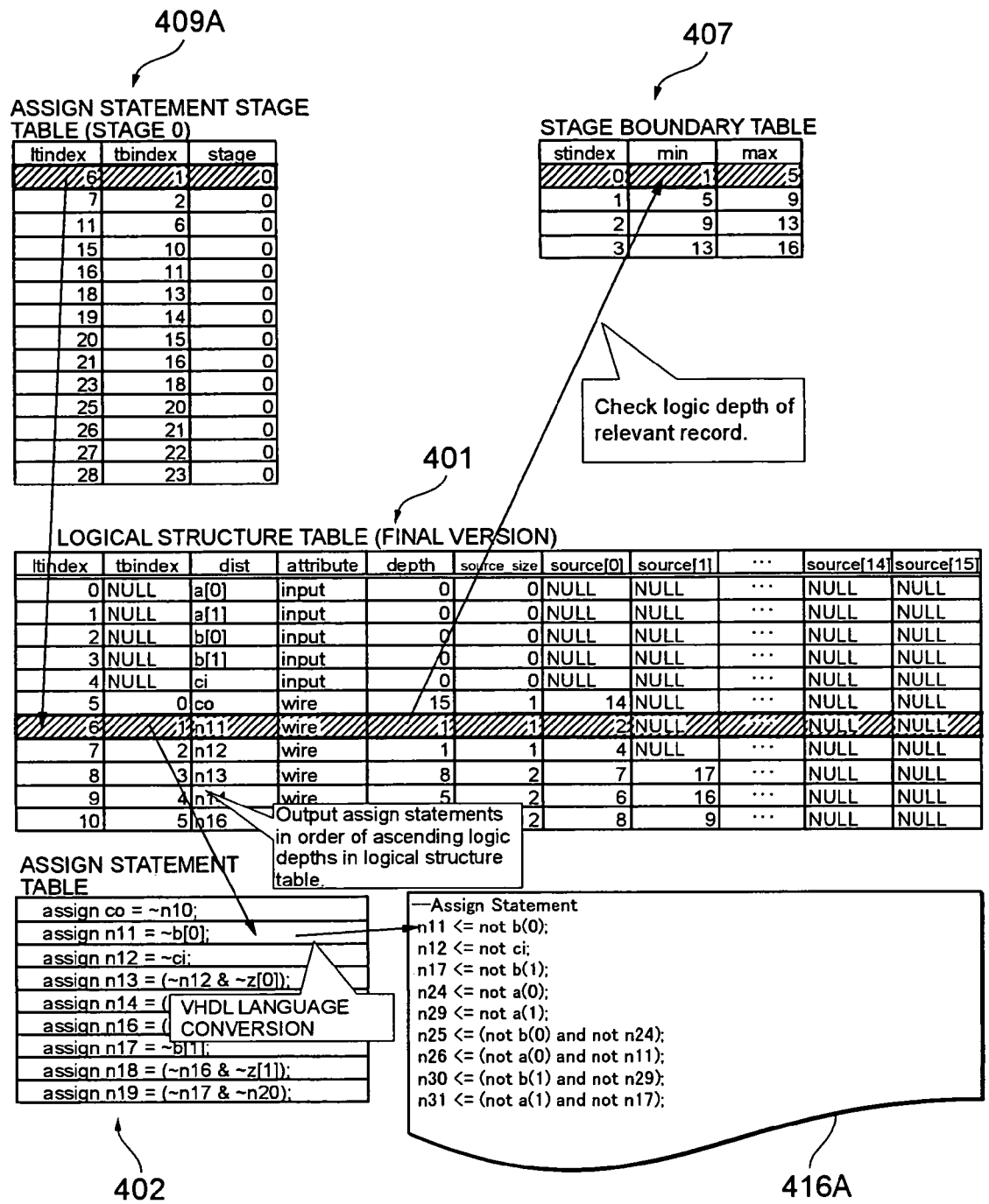
FIG. 89 is an explanatory diagram of assign statement output processing.

As shown in FIG. 89, the hardware model conversion program 32 refers to the assign statement stage table 409A, the stage boundary table 407, the logical structure table 401, and the assign statement table 402. The hardware model conversion program 32 searches the logical structure table 401 for records having the same "Itindex" value as the "Itindex" value of the assign statement stage table 409A. If the logic depth of a found record is within the range of the upper stage boundary (min) and the lower stage boundary (max) of the stage boundary table 407, the hardware model conversion program 32 outputs the assign statement in the assign statement table 402 indicated by the "tbindex" of the record from the logical structure table 401, to the VHDL file 416A. The assign statements are output to the VHDL file 416A in the ascending order of logic depth. Also, the assign statements to be output to the VHDL file 416A undergo language conversion from Verilog HDL to VHDL. The hardware model conversion program 32 repeats the same processing for the VHDL files 415B to 415D, and outputs the assign statements to the VHDL files 416B to 416D as well.

Next, the output interface connection processing (S86) is described below. The hardware model conversion program 32 executes processing for connecting the output ports of the intermediate data 52 at the pipeline stage 3 and processing for connecting the output interfaces at the pipeline stages 0 to 2.

Figure 90:
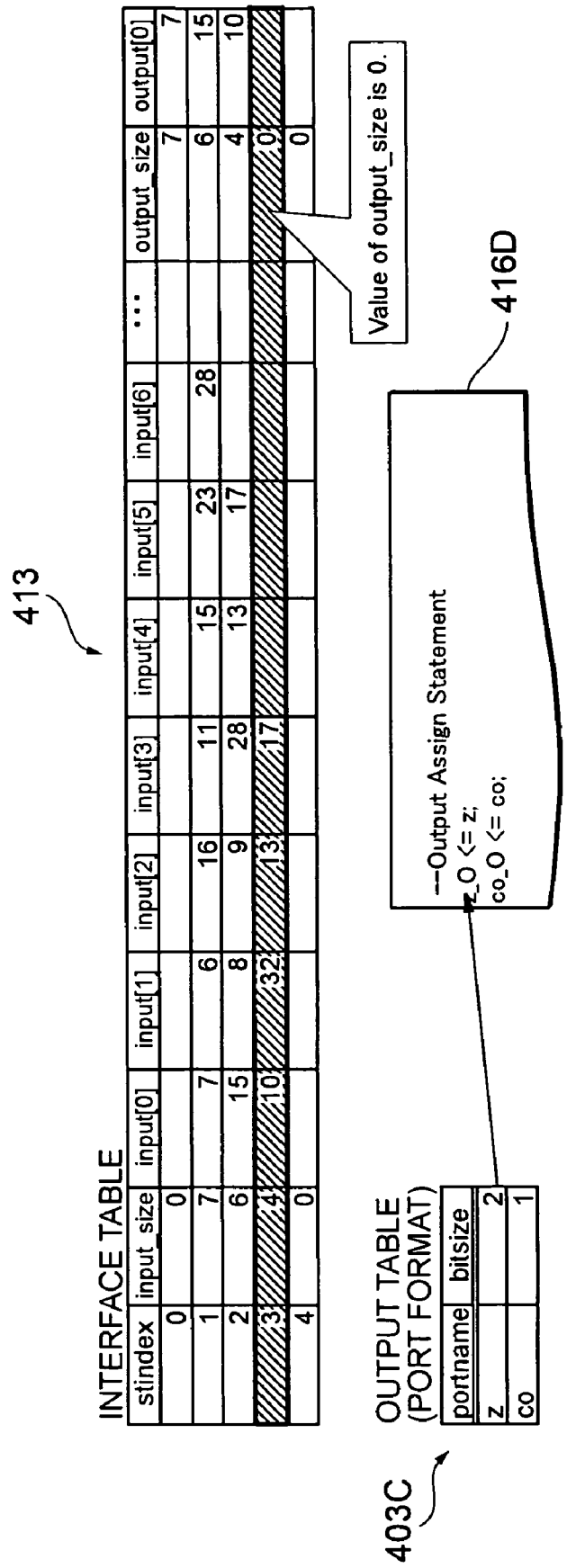
FIG. 90 is an explanatory diagram of output interface connection processing.

As shown in FIG. 90, the hardware model conversion program 32 refers to a record from the interface table 413. If the "output_size" value is 0, it means that the record corresponds to the pipeline stage 3, i.e., the last stage. The hardware model conversion program 32 then refers to the output table 403C and connects the output ports generated by the entity section declaration processing (S82) to the output port signal declared by the signal statement declaration processing (S83) (see VHDL file 416D).

Figure 91:
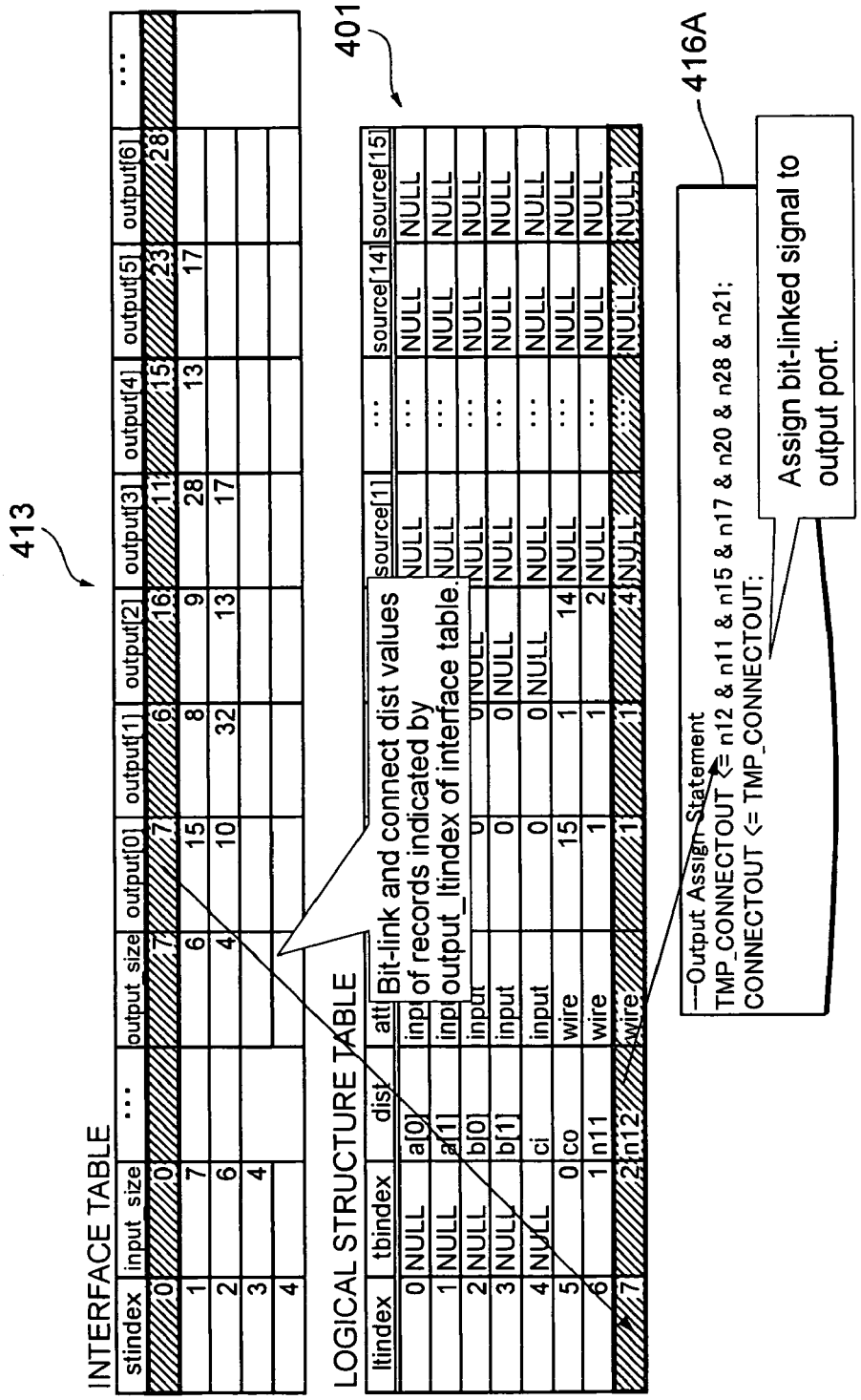
FIG. 91 is an explanatory diagram of the output interface connection processing.

As shown in FIG. 91, if the "output_size" value of the relevant record from the interface table 413 is "1" or more, the hardware model conversion program 32 searches the logical structure table 401 for each record having the same "Itindex" value as the "output_Itindex" value of the interface table 413, bit-links the "dist" values of the found records sequentially, and assigns the bit-linked "dist" values to the output interface connection signal generated by the signal statement declaration processing (S83). The assigned signal for passing the output interface is then connected to the output ports declared by the entity section declaration processing (S82) (see VHDL file 416A).

Via the processing sequence described above, the VHDL files 416A to 416D shown in FIGS. 92 to 95 are output as the HDL-described circuit 53 to the external storage apparatus 50.

According to this embodiment as described above, it is possible to realize automation of the pipelining of the existing circuit and the conversion of the hardware description language (HDL) that has conventionally been conducted manually.

What is claimed is:

1. A computer program product made by recording, on a recording medium, a data structure used for processing executed by a computer system to analyze circuit connection structure of a plurality of mutually connected assign cells where one assign statement described in intermediate data obtained by logic synthesis of an HDL-described circuit is associated with one assign cell,
the data structure including a plurality of records corresponding one-to-one with the assign cells,
wherein each record includes: a data unit for storing a logic depth that indicates a largest number of assign cells aligned on a circuit connection path from an input port of the intermediate data to the assign cell associated with the record; and a pointer for indicating an assign cell to be connected to the assign cell associated with the record.

2. A computer program product made by recording, on a recording medium, a computer program for causing a computer system to execute the steps of:
inputting intermediate data obtained by logic synthesis of an HDL-described circuit; and
analyzing syntax of the intermediate data and outputting a data structure used for processing executed by a computer system to analyze circuit connection structure of a plurality of mutually connected assign cells where one assign statement described in intermediate data obtained by logic synthesis of an HDL-described circuit is associated with one assign cell, the data structure including a plurality of records corresponding one-to-one with the assign cells, wherein each record includes: a data unit for storing a logic depth that indicates a largest number of assign cells aligned on a circuit connection path from an input port of the intermediate data to the assign cell associated with the record; and a pointer for indicating an assign cell to be connected to the assign cell associated with the record.

3. The computer program product according to claim 2, wherein the computer program causes the computer system to further execute a step of performing model conversion of the HDL-described circuit to a pipeline structure so that assign cells having a same logic depth will belong to a same pipeline stage.

4. The computer program product according to claim 3, wherein the computer program causes the computer system to further execute a step of analyzing a bit number of an interface signal line between respective pipeline stages when the HDL-described circuit is converted to the pipeline structure.

5. The computer program product according to claim 2, wherein the computer program causes the computer system to further execute a step of performing and outputting language conversion of the HDL-described circuit.

6. A hardware model conversion method comprising the steps of:

inputting intermediate data obtained by logic synthesis of an HDL-described circuit; and analyzing syntax of the intermediate data and outputting a data structure used for processing executed by a computer system to analyze circuit connection structure of a plurality of mutually connected assign cells where one assign statement described in intermediate data obtained by logic synthesis of the HDL-described circuit is associated with one assign cell, the data structure including a plurality of records corresponding one-to-one with the assign cells, wherein each record includes: a data unit for storing a logic depth that indicates a largest number of assign cells aligned on a circuit connection path from an input port of the intermediate data to the assign cell associated with the record; and a pointer for indicating an assign cell to be connected to the assign cell associated with the record.

7. The hardware model conversion method according to claim 6, further comprising a step of performing model conversion of the HDL-described circuit to a pipeline structure so that the assign cells having a same logic depth will belong to the same pipeline stage.

8. The hardware model conversion method according to claim 7, further comprising a step of analyzing a bit number of an interface signal line between respective pipeline stages when the HDL-described circuit is converted to the pipeline structure.

9. The hardware model conversion method according to claim 6, further comprising a step of performing and outputtinn language conversion of the HDL-described circuit.

10. A hardware model conversion system comprising:
an intermediate data reader for reading intermediate data obtained by logic synthesis of an HDL-described circuit; and a data structure generator for analyzing syntax of the intermediate data and generating a data structure used for processing executed by a computer system to analyze circuit connection structure of a plurality of mutually connected assign cells where one assign statement described in intermediate data obtained by logic synthesis of an HDL-described circuit is associated with one assign cell, the data structure including a plurality of records corresponding one-to-one with the assign cells, wherein each record includes: a data unit for storing a logic depth that indicates a largest number of assign cells aligned on a circuit connection path from an input port of the intermediate data to the assign cell associated with the record; and a pointer for indicating an assign cell to be connected to the assign cell associated with the record.

11. The hardware model conversion system according to claim 10, further comprising a pipeline model generator for performing model conversion of the HDL-described circuit to a pipeline structure so that assign cells having a same logic depth will belong to the same pipeline stage.

12. The hardware model conversion system according to claim 11, further comprising an analyzer for analyzing a bit number of an interface signal line between respective pipeline stages when the HDL-described circuit is converted to the pipeline structure.

13. The hardware model conversion system according to claim 10, further comprising a language converter for performing and outputting language conversion of the HDL-described circuit.

* * * * *